United States Patent
Ishizu et al.

(10) Patent No.: US 10,002,648 B2
(45) Date of Patent: Jun. 19, 2018

(54) MEMORY DEVICE, SEMICONDUCTOR DEVICE, AND ELECTRONIC DEVICE

(71) Applicant: Semiconductor Energy Laboratory Co., Ltd., Atsugi-shi, Kanagawa-ken (JP)

(72) Inventors: Takahiko Ishizu, Atsugi (JP); Shuhei Nagatsuka, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days. days.

(21) Appl. No.: 15/447,809

(22) Filed: Mar. 2, 2017

(65) Prior Publication Data

US 2017/0178699 A1    Jun. 22, 2017

Related U.S. Application Data

(63) Continuation of application No. 15/083,776, filed on Mar. 29, 2016, now Pat. No. 9,589,611.

(30) Foreign Application Priority Data

Apr. 1, 2015 (JP) ................. 2015-074828

(51) Int. Cl.
| | |
|---|---|
| *G11C 11/40* | (2006.01) |
| *G11C 7/06* | (2006.01) |
| *G11C 5/06* | (2006.01) |
| *G11C 7/12* | (2006.01) |
| *G11C 7/18* | (2006.01) |
| *G11C 8/14* | (2006.01) |
| *H01L 27/105* | (2006.01) |

(52) U.S. Cl.
CPC .............. *G11C 7/065* (2013.01); *G11C 5/063* (2013.01); *G11C 7/12* (2013.01); *G11C 7/18* (2013.01); *G11C 8/14* (2013.01); *H01L 27/1052* (2013.01)

(58) Field of Classification Search
CPC ...................................................... G11C 11/40
USPC ........................................................ 365/149
See application file for complete search history.

(56) References Cited

U.S. PATENT DOCUMENTS 5,812,476 A * 9/1998 Segawa ................. G11C 11/406
365/149
6,765,845 B2    7/2004 Choi et al.
(Continued)

FOREIGN PATENT DOCUMENTS

JP    2001-053164 A    2/2001
JP    2001-053167 A    2/2001
(Continued)

*Primary Examiner* — Min Huang
(74) *Attorney, Agent, or Firm* — Robinson Intellectual Property Law Office; Eric J. Robinson

(57) ABSTRACT

A column driver includes an amplifier circuit for amplifying data of a read bit line and a latch circuit for retaining the amplified data. The latch circuit includes a pair of nodes Q and QB for retaining complementary data. Data is read from a memory cell in each write target row to a read bit line, and amplified by the amplifier circuit. The amplified data is written to the node Q (or QB) of the latch circuit. In a write target column, write data is input to the latch circuit through the node Q (or QB) to update data of the latch circuit. Then, in each column, data of the latch circuit is written to a write bit line, and the data of the write bit line is written to the memory cell.

17 Claims, 28 Drawing Sheets

(56) References Cited

U.S. PATENT DOCUMENTS

| | | |
|---|---|---|
| 8,339,828 B2 | 12/2012 | Yamazaki et al. |
| 8,358,530 B2 | 1/2013 | Kamata |
| 8,363,452 B2 | 1/2013 | Yamazaki et al. |
| 8,411,480 B2 | 4/2013 | Nagatsuka et al. |
| 8,482,974 B2 | 7/2013 | Saito et al. |
| 8,484,409 B2 | 7/2013 | Honda |
| 8,520,426 B2 | 8/2013 | Ohnuki |
| 8,542,528 B2 | 9/2013 | Sekine et al. |
| 8,569,753 B2 | 10/2013 | Isobe et al. |
| 8,614,916 B2 | 12/2013 | Nagatsuka et al. |
| 8,686,415 B2 | 4/2014 | Kamata |
| 8,792,284 B2 | 7/2014 | Ohnuki |
| 8,848,464 B2 | 9/2014 | Sekine et al. |
| 8,922,236 B2 * | 12/2014 | Saito .............. G11C 11/403 324/762.01 |
| 9,171,630 B2 | 10/2015 | Nagatsuka et al. |
| 9,240,244 B2 | 1/2016 | Nagatsuka et al. |
| 9,589,611 B2 * | 3/2017 | Ishizu .............. G11C 7/12 |
| 2006/0227648 A1 | 10/2006 | Kameshiro et al. |
| 2007/0047283 A1 | 3/2007 | Miyanishi |
| 2008/0025113 A1 * | 1/2008 | Kitagawa .......... G11C 7/067 365/189.09 |
| 2011/0242926 A1 * | 10/2011 | Mazure .............. G11C 8/08 365/230.06 |
| 2012/0213000 A1 | 8/2012 | Takemura |
| 2012/0294061 A1 * | 11/2012 | Nagatsuka .......... G11C 8/14 365/72 |
| 2013/0077397 A1 * | 3/2013 | Kurita .............. G11C 7/02 365/184 |

FOREIGN PATENT DOCUMENTS

| | | |
|---|---|---|
| JP | 2001-093989 A | 4/2001 |
| JP | 2004-171744 A | 6/2004 |
| JP | 2011-187950 A | 9/2011 |
| JP | 2011-221996 A | 11/2011 |

* cited by examiner

FIG. 14A
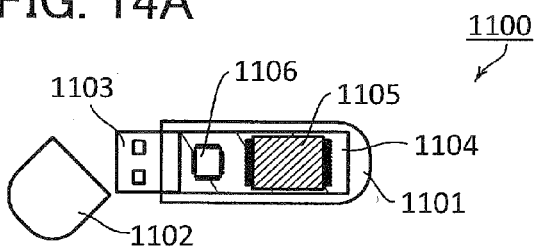
FIG. 14B  FIG. 14C
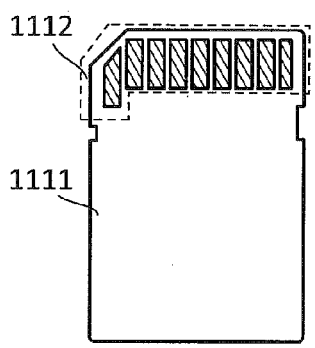 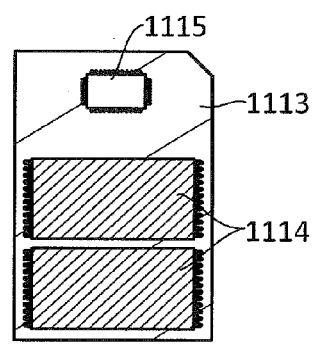
FIG. 14D
FIG. 14E
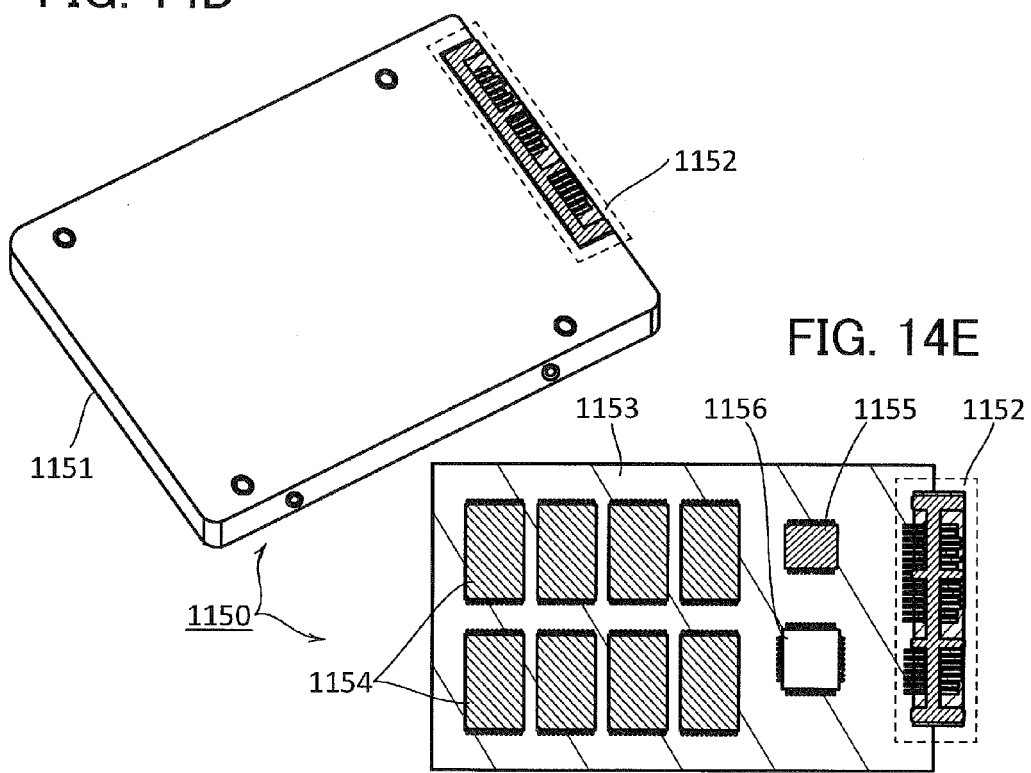

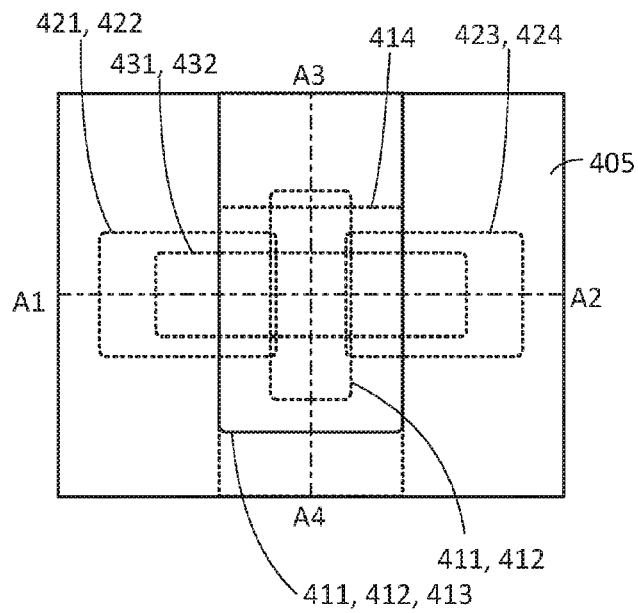
FIG. 20A
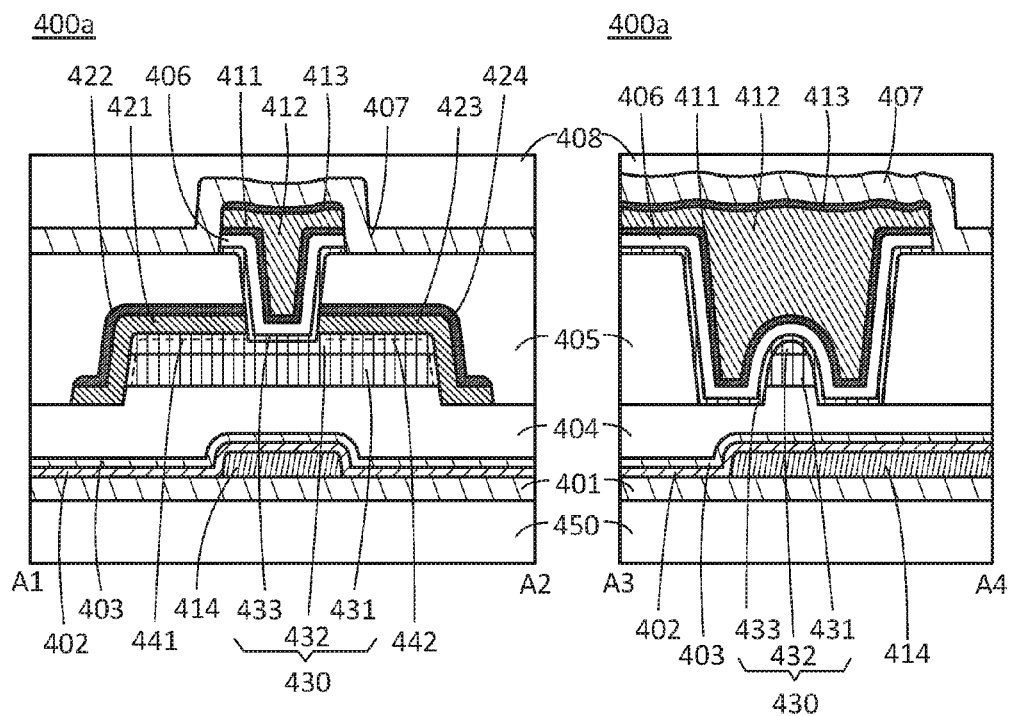
FIG. 20B
FIG. 20C

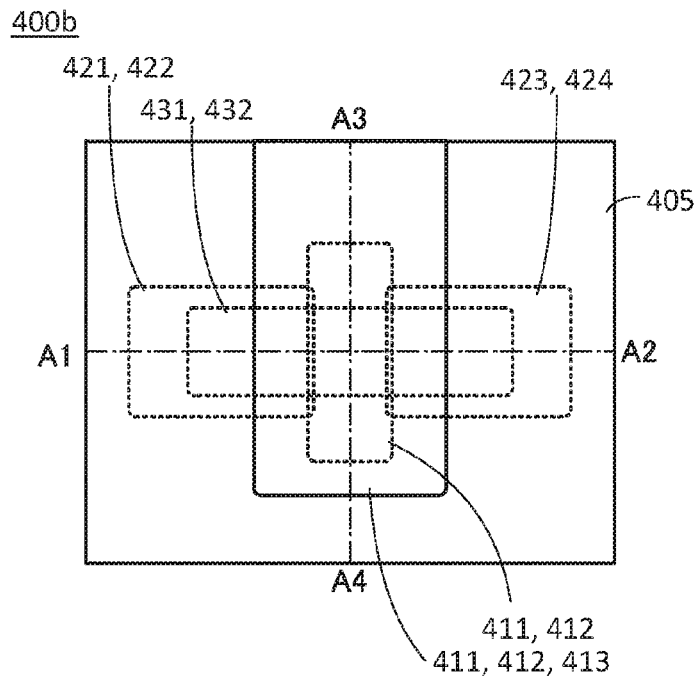
FIG. 22A
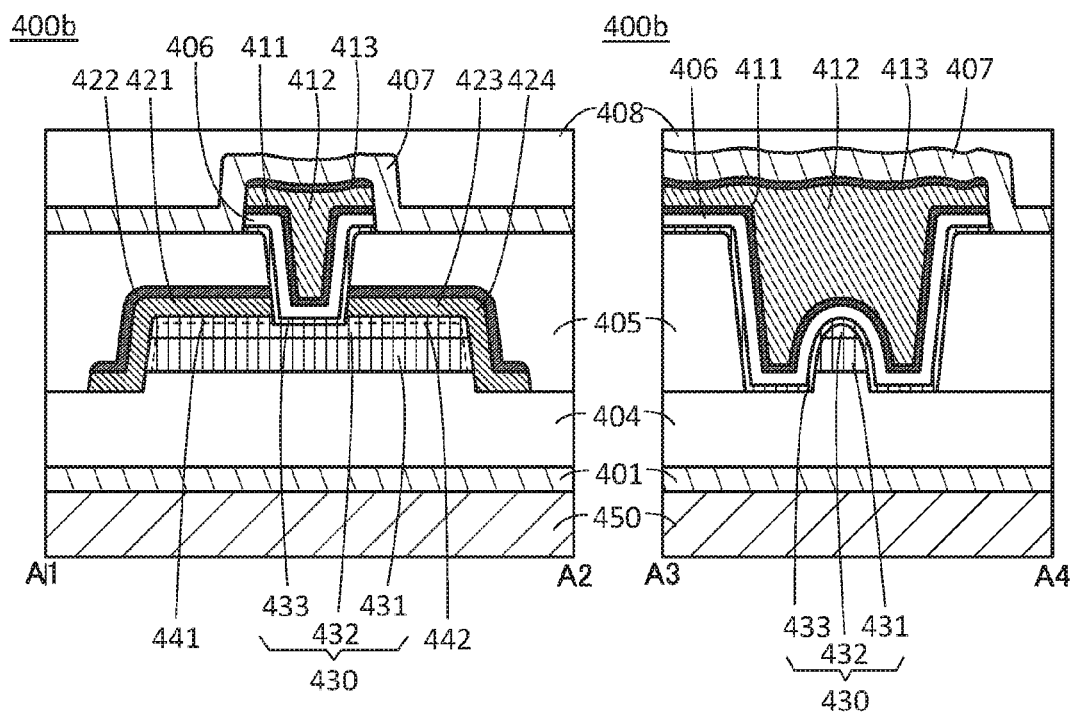
FIG. 22B
FIG. 22C

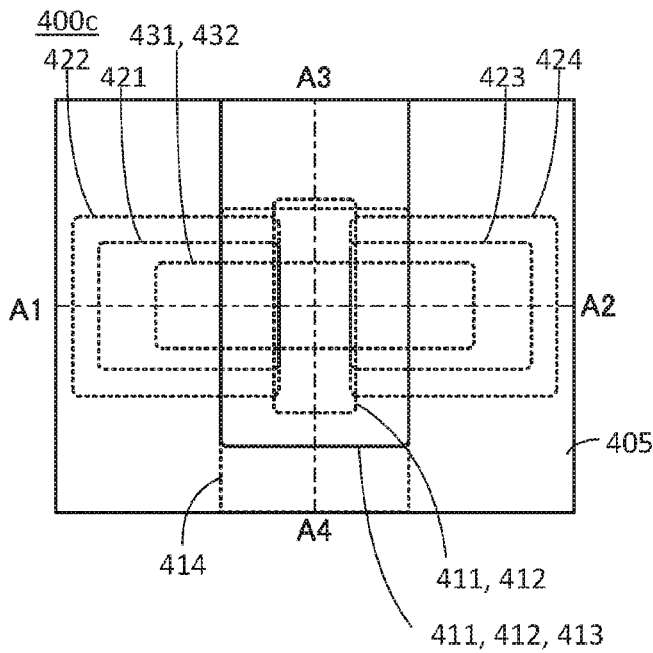
FIG. 23A
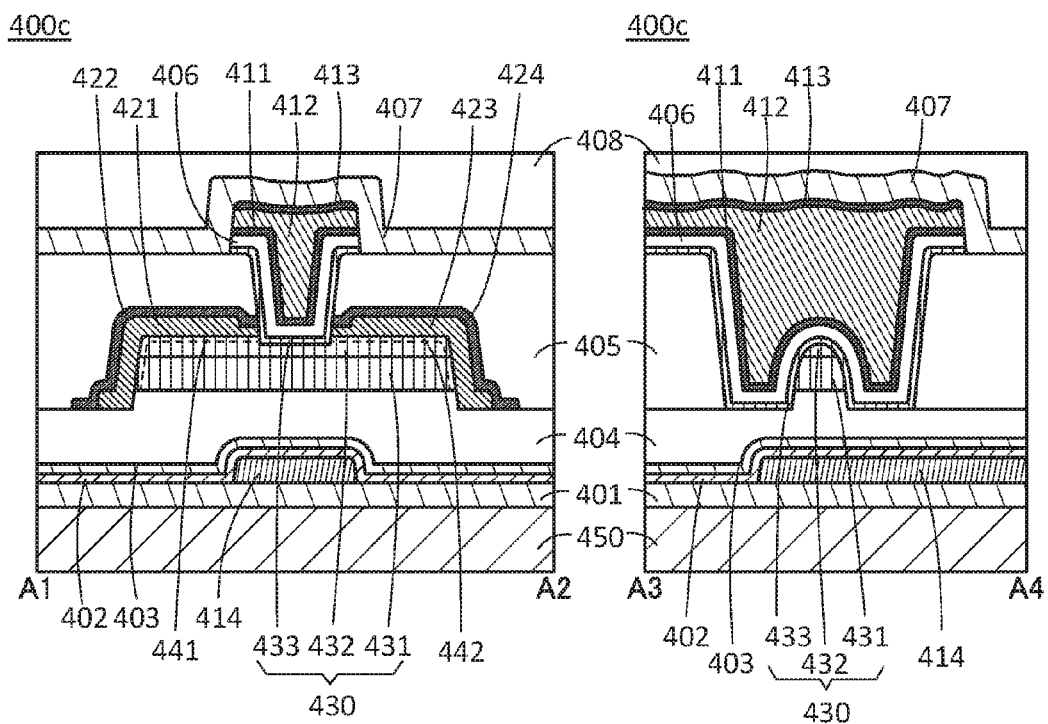
FIG. 23B
FIG. 23C

FIG. 27A
FIG. 27B
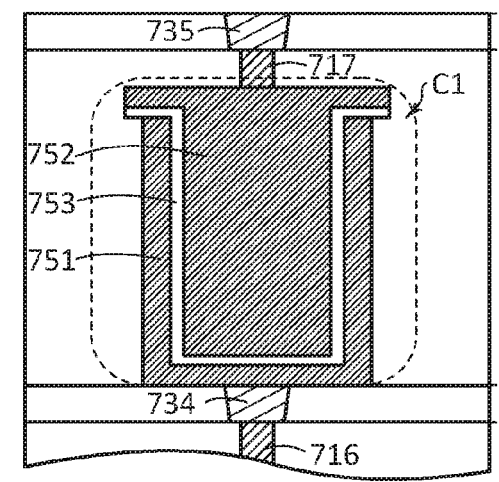
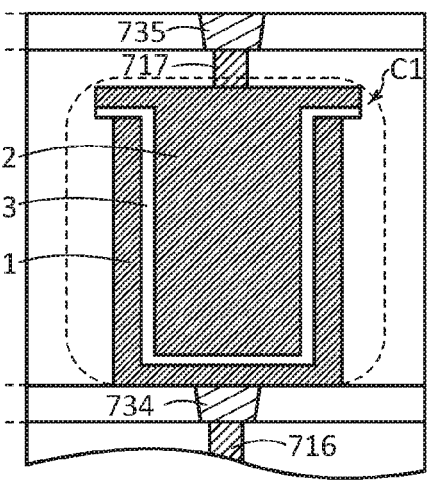
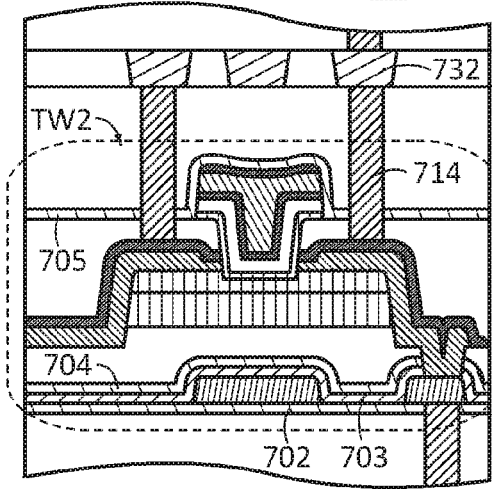
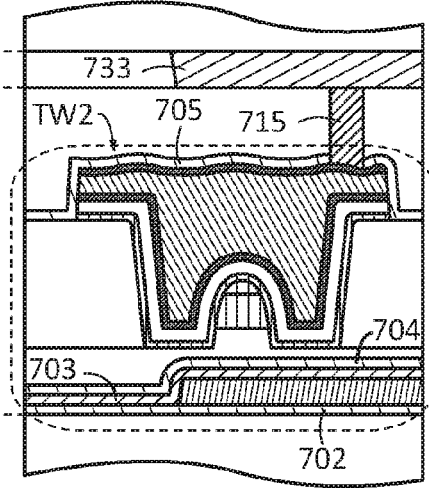
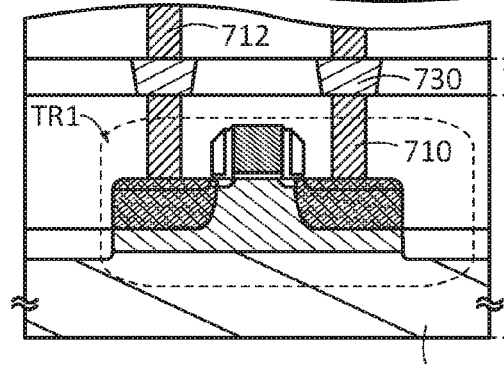
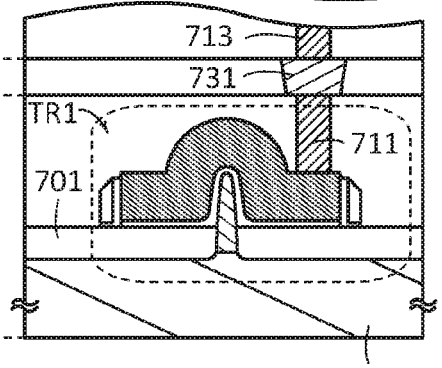

MEMORY DEVICE, SEMICONDUCTOR DEVICE, AND ELECTRONIC DEVICE

BACKGROUND OF THE INVENTION

1. Field of the Invention

The specification, drawings, and claims of this application (hereinafter referred to as "this specification and the like") relate to, for example, a semiconductor device, an electronic component, an electronic device, operating methods thereof, and manufacturing methods thereof. Examples of a technical field of one embodiment of the present invention include a semiconductor device, a memory device, a processing unit, a switch circuit (e.g., a power switch and a wiring switch), a display device, a liquid crystal display device, a light-emitting device, a lighting device, a power storage device, an input device, an imaging device, a driving method thereof, and a manufacturing method thereof.

2. Description of the Related Art

As memory cells used in random access memories (RAM), 1T1C (one transistor-one capacitor)-type memory cells and 2T-type or 3T-type memory cells are known. These memory cells store data by charging and discharging retention nodes with write transistors.

It has been proposed that a transistor whose channel formation region is formed using an oxide semiconductor (hereinafter also referred to as an oxide semiconductor transistor or an OS transistor) is employed as a write transistor in these memory cells. For example, Patent Document 1 discloses a memory cell that can retain data even in the situation in which electric power is not supplied, by including the OS transistor as a writing transistor. A memory device including an OS transistor can be used as a nonvolatile memory.

In a memory device including the OS transistor described in Patent Document 1, each memory cell does not have an amplification function, which is different from a static RAM (SRAM) cell. Therefore, in data writing, writing needs to be performed on all of memory cells connected to a word line to be selected. That is, writing cannot be performed in units smaller than the line size. For example, in the case where a word is 32 bits and the line size is 128 bits (16 bytes), write access in byte (8-bit) units, a half-word (2-byte) units, and word (4-byte) units cannot be performed.

A hierarchical word line structure (also called divided word line structure) including a global word line and a local word line is proposed (e.g., Patent Document 2) to solve the above problem. This structure reduces the number of memory cells connected to a local word line and allows writing in byte units, half-word units, and word units, for example. However, to achieve the hierarchical structure including a global word line and a local word line, a logic circuit such as an AND circuit needs to be inserted to a connection portion of the global word line and the local word line. For byte writing, for example, the local word line needs to be provided for every eight memory cells. In this case, a word line divider (e.g., an AND circuit) is inserted in every eight columns, which causes a significantly large increase in area due to the insertion of the word line divider. Also in the cases where writing is performed in half-word (16-bit) units and word (32-bit) units, a large increase in area due to the insertion of the AND circuit is caused.

In order to solve such problems, Patent Document 3 proposes the insertion of an OS transistor in a connection portion of a word line and a sub word line to reduce the size of a word line divider.

REFERENCES

Patent Documents

[Patent Document 1] Japanese Published Patent Application No. 2011-187950
[Patent Document 2] Japanese Published Patent Application No. 2004-171744
[Patent Document 3] Japanese Published Patent Application No. 2011-221996

SUMMARY OF THE INVENTION

An object of one embodiment of the present invention is to provide a novel semiconductor device, a method for operating the novel semiconductor device, and the like. An object of one embodiment of the present invention is to achieve data writing in units smaller than a line size (e.g., in byte units or word units), reduce a circuit area, or reduce power consumption, for example.

Note that the description of a plurality of objects does not mutually preclude the existence. One embodiment of the present invention does not necessarily achieve all the objects. Objects other than those listed above are apparent from the description of the specification, drawings, and claims, and also such objects could be an object of one embodiment of the present invention.

One embodiment of the present invention is a memory device including a memory cell array and a column driver. The memory cell array includes a plurality of memory cells arranged in a matrix; a read bit line, a write bit line, and a source line provided for each column; and a read word line and a write word line provided for each row. The plurality of memory cells are each electrically connected to the write word line, the read word line, the write bit line, the read bit line, and the source line. The plurality of memory cells each include a retention node, a first transistor, a second transistor, and a capacitor. The first transistor includes a gate electrically connected to the write word line, a first terminal electrically connected to the write bit line, and a second terminal electrically connected to the retention node. The second transistor includes a gate electrically connected to the retention node, a first terminal electrically connected to the source line, and a second terminal electrically connected to the read bit line. The capacitor includes a first terminal electrically connected to the retention node and a second terminal electrically connected to the read word line. In the column driver, a sense amplifier is provided for each column. The sense amplifier includes a first node and a second node for retaining complementary data. The sense amplifier is configured to amplify first data, retain the amplified first data, and retain second data. The first data is data read from the memory cell to the read bit line. The second data is data written to the memory cell in a write target column. The column driver is configured to control input of the second data to the sense amplifier in the write target column, control electrical continuity between the first node and the read bit line to input the first data to the sense amplifier, and control electrical continuity between the second node and the write bit line to write retention data of the sense amplifier to the write bit line. The retention data is the first data or the second data.

In the above-described embodiment, the column driver may be configured to control electrical continuity between the first node and the write bit line to write the retention data of the sense amplifier to the write bit line.

In the above-described embodiment, the memory cell may include a third transistor including a gate electrically connected to the read word line, a first terminal electrically connected to the second terminal of the second transistor, and a second terminal electrically connected to the read bit line, and the second terminal of the capacitor may be electrically connected to a first wiring.

In the above-described embodiment, a bit line may be provided for each row in the memory cell array instead of the write bit line and the read bit line, the column driver includes a first switch and a second switch, the first switch controls electrical continuity between the bit line and an input node of the sense amplifier to which the first data is input, and the second switch controls electrical continuity between the bit line and an output node of the sense amplifier from which the retention data is output.

In the above-described embodiment, a channel formation region of the first transistor may include an oxide semiconductor.

In this specification and the like, a semiconductor device refers to a device that utilizes semiconductor characteristics, and means a circuit including a semiconductor element (e.g., a transistor, a diode, or a photodiode), a device including the circuit, and the like. The semiconductor device also means any device that can function by utilizing semiconductor characteristics. For example, an integrated circuit, a chip including an integrated circuit, and an electronic component including a chip in a package are examples of semiconductor devices. Furthermore, a memory device, a display device, a light-emitting device, a lighting device, an electronic device, and the like themselves are semiconductor devices. These semiconductor devices further include a semiconductor device in some cases.

For example, in this specification and the like, a description "X and Y are connected" means that X and Y are electrically connected, X and Y are functionally connected, and X and Y are directly connected. Accordingly, another element may be provided between elements having a connection relation illustrated in drawings and texts, without limitation to a predetermined connection relation, for example, the connection relation illustrated in the drawings and the texts. Here, each of X and Y denotes an object (e.g., a device, an element, a circuit, a wiring, an electrode, a terminal, a conductive film, or a layer).

Note that a transistor includes three terminals: a gate, a source, and a drain. The gate functions as a control terminal for controlling conduction of the transistor. Depending on the channel type of the transistor or levels of potentials applied to the terminals, one of terminals functions as a source and the other functions as a drain. Therefore, the terms "source" and "drain" can be switched in this specification and the like. In this specification and the like, the two terminals other than the gate may be referred to as a first terminal and a second terminal.

A node can be referred to as a terminal, a wiring, an electrode, a conductive layer, a conductor, an impurity region, or the like depending on a circuit structure, a device structure, and the like. Furthermore, a terminal, a wiring, or the like can be referred to as a node.

Note that a voltage refers to a potential difference between a certain potential and a reference potential (e.g., a ground potential (GND) or a source potential) in many cases. A voltage can be referred to as a potential and vice versa. Note that a potential has a relative value. Thus, "GND" does not necessarily mean 0 V.

In this specification and the like, ordinal numbers such as "first," "second," and "third" are used to show the order in some cases. Furthermore, ordinal numbers may be used to avoid confusion among components; in this case, the terms do not limit the components numerically or do not limit the order. For example, it is possible to replace the term "first" with the term "second" or "third" in describing one embodiment of the present invention.

Other matters regarding the description of this specification and the like will be described in Embodiment 5.

One embodiment of the present invention can provide a novel semiconductor device or a novel method for operating the semiconductor device. One embodiment of the present invention can achieve data writing in units smaller than a line size (e.g., in byte units or word units), reduce a circuit area, or reduce power consumption.

Note that the description of the plurality of effects does not disturb the existence of other effects. In one embodiment of the present invention, there is no need to achieve all the effects described above. In one embodiment of the present invention, an object other than the above objects, an effect other than the above effects, and a novel feature will be apparent from the description of the specification and the drawings.

BRIEF DESCRIPTION OF THE DRAWINGS

FIGS. 14A to 14E are schematic views showing structural examples of removable memory devices.

FIG. 20A is a top view showing a structural example of a transistor, and FIGS. 20B and 20C are cross-sectional views showing structural examples of the transistor.

FIG. 22A is a top view showing a structural example of a transistor, and FIGS. 22B and 22C are cross-sectional views showing structural examples of the transistor.

FIG. 23A is a top view showing a structural example of a transistor, and FIGS. 23B and 23C are cross-sectional views showing structural examples of the transistor.

FIGS. 27A and 27B are cross-sectional views showing structural examples of a memory device.

DETAILED DESCRIPTION OF THE INVENTION

Figure 1:
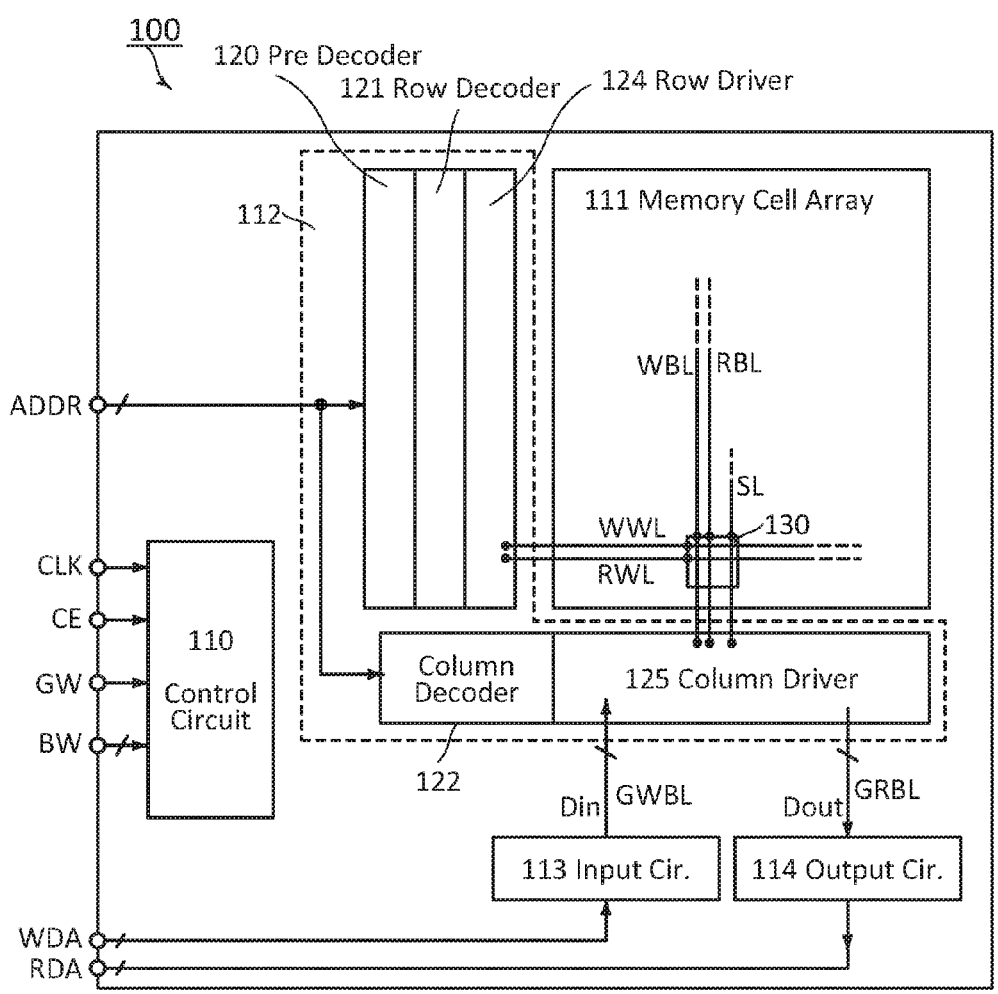
FIG. 1 is a block diagram showing a structure example of a memory device.

Embodiments of the present invention will be described below. Note that one embodiment of the present invention is not limited to the following description. It will be readily appreciated by those skilled in the art that modes and details of the present invention can be modified in various ways without departing from the spirit and scope of the present invention. One embodiment of the present invention therefore should not be construed as being limited to the following description of the embodiments.

Any of the embodiments described below can be combined as appropriate. In addition, in the case where a plurality of structure examples (including a manufacturing method example, an operating method example, and the like) are given in one embodiment, any of the structure examples can be combined as appropriate, and any of the structure examples can be combined with one or more structure examples described in the other embodiments.

In the drawings, the same components, components having similar functions, components formed using the same material, or components formed at the same time are denoted by the same reference numerals, and the description thereof is not repeated in some cases.

In this specification, a high power supply potential VDD is abbreviated to "a potential VDD," "VDD," or the like in some cases. The same applies to other components (e.g., signals, voltages, potentials, circuits, elements, electrodes, and wirings).

Embodiment 1

In this embodiment, a memory device is described as an example of a semiconductor device.

<<Memory Device>>

FIG. 1 is a block diagram showing a configuration example of a memory device. A memory device 100 shown in FIG. 1 includes a control circuit 110, a memory cell array 111, a driver portion 112, an input circuit 113, and an output circuit 114.

The decision whether each circuit, each signal, and each voltage are used in the memory device 100 or not can be made as appropriate as needed. Another circuit or another signal may further be used. Structures (e.g., bit lengths) of an input signal and an output signal of the memory device 100 are set depending on the architecture of a host device connected to the memory device 100, the operation mode of the memory device 100, the configuration of the memory cell array 111, and the like.

CLK, CE, GW, BW, ADDR, and WDA are signals input from the outside, and RDA is a signal output to the outside. CLK is a clock signal. CE, GW, and BW are control signals. CE is a chip enable signal, GW is a global write enable signal, and BW is a byte write enable signal. ADDR is an address signal. WDA is write data, and RDA is read data.

The control circuit 110 is a logic circuit configured to control the entire operation of the memory device 100. For example, the control circuit performs a logical operation on the signals CE, GW, and BW to determine an operation mode. The control circuit 110 generates a control signal for the driver portion 112 so that the operation mode is executed. The control circuit 110 may be configured to generate an internal clock signal from the signal CLK, for example.

The memory cell array 111 includes a plurality of memory cells 130 and wirings WWL, RWL, WBL, RBL, SL, and the like. The plurality of memory cells 130 are arranged in a matrix. The wirings WWL and RWL are arranged in the row direction. The memory cells 130 that are arranged in a row are electrically connected to the wirings WWL and RWL in the row. The wirings WBL, RBL, and SL are arranged in the column direction. The memory cells that are arranged in a column are electrically connected to the wirings WBL, RBL, and SL in the column. The wiring WWL is a write word line, the wiring RWL is a read word line, the wiring WBL is a write bit line, the wiring RBL is a read bit line, and the wiring SL is a source line.

The driver portion 112 is a circuit for writing and reading data to/from the memory cell array 111. The driver portion 112 is configured to drive the wirings WWL, RWL, WBL, RBL, and SL, for example. The driver portion 112 includes a predecoder 120, a row decoder 121, a column decoder 122, a row driver 124, and a column driver 125.

The predecoder 120, the row decoder 121, and the column decoder 122 are configured to decode the signal ADDR. The predecoder 120 is provided in the case where the memory cell array 111 is divided into a plurality of blocks, for example. In that case, the predecoder 120 is configured to specify a block to be accessed. The row decoder 121 is configured to specify a row to be accessed. The column decoder 122 is configured to specify a column to be accessed.

The column driver 125 is configured to write data to the memory cell array 111, read the data from the memory cell array 111, amplify the read data, and retain the read data, for example. More specifically, the column driver 125 is configured to control voltages of the wirings WBL, RBL, and SL, for example.

The row driver 124 is configured to set the wirings WWL and RWL in a row specified by the row decoder 121 in an active state. By setting the wiring WWL in an active state, the memory cell 130 in the row is selected and data is written to the selected memory cell 130 by the column driver 125. By setting the wiring RWL in an active state, the memory cell 130 in the row is selected and data is read from the selected memory cell 130 by the column driver 125.

The input circuit 113 is configured to retain the data WDA. The data retained by the input circuit 113 is output to the column driver 125 through a wiring GWBL (global write bit line). Din is data output from the input circuit 113 and written to the memory cell array 111.

Data Dout read from the memory cell by the column driver 125 is output to the output circuit 114 through a wiring GRBL (global read bit line). The output circuit 114 is configured to retain the data Dout. The output circuit 114 outputs the retained data to the outside of the memory device 100. The output data is data RDA.

<Memory Cell>

FIGS. 2A to 2F show some configuration examples of a memory cell that can be used as the memory cell 130. In memory cells 131 to 134 shown in FIGS. 2A to 2F, an OS transistor is used as a write transistor. Since the OS transistor has an extremely low off-state current, the memory cells 131 to 134 can be nonvolatile memory devices.

Here, an off-state current refers to a current that flows between a source and a drain when a transistor is off. In the case of an n-channel transistor, for example, when the threshold voltage of the transistor is approximately 0 V to 2 V, a current flowing between a source and a drain when a voltage between a gate and the source is negative can be referred to as an off-state current. An extremely low off-state current means, for example, that the off-state current per micrometer of channel width is lower than or equal to 100 zA (z represents zepto and denotes a factor of $10^{-21}$). Since the off-state current is preferably as low as possible, the normalized off-state current is preferably lower than or equal to 10 zA/μm or lower than or equal to 1 zA/μm), more preferably lower than or equal to 10 yA/μm (y represents yocto and denotes a factor of $10^{-24}$).

An oxide semiconductor has a bandgap of 3.0 eV or higher; thus, an OS transistor has a low leakage current due to thermal excitation and, as described above, an extremely low off-state current. A channel formation region of an OS transistor is preferably formed using an oxide semiconductor containing at least one of indium (In) and zinc (Zn). Typical examples of such an oxide semiconductor include an In-M-Zn oxide (an element M is Al, Ga, Y, or Sn, for example). By reducing impurities serving as electron donors, such as moisture or hydrogen, and also reducing oxygen vacancies, an i-type (intrinsic) or a substantially i-type oxide semiconductor can be obtained. Here, such an oxide semiconductor can be referred to as a highly-purified oxide semiconductor. By using a highly purified oxide semiconductor, the off-state current of the OS transistor that is normalized by channel width can be as low as several yoctoamperes per micrometer to several zeptoamperes per micrometer. An OS transistor and an oxide semiconductor will be described in Embodiments 3 and 5.

In addition, the OS transistor has small temperature dependence of the off-state current characteristics. Therefore, a normalized off-state current of the OS transistor can be less than or equal to 100 zA (z represents zepto and denotes a factor of $10^{-21}$) even at high temperatures (e.g., 100° C. or higher). Thus, when the OS transistor is used as a write transistor in each of the memory cells 131 to 134, data can be retained in the memory cells 131 to 134 without being lost even in a high-temperature environment, so that the memory device 100 can have high reliability against temperature.

Figure 2A:
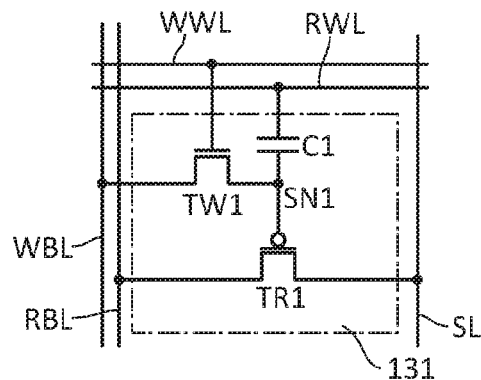
FIGS. 2A to 2F are circuit diagrams each showing a configuration example of a memory cell.

The memory cell 131 shown in FIG. 2A is electrically connected to the wirings WWL, RWL, WBL, RBL, and SL. The memory cell 131 includes a node SN1, transistors TW1 and TR1, and a capacitor C1.

The node SN1 is a retention node. The capacitor C1 is a storage capacitor for holding charge of the node SN1. The node SN1 and the wiring RWL are capacitively coupled to each other by the capacitor C1. A constant potential may be input to the wiring RWL, or the potential of the wiring RWL may be controlled in accordance with a selected or non-selected state of the memory cell 131.

The transistor TW1 is a write transistor (OS transistor). The transistor TW1 is configured to control electrical continuity between the wiring WBL and the node SN1. A gate of the transistor TW1 is electrically connected to the wiring WWL. The transistor TR1 is configured to control electrical continuity between the wiring SL and the wiring RBL. A gate of the transistor TR1 is electrically connected to the node SN1.

Figure 2B:
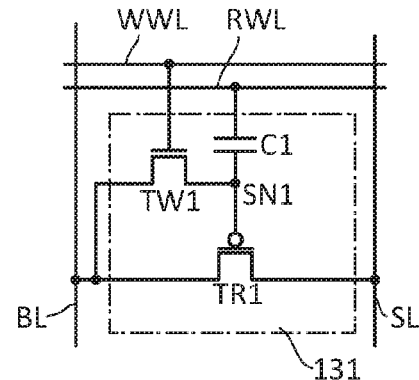

In the case of using the memory cell 131, as shown in FIG. 2B, one wiring BL may be used instead of the bit line for writing and the bit line for reading. In that case, the transistors TW1 and TR1 are electrically connected to the wiring BL.

By turning off the transistor TW1, the node SN1 is brought into an electrically floating state and the memory cell 131 retains data. Since the transistor TW1 is an OS transistor, leakage of charge from the node SN1 is reduced, so that the memory cell 131 can retain data for a long time.

Figure 2C:
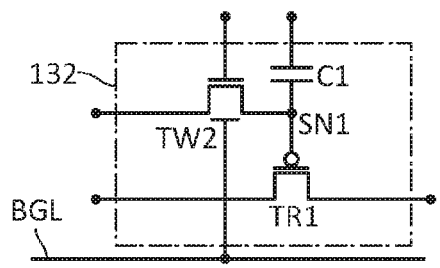
Figure 2D:
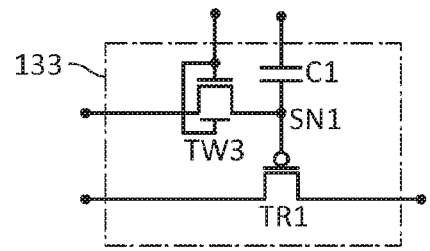

As shown in FIGS. 2C and 2D, transistors TW2 and TW3 with back gates can be used as write transistors. The transistors TW2 and TW3 are also OS transistors.

The back gate of the transistor TW2 in the memory cell 132 in FIG. 2C is electrically connected to a wiring BGL. The threshold voltage of the transistor TW2 can be controlled by the potential of the wiring BGL. In the case where a charge accumulation layer is provided as an insulating layer between the back gate and a channel formation region of the transistor TW2, charge can be injected into a charge accumulation layer of the transistor TW2 by using the wiring BGL at the time of manufacture of the memory cell 132. In the case of performing this step, the back gate of the transistor TW2 may be brought into an electrically floating state to operate the memory cell 132 without controlling the potential of the wiring BGL.

In the memory cell 133 in FIG. 2D, the back gate and a gate of the transistor TW3 are electrically connected to each other. When the transistor TW3 has such a device structure, on-state current can be increased. The back gate of the transistor TW3 may be electrically connected to any of a gate, a source, or a drain of the transistor TW3.

Figure 2E:
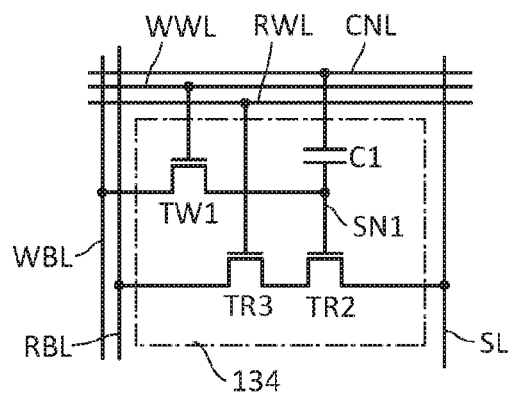

The memory cell 134 shown in FIG. 2E is electrically connected to the wirings WWL, RWL, WBL, RBL, and SL and a wiring CNL. The memory cell 134 includes the node SN1, the capacitor C1, the transistor TW1, a transistor TR2, and a transistor TR3. The node SN1 and the wiring CNL are capacitively coupled to each other by the capacitor C1. A fixed potential may be input to the wiring CNL, or the potential of the wiring CNL may be controlled in accordance with a selected or non-selected state of the memory cell 134. The transistors TR2 and TR3 are electrically connected in series between the wiring RBL and the wiring SL. A gate of the transistor TR2 is electrically connected to the node SN1, and a gate of the transistor TR3 is electrically connected to the wiring RWL.

Figure 2F:
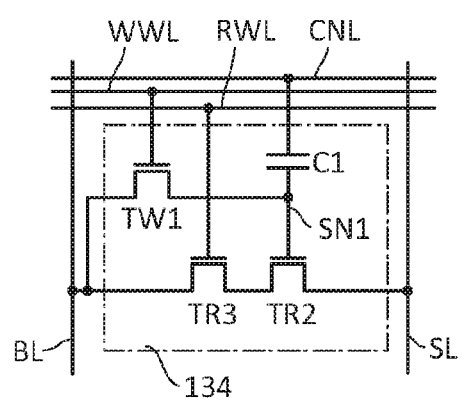

In the case of using the memory cell 134, as shown in FIG. 2F, one bit line (BL) may be used instead of the bit line for writing and the bit line for reading. In that case, the transistors TW1 and TR1 are electrically connected to the wiring BL.

In the memory cell 134, the transistor TW1 may be replaced with the transistor TW2 or TW3. In addition, the transistors TR2 and TR3 may be p-channel transistors.

The transistor TR1 in the memory cells 131 to 134 and the transistors TR2 and TR3 in the memory cell 134 are not particularly limited, and can be Si transistors formed using a silicon wafer, for example. In the case where the transistors TR1 to TR3 are n-channel transistors, the transistors TR1 to TR3 may be OS transistors.

Note that the write transistors in the memory cells 131 to 134 can be transistors of another type, e.g., Si transistors. The memory cells 131 to 134 in this case are volatile memory devices, and thus, self-refresh may be performed in the memory devices 100 as in standard DRAMs.

<Bit Line Structure>

Figure 3A:
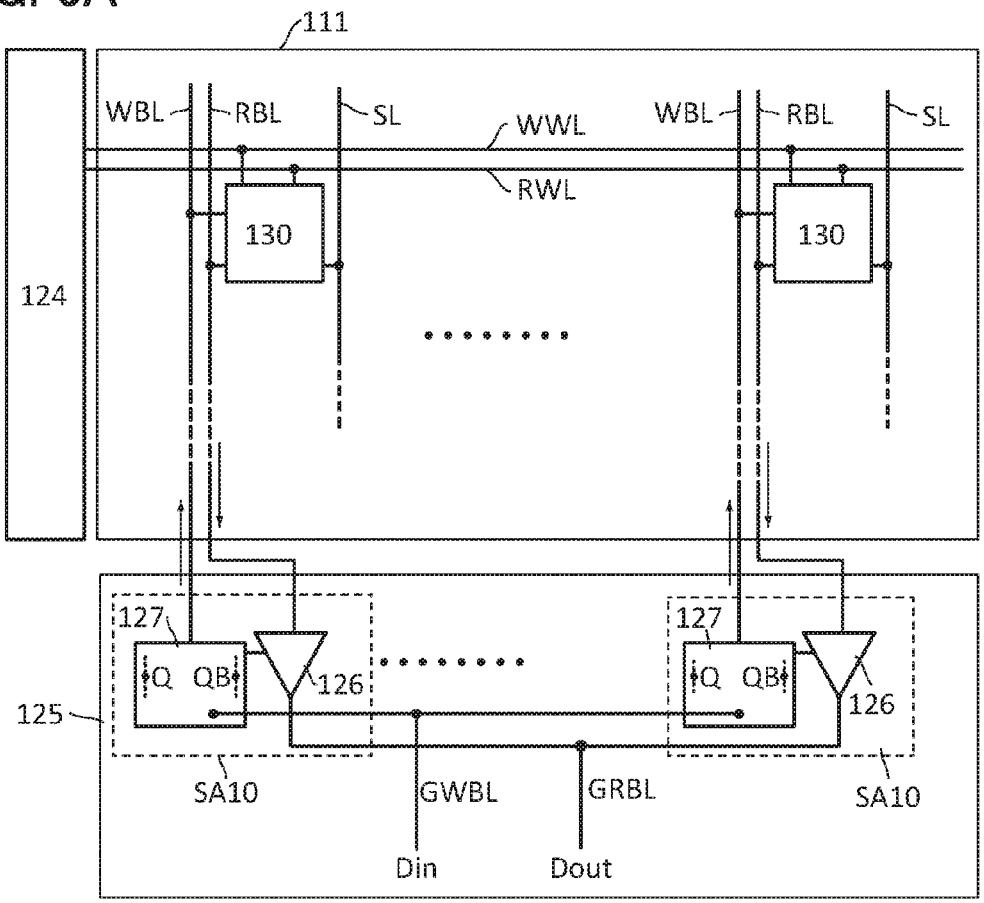
FIGS. 3A and 3B are block diagrams each schematically showing a bit line structure of a memory device.

FIG. 3A is a block diagram schematically showing a bit line structure of the memory device 100. In the column driver 125, a sense amplifier SA10 is provided for each column. The sense amplifier SA is an amplifier circuit configured to retain data. In FIG. 3A, an amplifier portion of the sense amplifier SA10 is shown by an amplifier circuit (AMP) 126, and a data retention portion thereof is shown by a latch circuit 127.

The AMP 126 is a circuit for amplifying data read from the memory cell 130. The AMP 126 is configured to amplify a voltage of the wiring RBL. Output of data amplified by the AMP 126 to the wiring GRBL is controlled by the column driver 125.

The latch circuit 127 includes a pair of retention nodes (nodes Q and QB) for retaining complementary data. The node Q retains data whose logic is the same as that of the memory cell 130. The latch circuit 127 is a circuit for retaining data read from the memory cell 130 and retaining data Din to be written to the memory cell 130. The data read from the memory cell 130 is amplified by the AMP 126 and written to the latch circuit 127.

In the sense amplifier SA10, one of the nodes Q and QB serves as an output node for outputting retained data to the wiring WBL and the other serves as an input node for inputting data read from the memory cell 130. For example, in the case where the node Q serves as an output node, the column driver 125 is configured to write data in the node Q to the wiring WBL and write data in the wiring RBL to the node QB.

Alternatively, in the sense amplifier SA10, one of the nodes Q and QB can serve as an output node for outputting retained data to the wiring WBL and an input node for inputting data read from the memory cell 130. In the case where the node Q serves as an output node and an input node, for example, the column driver 125 is configured to write data in the node Q to the wiring WBL and write data in the wiring RBL to the node Q.

This embodiment enables data writing in units smaller than the line size of the memory cell array 111. For example, in the case where the line size of the memory cell array 111 is 128 bits, data writing in byte (8-bit) units, half-word (e.g., 16-bit) units, and word (e.g., 32-bit) units can be performed.

In order to achieve this, in a write mode, a read operation is performed first, and a write operation is then performed. Note that in a read mode, only a read operation is performed.

In the write mode, reading is performed on the memory cell 130 in a write target row, specifically, a row specified by the signal ADDR. Data read from the memory cells 130 in the target row is amplified by the AMP 126 and retained in the latch circuit 127 in each column.

Then, data in the latch circuit 127 in a write target column, specifically, a column specified by the signal ADDR, is updated to the data Din. The latch circuit 127 in a column that is not a write target column retains read data.

Then, an output node of the latch circuit 127 is electrically connected to the wiring WBL. Then, the wiring WWL is set in an active state and the memory cells 130 in the target row are electrically connected to the wiring WBL. The data retained in the latch circuit 127 is written to all the memory cells 130 in the target row. That is, new data is written to the memory cells 130 of write targets, and the retained data is rewritten to the other memory cells 130. The wiring WWL is set in a non-active state, and the wiring WBL is set to a high level ("H") or a low level ("L"), whereby the write operation is completed.

When data of the memory cell array 111 is changed to data written to the sense amplifier SA10 as described above, writing in units smaller than the line size of the memory cell array 111 can be achieved. For example, writing in N-byte units (N is an integer of 1 or more) or N-word units can be performed. Setting a plurality of write modes enables writing in a plurality of units. The details and kind of the write mode can be set by the signals CE, GW, and BW, for example.

Figure 3B:
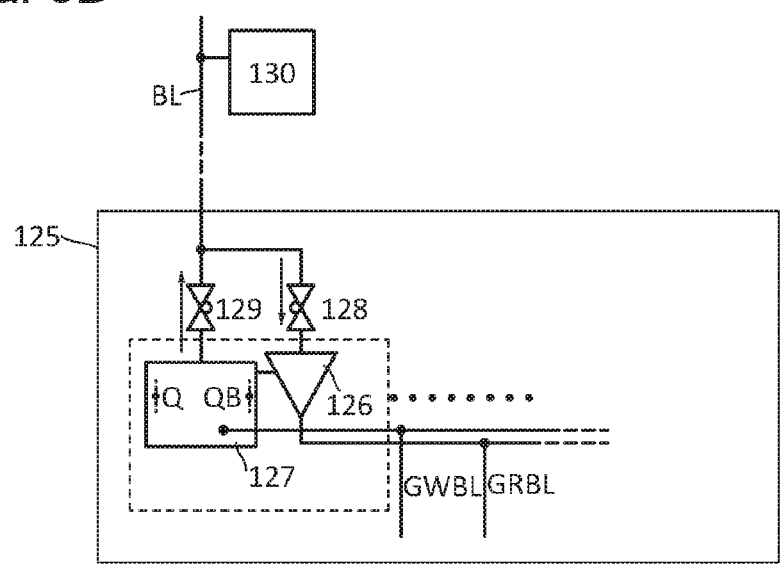

In the case where one bit line (BL) serves as bit lines for writing and reading, switches 128 and 129 may be provided in the column driver 125 as shown in FIG. 3B. The switch 128 controls electrical continuity between the AMP 126 and the wiring BL. The switch 129 controls electrical continuity between the latch circuit 127 and the wiring BL. Here, the switches 128 and 129 are each formed using a transfer gate, but they are not limited to the circuit configuration. For example, the switch 128 can be formed using one or more of a transfer gate, a logic gate circuit (e.g., a NAND circuit or an AND circuit), and the like. The same applies to the switch 129.

The memory device 100 enables data writing in units smaller than the line size of the memory cell array 111 without employing a hierarchical word line structure. This does not cause an increase in area due to a word line divider (AND circuit) and is highly advantageous in increasing capacity. Moreover, since a word line divider is not provided, an increase in power consumption due to an increase in capacity can be prevented.

<<Configuration Example of Memory Device 101>>

Next, a more specific configuration example and an operation example of the memory device 100 are described. Here, a configuration example, an operation example, and the like of the memory device 100 with a storage capacity of 16 KB are specifically described. The memory device 100 described here is referred to as "memory device 101" for convenience.

<<Memory Cell Array and Driver Portion>>

Figure 4A:
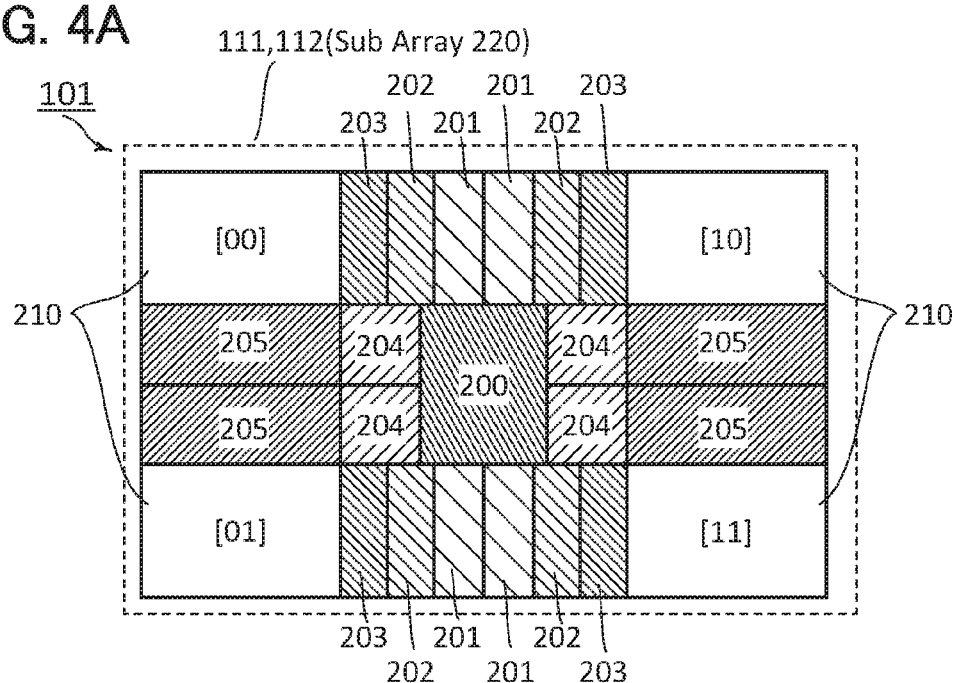
FIG. 4A is a block diagram showing an example of a layout of a memory device.
Figure 4B:
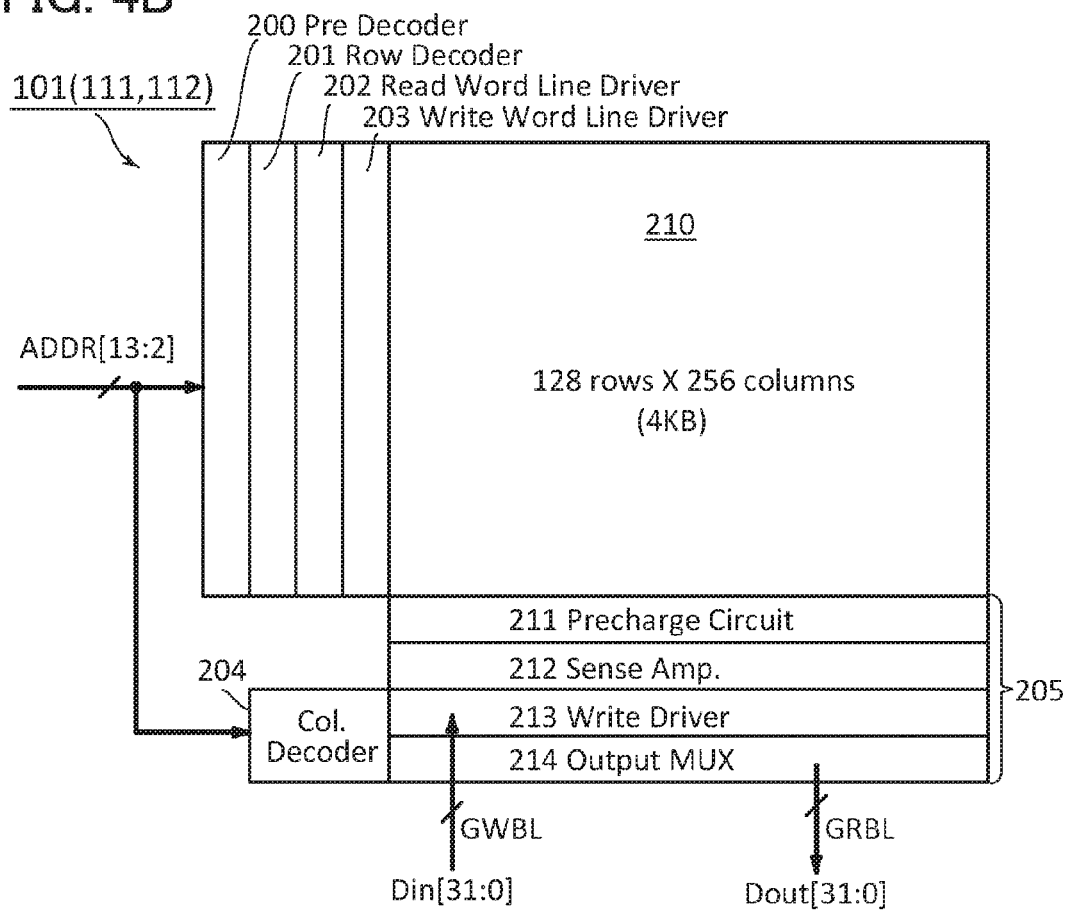
FIG. 4B is a block diagram showing an example of a circuit configuration of the memory device.

FIG. 4A shows an example of a layout of the memory cell array 111 and the driver portion 112 of the memory device 101. The memory cell array 111 is divided into four blocks 210. FIG. 4B is a block diagram showing a circuit structure of the memory cell array 111 and the driver portion 112 of the memory device 101.

One predecoder 200 is provided for the four blocks 210. A row decoder 201, a read word line driver 202, a write word line driver 203, a column decoder 204, and a column driver 205 are provided for each block 210. The read word line driver 202 is configured to generate a signal for selecting the RWL. The write word line driver 203 is configured to generate a signal for selecting the WWL.

The column driver 205 includes a precharge circuit 211, a sense amplifier 212, a write driver 213, and an output multiplexer (MUX) 214.

Here, write data input from the outside is data WDA[31:0], and read data output to the outside is data RDA[31:0]. Therefore, 32-bit data is used also as the data Din and Dout. Data Din[31:0] is input to the write driver 213 through 32 wirings GWBL. Data Dout[31:0] is output from the output MUX 214 through 32 wirings GRBL.

Here, the block 210 includes memory cells arranged in 128 rows and 256 columns. Therefore, the capacity of the block 210 is 4 KB and the line size is 256 bits. Thus, the capacity of the memory device 101 is 16 KB.

Signals ADDR[13:2] are used as address signals. The values of the signals ADDR[13:12] are block addresses for selecting the block 210. In FIG. 4A, values of [00] and the like in the blocks 210 represent the values of the signals ADDR[13:12]. In order to input and output data in word units in the memory device 101, one address (word address) is provided for each of 1-word memory areas (1 row×32 columns) in blocks 210 (128 rows×256 columns). The signals ADDR[11:2] allow access to memory cells 134 arranged in 1 row and 32 columns. Seven high-order bits of the signals ADDR[11:2] correspond to a row address, and three low-order bits thereof correspond to a column address.

<<Configuration Examples of Block and Column Driver>>

Figure 5:
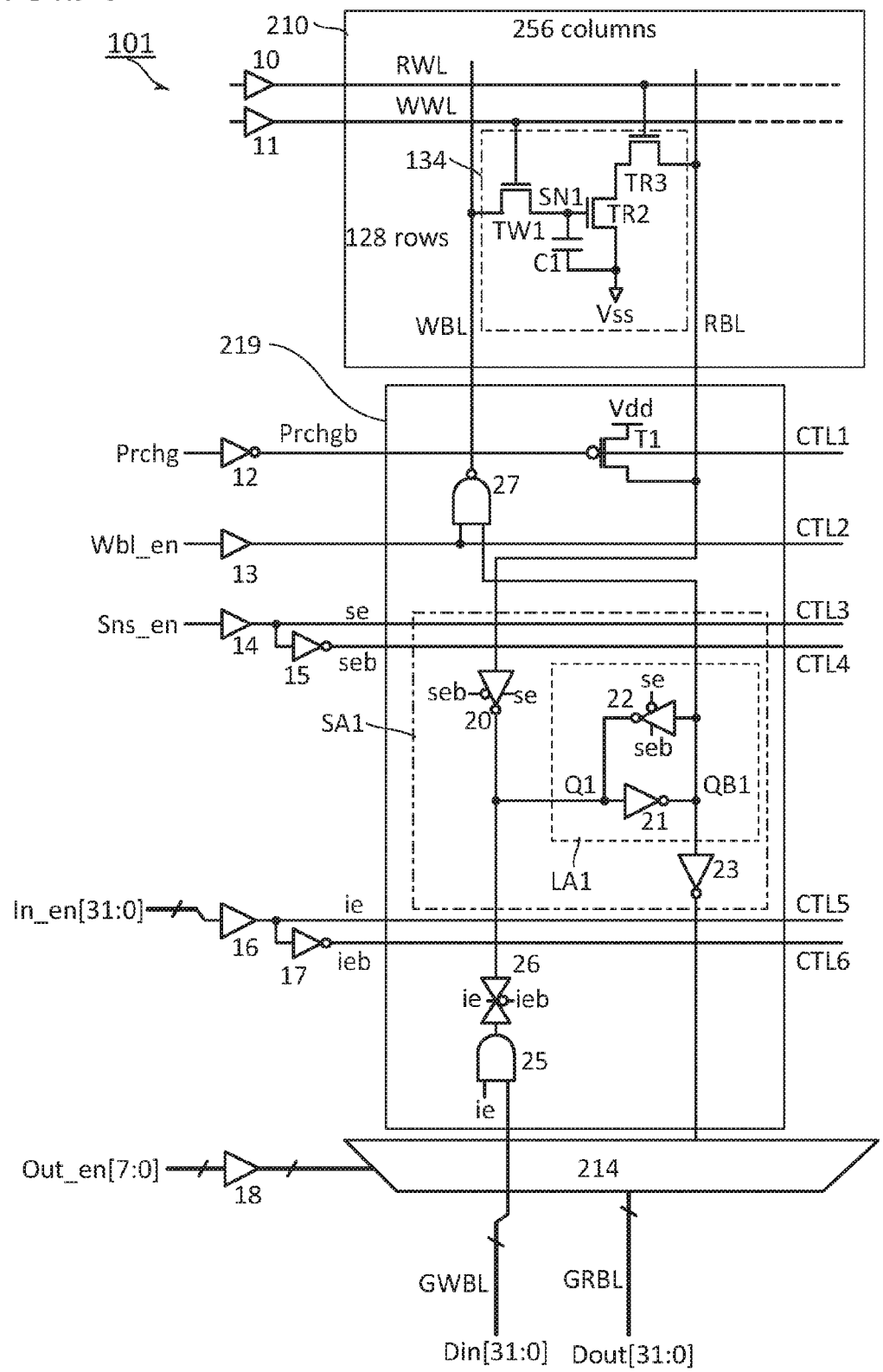
FIG. 5 is a circuit diagram showing a configuration example of a block and a column driver of a memory device.

FIG. 5 shows a circuit configuration example of the block 210 and the column driver 205 of the memory device 101.

The memory device 101 is supplied with Vdd and Vss. Vdd is high power supply voltage, and Vss is low power supply voltage. Vdd is supplied to circuits in the memory device 101 through a power supply line for Vdd that is provided in the memory device 101. The same applies to Vss. Hereinafter, the power supply line for Vdd is referred to as Vdd line, and a power supply line for Vss is referred to as Vss line. A power supply line that supplies another voltage is named in a similar manner.

The circuit configuration shown in FIG. 2E is used for the block 210. It is needless to say that any of the circuit configurations shown in FIGS. 2A to 2F can be used as the block 210. In FIG. 5, the wirings SL and CNL are not shown. The wirings SL and CNL are connected to the Vss line and supplied with Vss. A signal generated in the read word line driver 202 is input to the wiring RWL through a buffer 10. A signal generated in the write word line driver 203 is input to the wiring WWL through a buffer 11.

Signals Prchg, Wbl_en, Sns_en, In_en[31:0], and Out_en [7:0] are input to the column driver 205. These are internal signals of the memory device 101. Prchg is a precharge control signal. Wbl_en is a write word line enable signal. Sns_en is a sense amplifier enable signal. In_en[31:0] are input enable signals. Out_en[7:0] are output enable signals. CTL1 to CTL6 are wirings for transferring the internal signals.

A circuit 219 is a circuit forming the column driver 205 and is provided for each column. The circuit 219 includes a transistor T1, a sense amplifier SA1, an AND circuit (AND) 25, a transmission gate (TG) 26, and a NAND circuit (NAND) 27. The transistor T1 is provided in the precharge circuit 211. The sense amplifier SA1 is provided in the sense amplifier 212. The AND 25, the TG 26, and the NAND 27 are provided in the write driver 213.

<Precharge Circuit 211>

The signal Prchg is a control signal for the precharge circuit 211 and a signal for controlling on/off of the transistor T1. The transistor T1 is configured to precharge "H" to the wiring RBL. The transistor T1 has a gate connected to the wiring CTL1, a source connected to the Vdd line, and a drain connected to the wiring RBL. The signal Prchg is input to the wiring CTL1 after being amplified by an INV 12. A signal Prchgb is an output signal of the INV 12 and an inversion signal of the signal Prchg.

<Sense Amplifier 212>

The sense amplifier SA1 is provided in the sense amplifier 212. The sense amplifier SA1 includes three-state inverters (3-STAINVs) 20 and 22 and INVs 21 and 23. The 3-STAINV 20 is an amplifier circuit for amplifying a voltage of the wiring RBL and corresponds to the AMP 126 in FIG. 3A. The 3-STAINV 20 has an input node electrically connected to the wiring RBL and an output node electrically connected to the TG 26.

An output node of the INV 21 is connected to an input node of the 3-STAINV 22 and an output node of the 3-STAINV 22 is connected to an input node of the INV 21 to form a latch circuit LA1 (hereinafter referred to as latch LA1). The latch LA1 is a circuit corresponding to the latch circuit 127 shown in FIG. 3A. Nodes Q1 and QB1 are input and output nodes of the latch LA1. The node Q1 is an input node of the INV 21 (an output node of the 3-STAINV 22). The node QB1 is an output node of the INV 21 (an input node of the 3-STAINV 22). The node Q1 is electrically connected to the output node of the 3-STAINV 20. The node QB1 is electrically connected to an input node of the INV 23. The INV 23 is provided to invert the logic of the node QB1. By the INV 23, data whose logic is the same as that of the node Q1 is input to the output MUX 214.

The signal Sns_en is a control signal for the sense amplifier 212. The signal Sns_en is amplified by a buffer 14 and input to the wiring CTL3. An output signal (se) of the buffer 14 is inverted by an INV 15 and input to the wiring CTL4. Thus, an output signal (seb) of the INV 15 is an inversion signal of the signal se.

The 3-STAINVs 20 and 22 are each connected to the wirings CTL3 and CTL4 and supplied with the signals se and seb. When the signal se is at "H", the 3-STAINV 20 serves as an inverter. When the signal se is at "L", output of the 3-STAINV 20 has a high impedance ("Z"). Therefore, at rising of the signal Sns_en, data of the sense amplifier SA1 is changed.

<Write Driver 213>

The write driver 213 is configured to control the connection between the wiring WBL and the wiring GWBL. In the example shown in FIG. 5, one wiring GWBL is provided for eight wirings WBL. One of the eight wirings WBL is selected and connected to the one wiring GWBL. In the operation of writing in one-word units, for example, 32 wirings WBL are selected from 256 wirings WBL and connected to appropriate wirings GWBL. In the operation of writing in one-byte units, for example, eight wirings WBL are selected and connected to appropriate wirings GWBL.

The signal Wbl_en and the signals In_en[31:0] are control signals for the write driver 213. The signal Wbl_en is input to the wiring CTL2 through a buffer 13. One of input nodes of the NAND 27 is electrically connected to the wiring CTL2, and the other input node is electrically connected to the node QB1 of the SA1.

For the signals In_en[31:0], 32 wirings CTL5, 32 wirings CTL6, 32 buffers 16, and 32 INVs 17 are provided. The signals In_en[31:0] are input to the wirings CTL5 through the buffers 16. Output nodes of the buffers 16 are electrically connected to the wirings CTL6 through the INVs 17. A signal ie is an output signal of the buffer 16, and a signal ieb is an output signal of the INV 17.

The connection between the wiring GWBL and the sense amplifier SA1 is controlled by the AND 25 and the TG 26. One of input nodes of the AND 25 is connected to one GWBL, and the other input node is electrically connected to the wiring CTL5 and supplied with the signal ie. The TG 26 is electrically connected to the wiring CTL5 and the wiring CTL6 and supplied with the signals ie and ieb. When the signal ie is at "H", the wiring GWBL and the node Q1 are electrically connected to each other. When the signal ie is at "L", the wiring GWBL and the node Q1 are electrically disconnected from each other.

<Output MUX 214>

In the memory device 101, one wiring GRBL is provided for eight wirings RBL. The output MUX 214 is a circuit for controlling the connection between the wiring GRBL and the wiring RBL. The output MUX 214 is a MUX with 256 inputs and 32 outputs. The signals Out_en[7:0] (output enable signals) are control signals for the output MUX 214. The output MUX 214 includes input nodes connected to output nodes of the INVs 23 in columns and output nodes connected to different wirings GRBL.

<<Operation Example of Memory Device 101>>

Table 1 shows a truth table for setting the operation mode of the memory device 101. The memory device 101 has a standby mode, a read mode, three write modes (byte write mode, half-word write mode, and word write mode), and a refresh mode. Here, a word is 32 bits. In the byte write mode, writing in one-word (8-bit) units can be performed. In the half-word write mode and the word write mode, writing in 16-bit (2-byte) units and writing in 32-bit (4-byte) units can be performed, respectively.

To set the operation mode shown in Table 1, signals BW[3:0] are used as the byte write enable signal. The control circuit 110 performs a logical operation on the signals CE, GW, and BW[3:0] to determine the operation mode of the memory device 101. Here, 1-byte data to be written is selected from the data Din[31:0] and specified by the signals BW[3:0]. The logic of the signals BW[3], BW[2], BW[1], and BW[0] determines writing of the data Din[31:24], Din[23:16], Din[15:8], and Din[7:0], respectively.

TABLE 1

| Mode | CE | GW | BW[0] | BW[1] | BW[2] | BW[3] |
|---|---|---|---|---|---|---|
| Standby | L | X | X | X | X | X |
| Read | H | L | L | L | L | L |
| Byte Write | H | H | H | L | L | L |
| Half-word Write | H | H | H | H | L | L |
| Word Write | H | H | H | H | H | H |
| Refresh | H | H | L | L | L | L |

<Read Mode>

Figure 6:
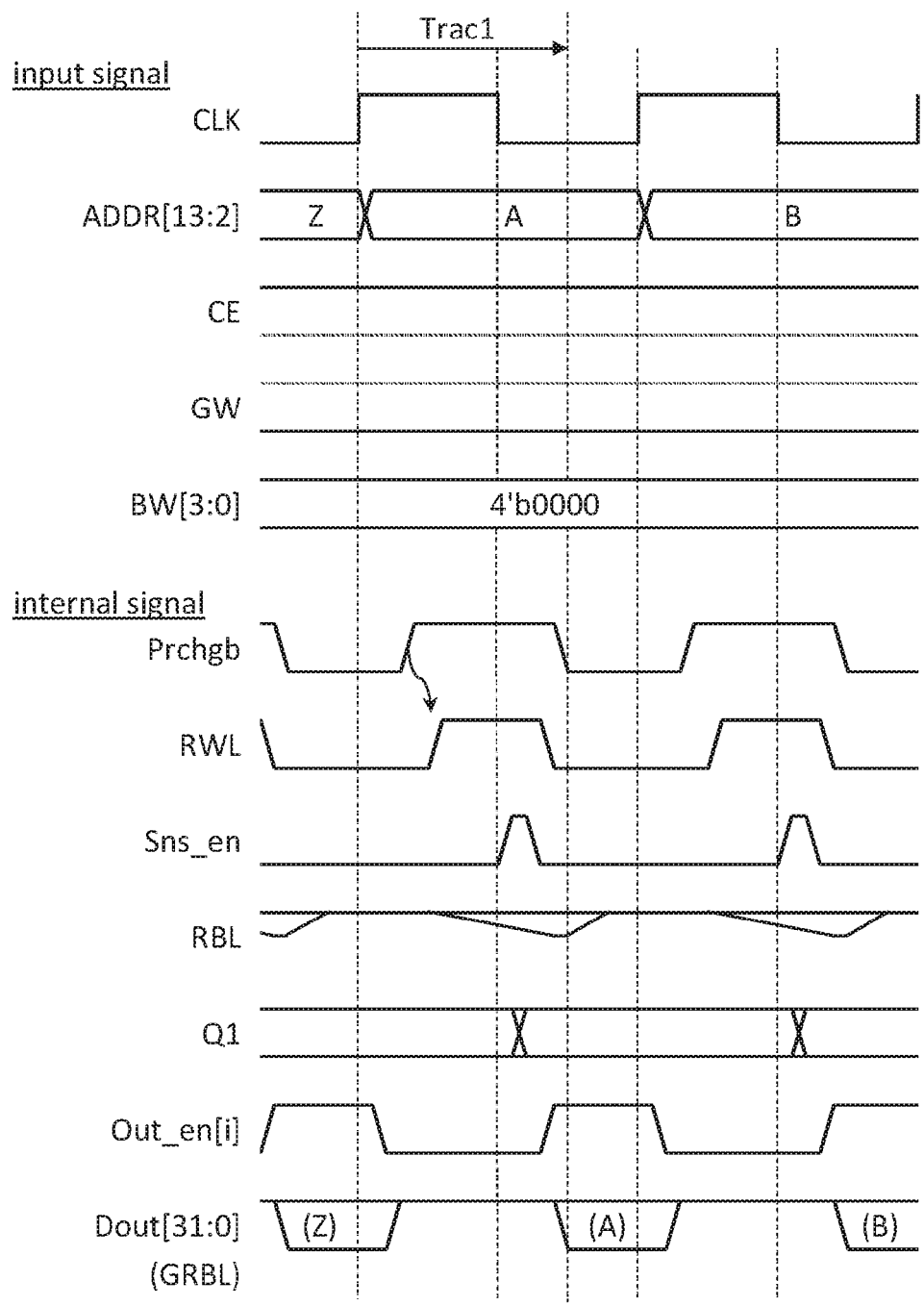
FIG. 6 is a timing chart showing an operation method example of a memory device in a read mode.

FIG. 6 is a timing chart showing an operation example of the memory device 101 in the read mode. For easy understanding of the operation of the memory device 101, generating a signal from another signal is shown by an arrow. For example, an arrow in FIG. 6 means that a signal supplied to the wiring RWL is generated from the signal Prchgb. The same applies to other timing charts. In FIG. 6, "i" in a signal Out_en[i] is an integer greater than or equal to 0 and less than or equal to 7.

In the read mode, the signal CE is "1", the signal GW is "0", and the signals BW[3:0] are "0000" (Table 1). In the operation shown in FIG. 6, addresses Z, A, and B are input in synchronization with the signal CLK, and data (Z), (A), and (B) is read from the memory cells 134 specified by these addresses. Tract is read access time, i.e., time from the input of the signal ADDR to the output of data from the memory cell 134 of a read target. Here, the operation of the memory device 101 in the read mode is described focusing on the address A.

In a standby state before the input of the address A, the signal Sns_en is at "L", and thus, the wiring RBL and the latch LA1 are electrically disconnected from each other. Furthermore, the signal Prchgb is at "L", and thus, the wiring RBL is precharged to Vdd by the transistor T1. After a certain amount of time from the input of the address A, the signal Prchgb is set to "H". Transistors T1 in all columns are turned off, whereby wirings RBL in all columns are brought into a floating state.

By the read word line driver 202, a wiring RWL in a row specified by the address A is set to "H". When the node SN1 of the memory cell 134 is at "H", both of the transistors TR2 and TR3 are ON; thus, a current flows from the wiring RBL to the wiring SL, and the voltage of the wiring RBL is lowered. When the node SN1 is at "L", the transistor TR3 is ON and the transistor TR2 is OFF; thus, the voltage of the wiring RBL is not changed.

In a period during which the wiring RWL is at "H", the signal Sns_en is set to "H" to connect the latch LA1 to the wiring RBL in each of the columns. When the signal Sns_en is at "H", the wiring RBL is electrically connected to the node Q1 by the 3-STAINV 20. When the node SN1 is at "H", the node Q1 is at "H". When the node SN1 is at "L", the node Q1 is at "L". That is, data retained in the memory cell 134 is written to the latch LA1 (the sense amplifier SA1).

The signal Sns_en is set to "L" to electrically disconnect the latch LA1 from the wiring RBL. Then, the wiring RWL is set to "L", and after that, the signal Prchgb is set to "L". By setting the signal Prchgb to "L", the wiring RBL is precharged.

After the signal Sns_en is set to "L", the signals Out_en [7:0] are set in an active state. The logic of the signals Out_en[7:0] is determined by the signals ADDR[4:2]. By the output MUX 214, output nodes of sense amplifiers SA1 in 32 read target columns are connected to different wirings GRBL, and the data (A) is output from the output MUX 214. Thus, the read operation is completed.

<Write Mode>

Figure 7:
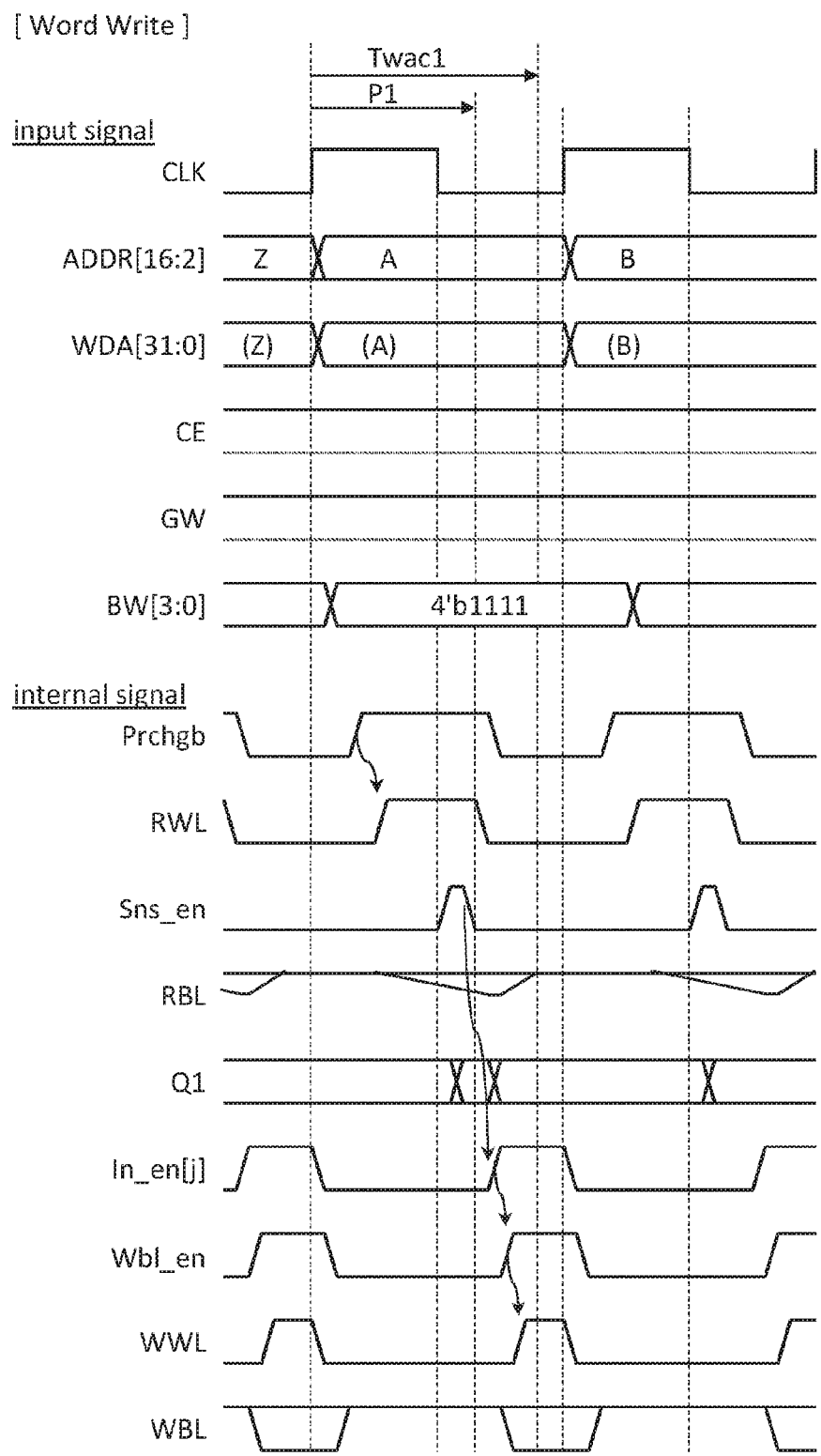
FIG. 7 is a timing chart showing an operation method example of a memory device in a write mode.

An operation example of the memory device 101 in the write mode is described with reference to FIG. 7. FIG. 7 is a timing chart of the word write mode. The signal CE is "1", the signal GW is "0", and the signals BW[3:0] are "1111". Note that "j" in the signal In_en[j] is an integer greater than or equal to 0 and less than or equal to 31.

The addresses Z, A, and B and the data (Z), (A), and (B) to be written are input in synchronization with the signal CLK. The data WDA[31:0] is output to the wiring GWBL through the input circuit 113. The output of the input circuit 113 is the data Din[31:0]. Twac1 is write access time, i.e., time from the input of the address to writing of data to a memory cell specified by the address. Here, the write operation is described focusing on the address A.

First, the read operation is performed in a period P1. Data is read from all of the memory cells 134 in a write target row. In each column, the read data is retained by the latch LA1 (the sense amplifier SA1). The operation in the period P1 is similar to the operation in the read mode shown in FIG. 6.

Then, the signals In_en[31:0] are set in an active state to write the data (A) to 32 latches LA1 in write target columns. In each of the 32 write target columns, the node Q1 of the latch LA1 is connected to the writing GWBL by the AND 25 and the TG 26. Thus, pieces of the data of the 32 latches LA1 in the write target columns are each changed to one bit of any of the data Din[31:0]. Latches LA1 in the other columns retain the data read from the memory cells 134 in the period P1. The logic of the signals In_en[31:0] is determined by the signals BW[3:0] and the signals ADDR[4:2] (the column addresses).

Note that in the half-word write mode, the number of write target columns is 16, and one bit of any of the data Din[15:0] is written to each of 16 latches LA1 in the target columns. In the byte write mode, one bit of any of the data Din[7:0] is written to each of 8 latches LA1 in write target columns.

Then, in each column, the data in the latch LA1 is input to the wiring WBL. By setting the signal Wbl_en to "H", the latch LA1 is electrically connected to the wiring WBL by the NAND 27. In each column, the logic of data retained in the node QB1 is inverted by the NAND 27, and then, the inverted data is written to the wiring WBL. That is, data whose logic is the same as that of the node Q1 is written to the wiring WBL. In a period during which the signal Wbl_en is at "L", the WBL is maintained at "H" by the NAND 27 regardless of the logic of the node QB1.

In a period during which the signal Wbl_en is at "H", the wiring WWL in the write target row is set to "H". The transistors TW1 are turned on, so that data of the latches LA1 is written to all of the memory cells 134 in the write target row. Therefore, the data (A) is written to 32 memory cells 134 specified by the address A, and stored data is rewritten to the other memory cells 134.

The wiring WWL is set to "L", and the signals In_en[31:0] are set to "L". Then, the signal Wbl_en is set to "L", and the wiring WBL is set to "H". This is the end of the write operation. Note that precharge of the wiring RBL can be resumed as soon as the read operation is finished. In FIG. 7, precharge of the wiring RBL is resumed after the signal Sns_en is set to "L" to electrically disconnect the latch LA1 from the wiring RBL.

As described above, the memory device 101 can write data in word units, half-word units, and byte units, but the unit of data writing is not limited thereto. The memory device 101 can write data in appropriate units smaller than the line size of the block 210, e.g., in N-byte units (N is an integer greater than or equal to 1 and less than or equal to 8) by appropriately setting the circuit configuration of the column driver 205, the address signal, the control signal, and the like.

Figure 8:
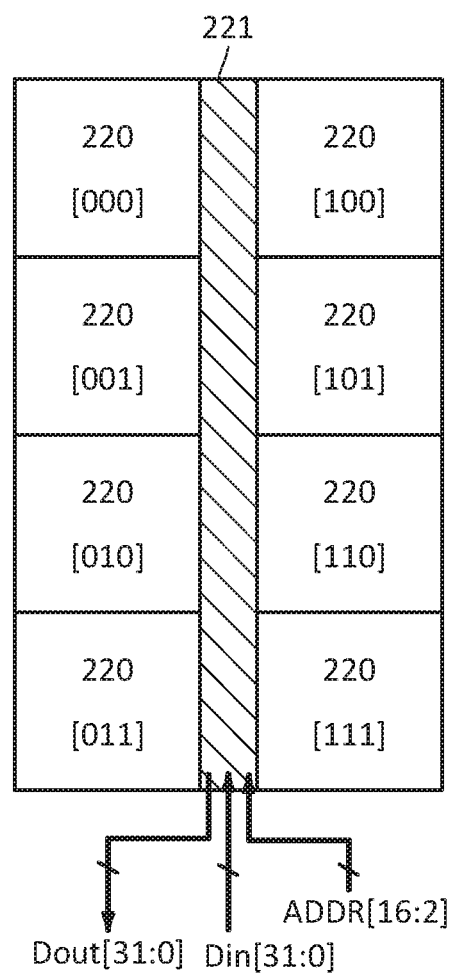
FIG. 8 is a block diagram showing an example of a layout of a sub array of a memory device.

The capacity of the memory device 101 is not limited to 16 KB. The capacity of the memory device 101 can be increased by arranging, in a matrix, a plurality of sub arrays 220 each formed of a circuit group including the memory cell array 111 and the driver portion 112 shown in FIG. 4A, for example. FIG. 8 shows an example of a layout of the sub arrays 220. In the example shown in FIG. 8, the sub arrays 220 are arranged in 4 rows and 2 columns; therefore, the capacity of the memory device 101 is 128 KB. The eight sub arrays 220 are connected to a bus 221. The data Din[31:0] and signals ADDR[16:2] are input to the bus 221, and the data Dout[31:0] is output from the bus 221. The signals ADDR[16:14] are addresses (sub array addresses) for selecting the sub array 220. Note that [000] and the like provided for the sub arrays 220 denote addresses of the sub arrays 220.

<Configuration Example of Memory Device 102>

A specific example of the memory device 100 is described below. The memory device 100 described here is referred to as "memory device 102" for convenience.

Figure 9A:
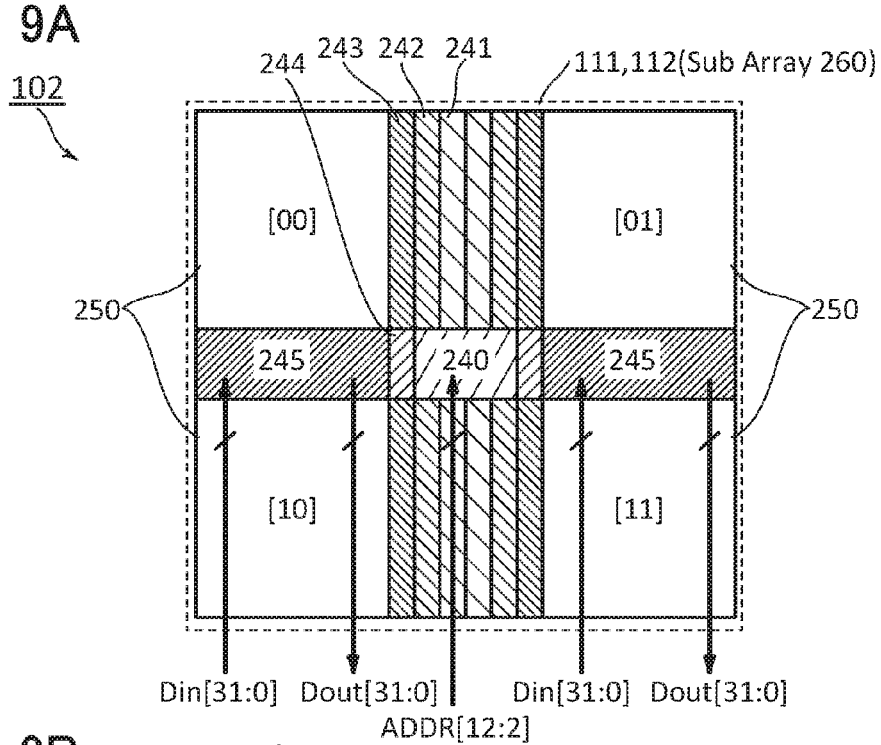
FIG. 9A is a block diagram showing an example of a layout of a memory device.
Figure 9B:
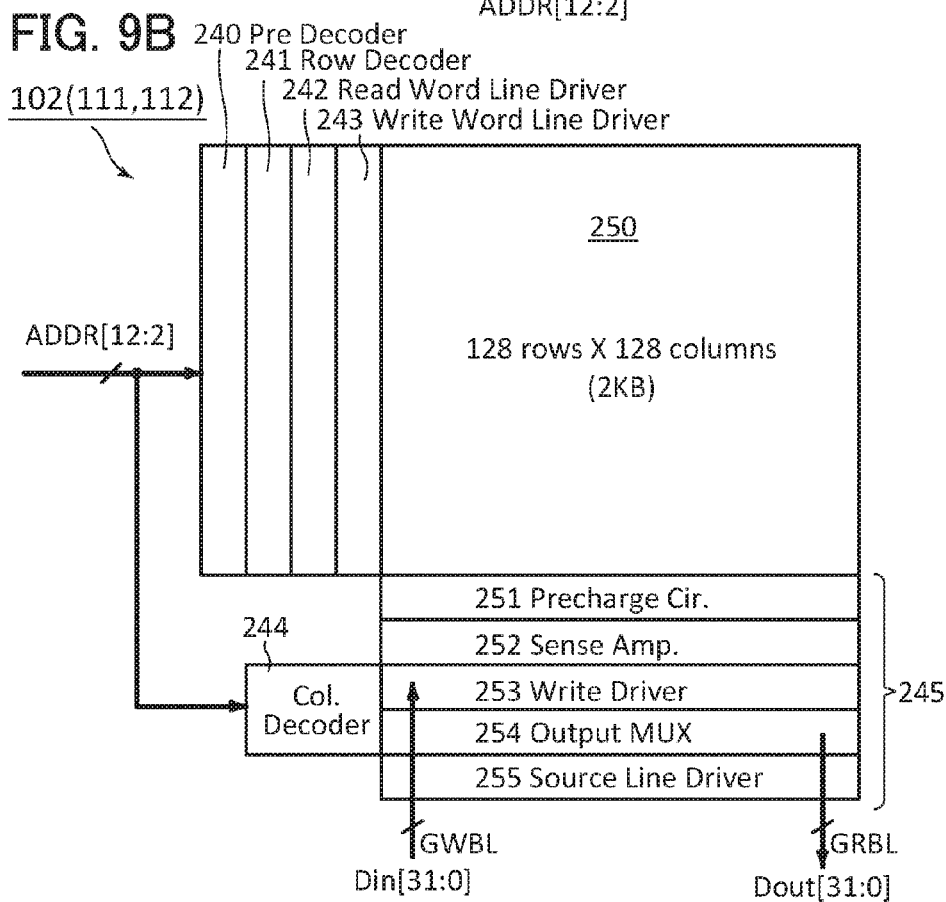
FIG. 9B is a block diagram showing an example of a circuit configuration of the memory device.

FIG. 9A shows an example of a layout of the memory cell array 111 and the driver portion 112 of the memory device 102. The memory cell array 111 is divided into four blocks. Here, these blocks are referred to as blocks 250. FIG. 9B is a block diagram showing a circuit structure of the memory cell array 111 and the driver portion 112 of the memory device 102.

One predecoder 240 is provided for the four blocks 250. A row decoder 241, a read word line driver 242, and a write word line driver 243 are provided for each block 250. One column decoder 244 and one column driver 245 are shared by two blocks 250. The column driver 245 includes a precharge circuit 251, a sense amplifier 252, a write driver 253, an output MUX 254, and a source line driver 255.

In the memory device 102, write data input from the outside is the data WDA[31:0], and read data output to the outside is the data RDA[31:0], as in the memory device 101. Therefore, 32-bit data is used also as the data Din and Dout. The data Din[31:0] is input to the write driver 253 through the 32 wirings GWBL. The data Dout[31:0] is output from the output MUX 214 through the 32 wirings GRBL.

Here, the block 250 is a memory cell array in which memory cells are arranged in 128 rows and 128 columns, and the capacity is 2 KB. The signals ADDR[12:2] are used as address signals of the memory device 102. The signals ADDR[12:11] are block addresses. In FIG. 9A, [00] and the like in the blocks 250 represent the values of the signals ADDR[12:11]. In order to input and output data in word units in the memory device 102, one address (word address) is provided for each of 1-word memory areas (1 row×32 columns) in the block 250. Seven high-order bits of the signals ADDR[10:2] correspond to a row address, and two low-order bits thereof correspond to a column address.

<Circuit Configuration of Block and Column Driver>

Figure 10:
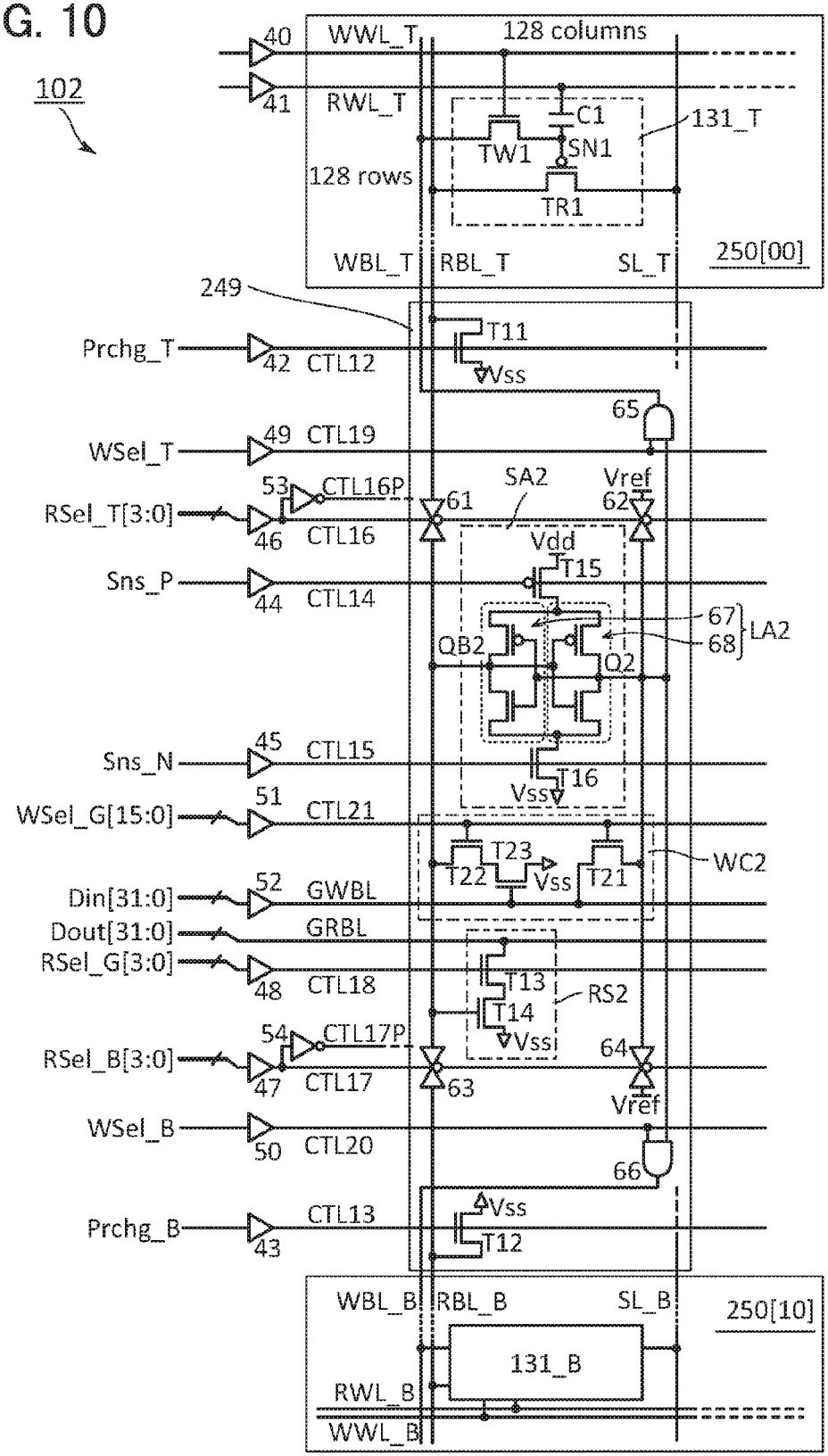
FIG. 10 is a circuit diagram showing a configuration example of a block and a column driver of a memory device.

FIG. 10 shows a circuit configuration example of the block 250 and the column driver 245. The circuit configuration shown in FIG. 2A is used as the block 250. It is needless to say that any of the other circuit configurations shown in FIGS. 2A to 2F can be used as the block 250. A signal is input from the write word line driver 243 to the wiring WWL through a buffer 40. A signal is input from the read word line driver 242 to the wiring RWL through a buffer 41.

Like the memory device 101, the memory device 102 is supplied with Vdd and Vss from the outside. Vdd and Vss are supplied to circuits in the memory device 102 through the Vdd line and the Vss line. In addition, a voltage Vref is input to the memory device 102 from the outside. The voltage Vref is a reference voltage and input to the column driver 245 through a Vref line.

FIG. 10 shows the column driver 245 that drives the blocks 250[00] and 250[10]. The column driver 245 that drives the blocks 250[01] and 250[11] has a similar circuit configuration. Note that in FIG. 10, a circuit element forming the source line driver 255 is not shown. Here, symbols "_T" and "_B" are used in the case where circuit elements of the blocks 250[00] and 250[10] need to be distinguished from each other. For example, a wiring RBL_T is a wiring RBL of the block 250[00], and a wiring RBL_B is a wiring RBL of the block 250[10].

Signals Prchg_T, Prchg_B, Sns_P, Sns_N, RSel_T[3:0], RSel_B[3:0], RSel_G[3:0], WSel_T, WSel_B, and WSel_G [15:0] are input to the column driver 245. These signals are internal signals of the memory device 102. Wirings such as a wiring CTL12 for transferring the internal signals are provided for the column driver 245.

In the column driver 245, a circuit 249 is provided for each column. The circuit 249 includes a sense amplifier SA2, transistors T11 to T14, transistors T21 to T23, TGs 61 to 64, and ANDs 65 and 66.

<Precharge Circuit 251>

The transistors T11 and T12 are provided in the precharge circuit 251. The signals Prchg_T and Prchg_B are control signals for the precharge circuit 211 and signals for controlling on/off of the transistors T11 and T12. The signal Prchg_T is input to the CTL12 through a buffer 42, and the signal Prchg_B is input to a wiring CTL13 through a buffer 43.

A gate, a source, and a drain of the transistor T11 are connected to the CTL12 and the RBL_T. A gate, a source, and a drain of the transistor T12 are connected to the Vss line, the wiring CTL13, and the wiring RBL_B. When the transistor T11 is turned on, the wiring RBL_T is precharged to Vss ("L"). When the transistor T12 is turned on, the wiring RBL_B is precharged to Vss ("L").

<Sense Amplifier 252>

The signals Sns_P and Sns_N are control signals for the sense amplifier 252. The signal Sns_P is input to a wiring CTL14 through a buffer 44, and the signal Sns_N is input to a wiring CTL15 through a buffer 45. The sense amplifier SA2 is provided in the sense amplifier 252. The sense amplifier SA2 is a latch amplifier and serves as both the AMP 126 and the latch circuit 127 shown in FIGS. 3A and 3B. The sense amplifier SA2 includes transistors T15 and T16 and INVs 67 and 68.

An input node of the INV 67 is connected to an output node of the INV 68 and an input node of the INV 68 is connected to an output node of the INV 67 to form a latch circuit LA2 (hereinafter referred to as latch LA2). Nodes Q2 and QB2 are a pair of nodes for retaining complementary data. The nodes Q2 and QB2 also serve as input and output nodes of the sense amplifier SA2. The input node of the INV 67 and the output node of the INV 68 are electrically connected to the node Q2. The output node of the INV 67 and the input node of the INV 68 are electrically connected to the node QB2.

The transistors T15 and T16 serve as sleep transistors. The connection between the latch LA2 and the Vdd line is controlled by the transistor T15. The connection between the latch LA2 and the Vss line is controlled by the transistor T16. A gate of the transistor T15 is electrically connected to the wiring CTL14. A gate of the transistor T16 is electrically connected to the wiring CTL15. The logic of the signal Sns_P and the signal Sns_N changes complementarily. Therefore, when the transistor T16 is turned on, the transistor T15 is also turned on, and when the transistor T16 is turned off, the transistor T15 is also turned off.

<Output MUX 254>

The output MUX 254 is configured to select, from two blocks 250, one block 250 from which data is to be read, select the wiring RBL from which data is to be read, and output the data read from the block 250. In the memory device 102, one wiring GRBL is provided for four wirings RBL.

The TGs 61 to 64 and the transistors T13 and T14 are provided in the output MUX 254. The signals RSel_T[3:0], RSel_B[3:0], and RSel_G[3:0] are control signals for the output MUX 254. The signals RSel_T[3:0] and RSel_B[3:0] are selection signals for selecting the block 250 and the wiring RBL from which data is to be read. The signals RSel_G[3:0] are signals for controlling data output.

For the signals RSel_T[3:0], four buffers 46, four INVs 53, four wirings CTL16, and four wirings CTL16P are provided. The TG 61 controls the connection between the node QB2 and the wiring RBL_T. The TG 62 controls the connection between the node Q2 and the Vref line. The TG 61 has an n-channel transistor whose gate is electrically connected to the wiring CTL16 and a p-channel transistor whose gate is electrically connected to the CTL16P. The same applies to the TG 62.

For the signals RSel_B[3:0], four buffers 47, four INVs 54, four wirings CTL17, and four wirings CTL17P are provided. The TG 63 controls the connection between the node QB2 and the wiring RBL_B. The TG 64 controls the connection between the node Q2 and the Vref line. The TG 63 has an n-channel transistor whose gate is electrically connected to the wiring CTL17 and a p-channel transistor whose gate is electrically connected to the wiring CTL17P. The same applies to the TG 64.

For the signals RSel_G[3:0], four buffers 48 and four wirings CTL18 are provided. The transistors T13 and T14 are electrically connected to each other in series. The transistor T13 has a gate and a drain that are connected to the wirings CTL18 and GRBL, respectively. The transistor T14 has a gate and a source that are electrically connected to the node QB2 and the Vss line, respectively.

The transistor T13 and the transistor T14 form a switch RS2. In the example shown in FIG. 10, four switches RS2 are provided for one GRBL wiring and connected in parallel. The four switches RS2 form a MUX with four inputs and one output that is controlled by the RSel_G[3:0]. This MUX is configured to select one column from four columns and output data retained in the sense amplifier SA2 in the selected column to the wiring GRBL.

<Write Driver>

In the memory device 102, one wiring GWBL is provided for four wirings WBL. The wiring WBL connected to the wiring GWBL is selected by the write driver 253. The write driver 253 is configured to select, from two blocks 250, one block 250 to which data is to be written, select the wiring WBL to which data is to be written, and control the input of write data to the column driver 245, for example.

The transistors T21 to T23 and the ANDs 65 and 66 are provided in the write driver 253. The signals WSel_T, WSel_B, and WSel_G[15:0] are control signals for the write driver 253. The signals WSel_T and WSel_B are selection signals for selecting the block 250 to which data is to be written. The signals WSel_G[15:0] are selection signals for selecting the wiring WBL to which data is to be written.

The signal WSel_T is input to a wiring CTL19 through a buffer 49. One input node of the AND 65 is electrically connected to the CTL19, the other input node thereof is electrically connected to the node Q2, and an output node thereof is electrically connected to a wiring WBL_T. The AND 65 controls the connection between the node Q2 and the wiring WBL_T. The WSel_B is input to a wiring CTL20 through a buffer 50. One input node of the AND 66 is electrically connected to the wiring CTL20, the other input node thereof is electrically connected to the node Q2, and an output node thereof is electrically connected to a wiring WBL_B. The AND 66 controls the connection between the node QB2 and the wiring WBL_B.

For the signals WSel_G[15:0], 16 buffers 51 and 16 wirings CTL21 are provided. The data Din[31:0] is amplified by a buffer 52 and input to different wirings GWBL. The transistor T21 controls the connection between the node Q2 and the wiring GWBL and has a gate connected to the CTL21. The transistor T22 and the transistor T23 are connected in series between the Vss line and the node QB2. A gate of the transistor T22 is electrically connected to the wiring CTL21. A gate of the transistor T23 is electrically connected to the wiring GWBL. The transistors T21 to T23 form a write circuit WC2 (hereinafter referred to as circuit WC2). The circuit WC2 is configured to write data of the wiring GWBL to the sense amplifier SA2.

<<Operation Example of Memory Device 102>>

The control circuit 110 performs a logical operation on the signals CE, GW, and BW[3:0] to determine the operation mode of the memory device 102. Table 2 shows a truth table for setting the operation mode of the memory device 102. The truth table is the same as that of the memory device 101. The memory device 102 has a standby mode, a read mode, three write modes (a byte write mode, a half-word write mode, and a word write mode), and a refresh mode. The logic of the signals RSel_T[3:0], RSel_B[3:0], and WSel_G [15:0] is determined by the signals ADDR[13:2] and BW[3:0].

TABLE 2

| Mode | CE | GW | BW[0] | BW[1] | BW[2] | BW[3] |
|---|---|---|---|---|---|---|
| Standby | L | X | X | X | X | X |
| Read | H | L | L | L | L | L |
| Byte Write | H | H | H | L | L | L |
| Half-word Write | H | H | H | H | L | L |
| Word Write | H | H | H | H | H | H |
| Refresh | H | H | L | L | L | L |

Like in the memory device 101, a word is 32 bits in the memory device 102. The logic of the signals BW[3], BW[2], BW[1], and BW[0] determines writing of the data Din[31:24], Din[23:16], Din[15:8], and Din[7:0], respectively.

Note that in the memory devices 101 and 102, the operation modes are not limited to those shown in Tables 1 and 2. For example, a control signal for selecting a burst mode can be input from the outside to perform burst writing and burst reading.

<Read Mode>

Figure 11:
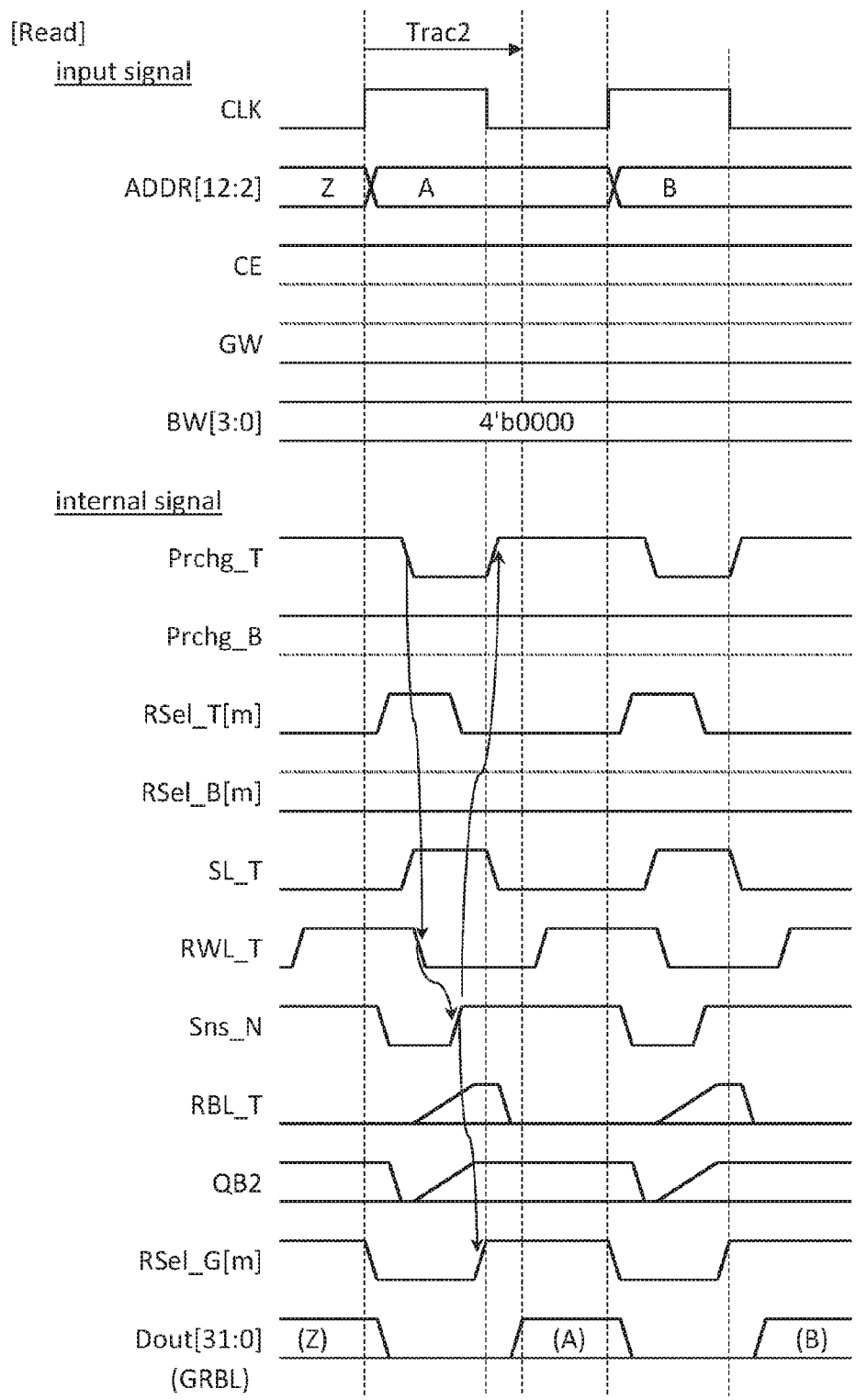
FIG. 11 is a timing chart showing an operation method example of a memory device in a read mode.

The operation of the read mode is described with reference to FIG. 11. FIG. 11 is a timing chart showing the operation of reading data from the block 250[00]. In the signals RSel_T[m], RSel_B[m], and GSel_B[m], "m" is an integer greater than or equal to 0 and less than or equal to 3.

A different address (Z, A, or B) is input in each clock cycle, and data (Z), (A), or (B) is read from a memory cell 131_T specified by the address. Trac2 is read access time. Here, the operation of the read mode is described focusing on the address A.

In the read mode, the signal CE is "1", the signal GW is "0", and the signals BW[3:0] are "0000" (Table 2). The signal Prchg_B is maintained at "H" and the signal RSel_B is maintained at "L" because the block 250[10] is not accessed. By the precharge circuit 251, the wiring RBL_B and the sense amplifier SA2 are electrically disconnected from each other and the wiring RBL_B is precharged to "L" in each column. Wirings RWL_B in each row in the block 250[01] are maintained at "H" because each row is in a non-selected state.

In a standby state before the input of the address A, the signal Sns_N is at "L". Therefore, the supply of Vdd and Vss to the sense amplifier SA2 is stopped in each column. In addition, the signal Prchg_T is at "H" and the signal RSel_T is at "L", and thus, the wiring RBL_T in each column is precharged to "L" by the transistor T11. Furthermore, each memory cell 131_T in the block 250[00] is in a non-selected state, and thus, the wiring RWL_T in each row is maintained at "H".

After the address A is input, the signals RSel_T[3:0] are set in an active state. The signal Sns_N is maintained at "L". In each of the 32 read target columns, the node QB2 is connected to the wiring RBL_T by the TG 61 and the node Q2 is connected to the Vref line by the TG 62. In each of the read target columns, the node QB2 is set to "L", and the node Q2 is supplied with Vref. That is, pseudo equalization is performed on the pair of retention nodes (Q2 and QB2) in the sense amplifier SA2.

Next, the signal Pchrg_T is set to "L", so that the precharge is completed. The memory cells 131_T in the read target row are selected in conjunction with the completion of the precharge. To achieve this, wirings SL_T in each column are set to "H", and then, the wiring RWL_T in the target row is set to "L". Since the wiring RWL_T and the node SN1 are capacitively coupled to each other by the capacitor C1, the voltage of the node SN1 is lowered by setting the wiring RWL_T to "L". In the case where the node SN1 retains data "H", the transistor TR1 remains off, so that the wiring RBL_T is maintained at "L". In the case where the node SN1 retains data "L", the transistor TR1 is turned on, so that the voltage of the wiring RBL_T is increased. In each of the read target columns, the voltage of the node QB2 is changed in accordance with the voltage of the wiring RBL. That is, data whose logic is inverted from that of the node SN1 is output to the node QB2.

Then, the signal Sns_N is set to "H" to set the sense amplifier SA2 in an active state. The signals RSel_T[3:0] are set to "L" to electrically disconnect the node QB2 from the wiring RBL_T. The sense amplifier SA2 amplifies data written to the node QB2 and retains the amplified data. The node Q2 of the sense amplifier SA2 retains data whose logic is the same as that of the node SN1.

Then, the signals RSel_G[3:0] are set in an active state. In each of the 32 read target columns, the transistor T13 is turned on. When the node QB2 is at "H", the wiring GRBL is at "L". When the node QB2 is at "L", the wiring GRBL is at "H". That is, data whose logic is the same as that of data read from the node SN1 is written to the wiring GRBL. Thus, the data (A) is read from the 32 wirings GRBL. The signals RSel_G[3:0] are in an active state for a certain period (here, 0.5 clock cycles). By setting the signals RSel_G[3:0] in a non-active state, the read operation is completed.

Note that the precharge of the wiring RBL_T can be started as soon as data reading from the memory cell 131 is completed. In the example shown in FIG. 11, after the signals RSel_T[3:0] are set to "L" to electrically disconnect the sense amplifier SA1 from the wiring RBL_T, the signal Prchg_T is set to "H" to start the precharge of the wiring RBL_T. Furthermore, the memory cell 131 in the target row is set in a non-selected state in conjunction with the start of the precharge. The wiring SL_T is set to "L" in conjunction with setting the signal Prchg_T to "H", and then, the wiring RWL_T is set to "H".

<Write Mode>

Figure 12:
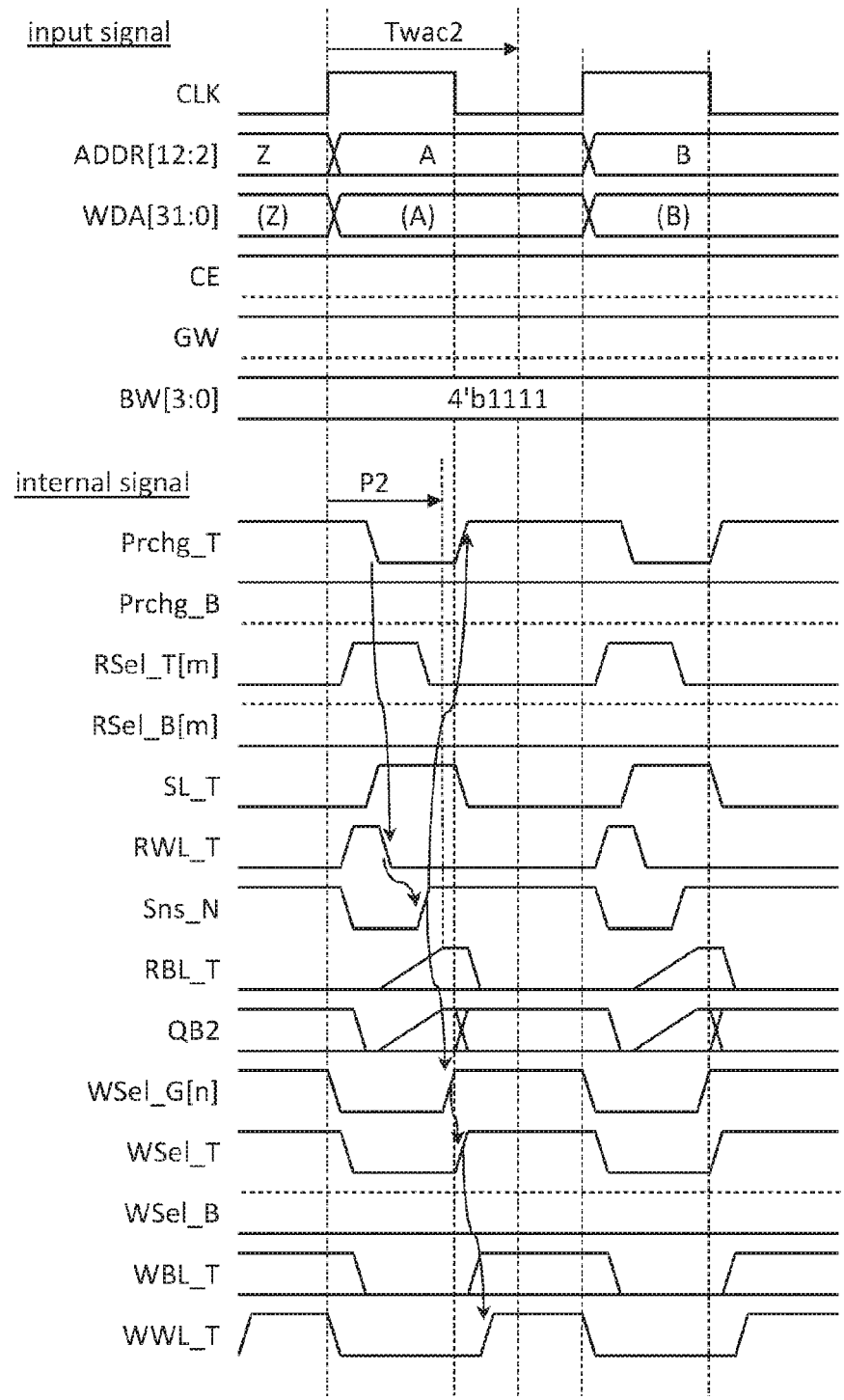
FIG. 12 is a timing chart showing an operation method example of a memory device in a write mode.

An operation example of the memory device 102 in the write mode is described with reference to FIG. 12. Like FIG. 7, FIG. 12 is a timing chart of the word write mode. The signal CE is "1", the signal GW is "0", and the signals BW[3:0] are "1111". Note that "n" in the signal WSel_G[n] is an integer greater than or equal to 0 and less than or equal to 15. Here, the write operation of the memory device 102 is described focusing on the address A.

First, in a period P2, data of all of memory cells 131_T in the write target row is read to the node QB2. This operation is similar to the operation in the read mode shown in FIG. 11. In each column, the sense amplifier SA2 retains the data read from the memory cell 131_T.

After the signal Sns_N is set to "H", the signal Prchg_T is set to "H" to start precharge of the wiring RBL_T. The wiring SL_T is set to "L" in conjunction with the start of the precharge.

After the signal Sns_N is set to "H", the signals WSel_G [15:0] are set in an active state. In each of the 32 target columns, data (any of one bit in the Din[31:0]) of the wiring GWBL is written to the node Q2 of the sense amplifier SA2 by the circuit WC2. In the sense amplifiers SA2 in the other columns, data read in the period P2 is retained.

Note that in the half-word write mode, one bit of any of the data Din[15:0] is written to each of nodes Q2 in 16 target columns. In the byte write mode, one bit of any of the data Din[7:0] is written to each of nodes Q2 in 8 target columns.

Then, the signal WSel_T is set to "H". In each column, data whose logic is the same as that of the node Q2 is written to the wiring WBL_T by the AND 65. Note that in a period during which the signals WSel_T and WSel_B are "L", the wirings WBL_T and WBL_B are maintained at "L" by the ANDs 65 and 66. Next, the wiring WWL_T in the target row is set to "H", and data of the wiring WBL_T is written to the memory cell 131_T. The data Din[31:0] is written to the memory cells 131_T in the 32 target columns, and retained data is rewritten to the memory cells 131_T in the other columns.

The wiring WWL_T is set to "L" so that the memory cell 131 in the write target row is set in a non-selected state. The signals WSel_G[15:0] are set in a non-active state so that the wiring GWBL and the sense amplifier SA2 are electrically disconnected from each other. Then, the signal WSel_T is set to "L", the signal Sns_N is set to "L", and the wiring RWL_T is set to "H". Thus, the write operation is completed.

As described above, the memory device 102 can write data in word units, half-word units, and byte units, but the unit of data writing is not limited thereto. The memory device 102 can write data in appropriate units smaller than the line size of the block 250, e.g., in N-byte units (N is an integer greater than or equal to 1 and less than or equal to 8) by appropriately setting the circuit configuration of the column driver 245, the address signal, the control signal, and the like.

Figure 13:
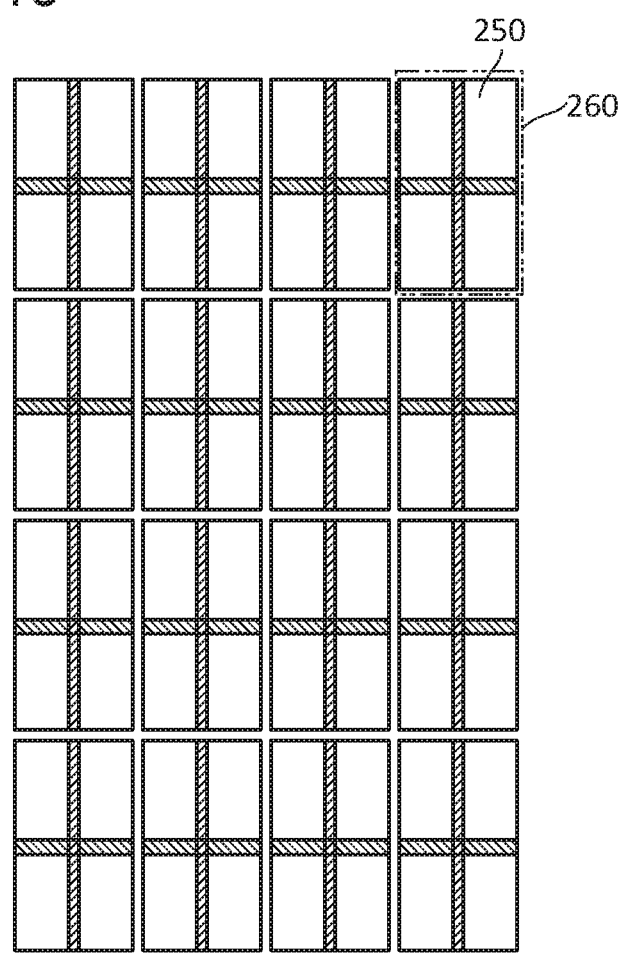
FIG. 13 is a block diagram showing an example of a layout of a sub array of a memory device.

The capacity of the memory device 102 is not limited to 8 KB. Since a word line divider is not required in the memory device 102, an increase in chip area and power consumption due to a word line divider does not occur; thus, the memory device 102 has a circuit configuration that is highly effective in increasing capacity. The capacity of the memory device 102 can be increased by arranging, in a matrix, a plurality of sub arrays 260 each formed of the four blocks 250 shown in FIG. 9A and a circuit group for driving the blocks, for example. FIG. 13 shows an example of a layout of the sub arrays 260. In the example shown in FIG. 13, the sub arrays 260 are arranged in 4 rows and 4 columns; therefore, the capacity of the memory device 102 is 128 KB. The address signals are the signals ADDR[16:2], and the sub array 260 is selected using the signals ADDR[16:13].

Embodiment 2

In this embodiment, application examples of the memory device are described. When an OS transistor is used as the write transistor of the memory cell in the memory device 100 in Embodiment 1, the memory device 100 can serve as a nonvolatile memory device. Therefore, the memory device 100 can be applied to, for example, electronic devices (e.g., information terminals, smartphones, e-book readers, digital cameras (including video cameras), video recording/reproducing devices, and navigation systems). Alternatively, the memory device 100 is applied to removable memory devices such as memory cards (e.g., SD cards), USB memories, and solid state drives (SSD). FIGS. 14A to 14E schematically illustrate some structural examples of removable storage devices. A packaged memory chip including the memory device 100 in Embodiment 1 is used in a variety of storage devices and removable memories, for example. The packaging of the memory chip is described in Embodiment 3.

FIG. 14A is a schematic diagram of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The memory device 100 is included.

FIG. 14B is a schematic external diagram of an SD card, and FIG. 14C is a schematic diagram illustrating the internal structure of the SD card. An SD card 1110 includes a housing 1111, a connector 1112, and a substrate 1113. The substrate 1113 is held in the housing 1111. The substrate 1113 includes circuits included in the memory device 100. For example, a memory chip 1114 and a controller chip 1115 are attached to the substrate 1113. When the memory chip 1114 is also provided on a back side of the substrate 1113, the capacity of the SD card 1110 can be increased. In addition, a wireless chip with a radio communication function may be provided on the substrate 1113. With such a wireless chip, the memory chip 1114 can read and write data by radio communication between the host device and the SD card 1110.

FIG. 14D is a schematic external diagram of an SSD, and FIG. 14E is a schematic diagram illustrating the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory of the controller chip 1156, and a DRAM chip may be used, for example. When the memory chip 1154 is also provided on a back side of the substrate 1153, the capacity of the SSD 1150 can be increased.

As examples of a semiconductor device, semiconductor devices including the memory device are described below. Electronic components, electronic devices, and the like each including the memory device are also described.

For example, a memory device is incorporated in a processing unit and retains data (including an instruction) necessary for the operation of the processing unit. Examples of the processing unit include a CPU, a graphics processing unit (GPU), a programmable logic device (PLD), a digital signal processor (DSP), a microcontroller unit (MCU), a custom LSI, and an RFIC.

<<CPU>>

Figure 15:
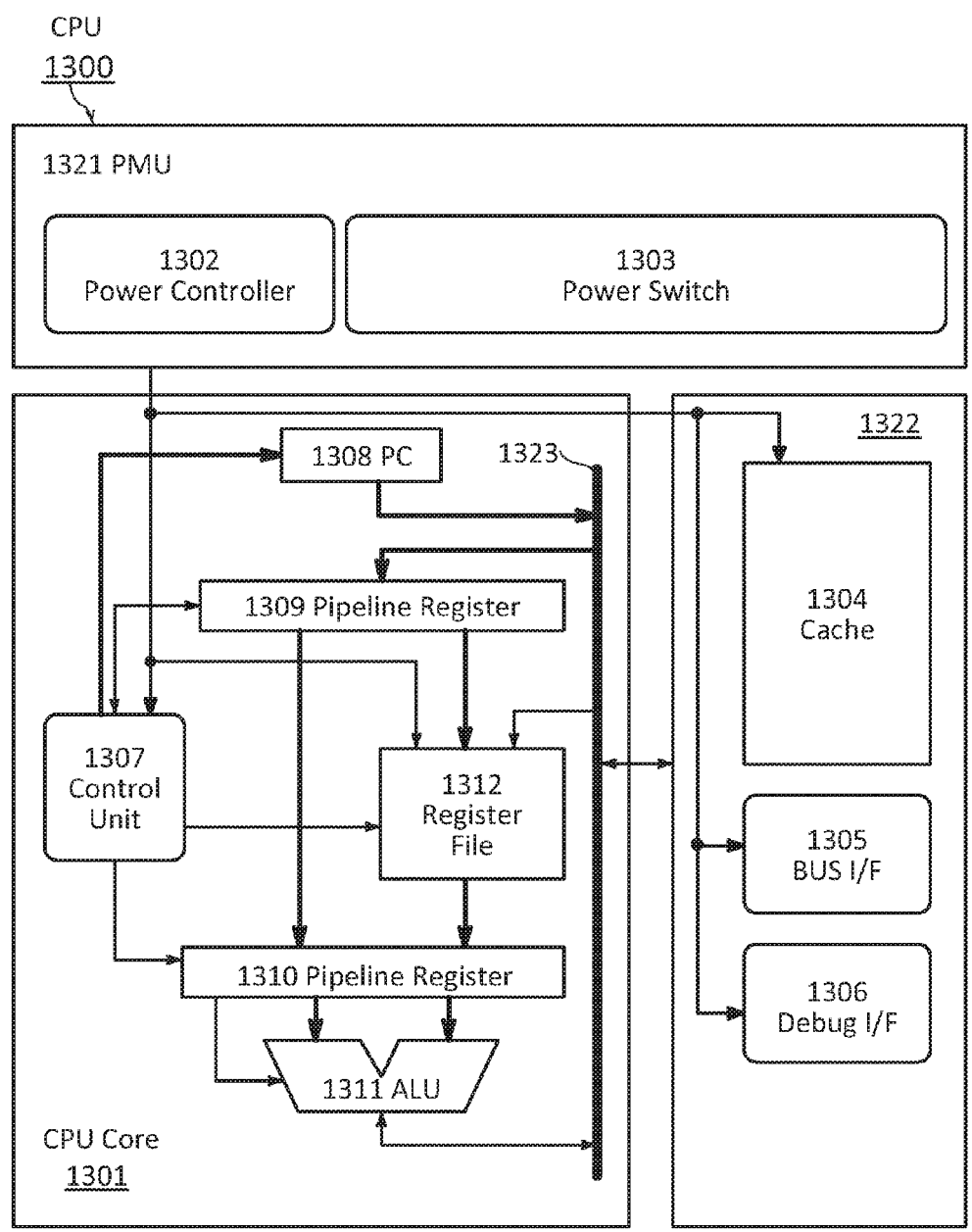
FIG. 15 is a block diagram showing a structural example of a processing unit (CPU).

FIG. 15 illustrates a CPU structure example. A CPU 1300 illustrated in FIG. 15 includes a CPU core 1301, a power management unit (PMU) 1321, and a peripheral circuit 1322. The PMU 1321 includes a power controller 1302 and a power switch 1303. The peripheral circuit 1322 includes a cache 1304 including cache memory, a bus interface (BUS I/F) 1305, and a debug interface (Debug I/F) 1306. The CPU core 1301 includes a data bus 1323, a control unit 1307, a program counter (PC) 1308, a pipeline register 1309, a pipeline register 1310, an arithmetic logic unit (ALU) 1311, and a register file 1312. Data is transmitted between the CPU core 1301 and the peripheral circuit 1322 via the data bus 1323.

Since the memory device 100 can retain data for a long time even without power supply, it can be provided in a power domain on which power gating is performed. The memory device 100 can be used in the cache 1304, which allows the reliability of the cache 1304 to be improved without an increase in the circuit scale and an error bit in the cache 1304 to be prevented from occurring without disturbing the operation of the CPU 1300. The power consumption of the CPU 1300 can be reduced.

The control unit 1307 has functions of decoding and executing instructions contained in a program such as inputted applications by controlling the overall operations of the PC 1308, the pipeline registers 1309 and 1310, the ALU 1311, the register file 1312, the cache 1304, the bus interface 1305, the debug interface 1306, and the power controller 1302.

The ALU 1311 has a function of performing a variety of arithmetic operations such as four arithmetic operations and logic operations. The cache 1304 has a function of temporarily storing frequently used data. The PC 1308 is a register having a function of storing an address of an instruction to be executed next. Although not illustrated in FIG. 15, the cache 1304 includes a cache controller for controlling the operation of the cache memory.

The pipeline register 1309 has a function of temporarily storing instruction data. The register file 1312 includes a plurality of registers including a general purpose register and can store data that is read from the main memory, data obtained as a result of arithmetic operations in the ALU 1311, or the like. The pipeline register 1310 has a function of temporarily storing data used for arithmetic operations performed in the ALU 1311, data obtained as a result of arithmetic operations in the ALU 1311, or the like.

The bus interface 1305 functions as a path for data between the CPU 1300 and devices outside the CPU 1300. The debug interface 1306 functions as a path of a signal for inputting an instruction to control debugging to the CPU 1300.

The power switch 1303 has a function of controlling supply of the power supply voltage to circuits other than the power controller 1302 in the CPU 1300. These circuits belong to several different power domains. The power switch 1303 controls whether the power supply voltage is supplied to circuits in the same power domain. The power controller 1302 has a function of controlling the operation of the power switch 1303. With such a structure, the CPU 1300 can perform power gating. An example of the flow of the power gating operation is described.

First, the CPU core 1301 sets the timing for stopping the supply of the power supply voltage in a register of the power controller 1302. Next, an instruction to start power gating is sent from the CPU core 1301 to the power controller 1302. Then, the registers and the cache 1304 in the CPU 1300 start data storing. Subsequently, the power switch 1303 stops the supply of the power supply voltage to the circuits other than the power controller 1302 in the CPU 1300. Then, an interrupt signal is input to the power controller 1302, thereby starting the supply of the power supply voltage to the circuits included in the CPU 1300. Note that a counter may be provided in the power controller 1302 to be used to determine the timing of starting the supply of the power supply voltage regardless of input of an interrupt signal. Next, the registers and the cache 1304 start data restoration. After that, execution of an instruction is resumed in the control unit 1307.

This power gating can be performed in the entire processor or one or more logic circuits included in the processor. The supply of power can be stopped even for a short time. Accordingly, power consumption can be reduced at a fine granularity in space or time.

<<RFIC>>

An RFIC is described as an example of a processing unit. The RFIC is referred to as an RFID, a wireless chip, a wireless ID chip, and the like. The RFIC includes a memory circuit, stores necessary data in the memory circuit, and transmits and receives data to/from the outside by using contactless means, for example, wireless communication. With these features, the RFIC can be used for an individual authentication system in which an object or the like is recognized by reading the individual information, for example.

Figure 16:
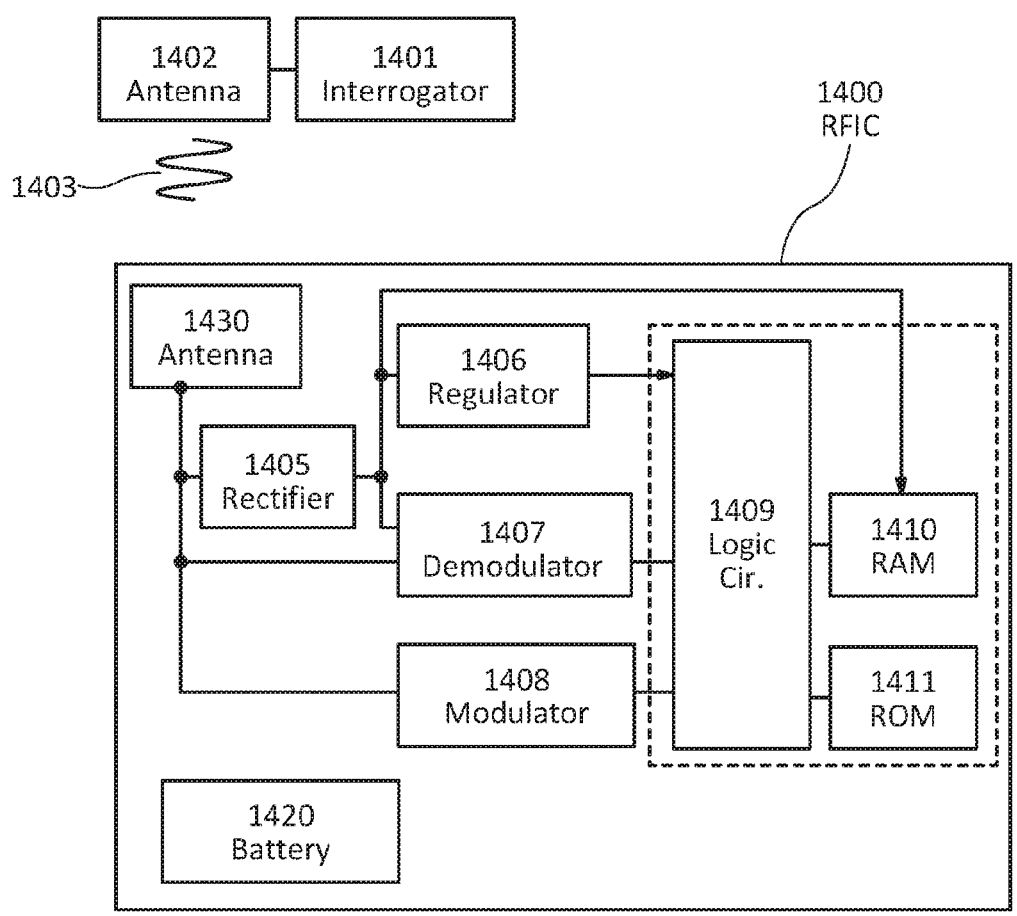
FIG. 16 is a block diagram showing a structural example of a processing unit (RFIC).

FIG. 16 is a block diagram illustrating an example of an RFIC. An RFIC 1400 illustrated in FIG. 20 includes an antenna 1430, a rectifier circuit 1405, a constant voltage circuit 1406, a demodulation circuit 1407, a modulation circuit 1408, a logic circuit 1409, a RAM 1410, a read-only memory (ROM) 1411, and a battery 1420. Note that decision whether each of these circuits is provided or not can be made as appropriate as needed. Here, although the RFIC 1400 is of an active type, it may be of a passive type without the battery 1420.

The memory device 100 can be used in the RAM 1410. The memory device 100 has a device structure capable of employing a combined memory. Therefore, in the RFIC 1400, circuits other than the antenna 1430 can be incorporated in one IC chip without complicating the manufacturing process. The antenna 1430 whose performance corresponds to the communication zone is mounted on the IC chip. Note that as data transmission methods, the following methods can be given: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RFIC 1400 described in this embodiment.

The antenna 1430 exchanges a radio signal 1403 with an antenna 1402 which is connected to a communication device 1401. The rectifier circuit 1405 generates an input voltage by rectification, for example, half-wave voltage doubler rectification of an input alternating signal generated by reception of a radio signal at the antenna 1430 and smoothing of the rectified signal with a capacitor provided in a later stage in the rectifier circuit 1405. Note that a limiter circuit may be provided on the input side or the output side of the rectifier circuit 1405. The limiter circuit controls electric power so that electric power which is higher than or equal to a certain level of electric power is not input to a circuit in a later stage if the amplitude of the input alternating signal is high and an internal generation voltage is high.

The constant voltage circuit 1406 generates a stable power supply voltage from an input voltage and supplies it to each circuit. Note that the constant voltage circuit 1406 may include a reset signal generation circuit. The reset signal generation circuit is a circuit which generates a reset signal of the logic circuit 1409 by utilizing the rise of the stable power supply voltage.

The demodulation circuit 1407 demodulates the input alternating signal by envelope detection and generates the demodulated signal. Furthermore, the modulation circuit 1408 performs modulation in accordance with data to be output from the antenna 1430.

The logic circuit 1409 decodes and processes the demodulated signal. The RAM 1410 holds the input data and includes a row decoder, a column decoder, a driver, a memory region, and the like. Furthermore, the ROM 1411 stores an identification number (ID) or the like and outputs it in accordance with processing.

<<Structure Example of Wireless Sensor>>

Figure 17:
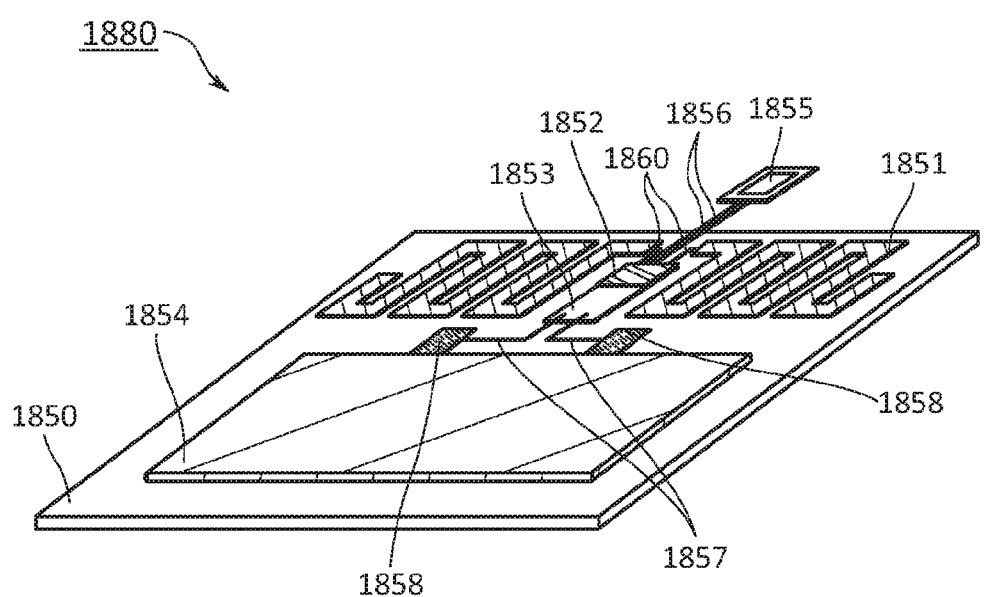
FIG. 17 is an external view showing a structural example of a wireless sensor.

An RFIC and a sensor device may be combined to form a wireless sensor. FIG. 17 is an external view illustrating a structural example of a wireless sensor. A wireless sensor 1880 includes a support 1850, an antenna 1851, an integrated circuit 1852, a circuit board 1853, a sensor 1855, and a battery 1854.

The circuit board 1853 is provided with the integrated circuit 1852. The integrated circuit 1852 includes a circuit portion of the RFIC. The antenna 1851 is electrically connected to the integrated circuit 1852 through the wiring 1860. The sensor 1855 is connected to the integrated circuit 1852 through the wiring 1856. Furthermore, the sensor 1855 is formed either outside the support 1850 or over the support 1850. The sensor 1855 is a circuit having a function of outputting various kinds of data such as thermal data, mechanical data, and electromagnetic data, as analog data.

The battery 1854 includes a pair of terminal 1858 (a positive electrode terminal, a negative electrode terminal). The pair of terminals 1858 are electrically connected to the integrated circuit 1852 through a wiring 1857 and the circuit board 1853. The battery 1854 may be provided as appropriate in accordance with the operation power of the wireless sensor 1880.

The support 1850 can be formed using glass, quartz, plastic, metal, stainless steel foil, tungsten foil, a flexible substrate, an attachment film, a substrate film, paper including a fibrous material, or wood, for example. Examples of the flexible substrate are flexible synthetic resin substrates such as substrates of plastics typified by polyethylene terephthalate (PET), polyethylene naphthalate (PEN), and polyether sulfone (PES) and an acrylic substrate. Examples of the attachment film are attachment films formed using polypropylene, polyester, polyvinyl fluoride, polyvinyl chloride, and the like. Examples of the base film are base films formed using polyester, polyamide, polyimide, aramid, epoxy, an inorganic vapor deposition film, and paper.

The wireless sensor 1880 is preferably thin. In particular, the thickness of the wireless sensor 1880 including the thicknesses of the battery 1854 and the support 1850 is larger than or equal to 0.1 mm and smaller than or equal to 5 mm, preferably larger than or equal to 0.1 mm and smaller than or equal to 3 mm, further preferably larger than or equal to 0.1 mm and smaller than or equal to 1 mm. The wireless sensor 1880 having the above structure can be embedded in paper such as a poster or corrugated cardboard.

Furthermore, the wireless sensor 1880 is preferably flexible. In particular, the support 1850 and the battery 1854 are preferably able to be changed in their forms with a curvature radius of 30 mm or more, preferably 10 nm or more. The wireless sensor 1880 having the above structure can be worn on clothing or a human body.

In order to obtain the above structure, the battery 1854 is preferably thin and flexible. As an exterior body of the battery 1854, for example, a film having a three-layer structure of a first thin film, a second thin film, and a third thin film formed in this order may be used. Note that the third thin film has a function as the outer surface of the exterior body. Examples of a material for the first thin film include polyethylene, polypropylene, polycarbonate, ionomer, and polyamide. Examples of a material for the second thin film include a highly flexible thin metal film of aluminum, stainless steel, copper, nickel, or the like. Examples of a material for the third thin film include an insulating synthetic resin film of a polyamide-based resin, a polyester-based resin, or the like.

<<Manufacturing Method Example and Structure Example of Electronic Component>>

Figure 18A:
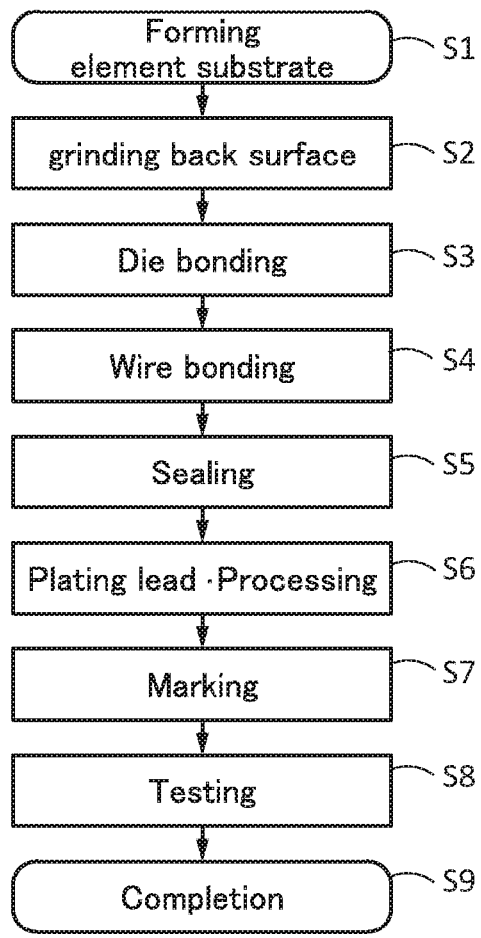
FIG. 18A is a flow chart showing an example of a method for manufacturing an electronic component.

Here, an electronic component and an electronic device or the like including a memory device or the electronic component will be described as examples of a semiconductor device. FIG. 18A is a flow chart showing an example of a method for manufacturing an electronic component. The electronic component is also referred to as a semiconductor package, an IC package, or a package. This electronic component has various standards and names corresponding to the direction and the shape of terminals. Therefore, an example of the electronic component will be described here.

A semiconductor device including a transistor is completed by integrating detachable components on a printed board through an assembly process (post-process). The post-process can be completed through the steps in FIG. 18A. Specifically, after an element substrate is completed in a pre-process (Step S1), a dicing step in which the substrate is divided into a plurality of chips is performed (Step S2). Before the substrate is divided into a plurality of pieces, the substrate is thinned to reduce warpage or the like of the substrate caused in the pre-process and to reduce the size of the component.

The chip is picked up, mounted on a lead frame, and bonded thereto in a die bonding step (Step S3). In the die bonding step, the chip may be bonded to the lead frame by an appropriate method depending on the product, for example, with a resin or a tape. As the bonding method, a method suitable for the product may be selected; for example, the chips and the lead frame may be bonded with a resin or tape. In the die bonding step, the chip may be mounted on an interposer and bonded thereto. In a wire bonding step, a lead of the lead frame and an electrode on the chip are electrically connected to each other with a metal wire (Step S4). As the metal wire, a silver wire or a gold wire can be used. The wire bonding may be either ball bonding or wedge bonding.

A molding step is performed to seal the wire-bonded chip with an epoxy resin or the like (Step S5). After being plated, the lead of the lead frame is cut and processed (Step S6). The plating process prevents rust of the lead and facilitates soldering at the time of mounting on a printed board in a later step. Printing (marking) is performed on the package surface (Step S7). After a testing step (Step S8), the electronic component is completed (Step S9). An electronic component including the semiconductor device described in the above embodiment can achieve low power consumption and a small size.

Figure 18B:
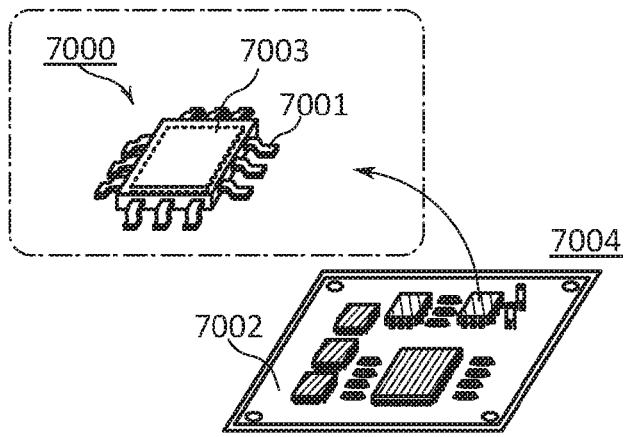
FIG. 18B is a schematic view showing a structural example of the electronic component.

FIG. 18B is a perspective schematic view of the completed electronic component. As an example, FIG. 18B illustrates a quad flat package (QFP). In FIG. 18B, an electronic component 7000 includes a lead 7001 and a circuit portion 7003. In the circuit portion 7003, for example, semiconductor devices such as the memory device of Embodiment 1 and the processing unit of this embodiment are provided. The electronic component 7000 is mounted on a printed board 7002, for example. A plurality of electronic components 7000 which are combined and electrically connected to each other over the printed board 7002 can be mounted on an electronic device. A completed circuit board 7004 is provided in an electronic device or the like. The electronic component 7000 can be used as, for example, a random access memory that stores data or a processing unit that executes various kinds of processing, such as a CPU, a microcontroller unit (MCU), an FPGA, or a wireless IC. When an electronic device includes the electronic component 7000, the power consumption of the electronic device can be reduced, or a size reduction of the electronic device can be easily achieved.

The electronic component 7000 can be used as an electronic component (IC chip) of electronic devices in a wide range of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Such an electronic device can be used for display devices, personal computers (PC), image reproducing devices provided with recording media (devices which reproduce the content of recording media such as DVDs, Blu-ray discs, flash memories, and HDDs and have display portions for displaying images). Examples of an electronic device that can use a semiconductor device of one embodiment of the present invention include cellular phones, game machines including portable game machines, portable data terminals, e-book readers, cameras (e.g., video cameras and digital still cameras), wearable display devices (e.g., head mounted display devices, goggle-type display devices, glasses-type display devices, armband-type display devices, bracelet-type display devices, and necklace-type display devices), navigation systems, audio reproducing devices (e.g., car audio systems and digital audio players), copiers, facsimiles, printers, multifunction printers, automated teller machines (ATM), and vending machines. FIGS. 19A to 19H illustrate specific examples of these electronic devices. FIGS. 19A to 19H illustrate examples of an electronic device which includes a display portion and is driven by a battery.

<<Electronic Device>>

Figure 19A:
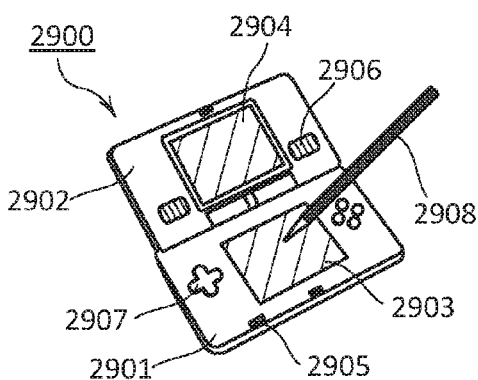
FIGS. 19A to 19H are schematic views each showing a structural example of an electronic device.

A portable game machine 2900 illustrated in FIG. 19A includes a housing 2901, a housing 2902, a display portion 2903, a display portion 2904, a microphone 2905, a speaker 2906, an operation key 2907, and the like. The display portion 2903 is provided with a touch screen as an input device, which can be handled with a stylus 2908 or the like.

Figure 19B:
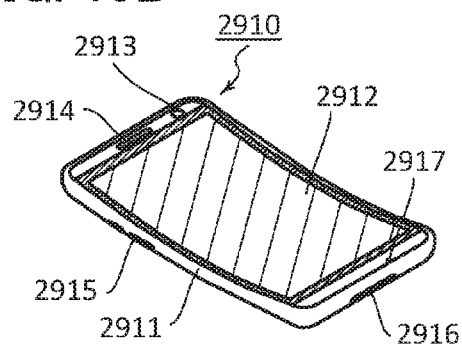

An information terminal 2910 illustrated in FIG. 19B includes a housing 2911, a display portion 2912, a microphone 2917, a speaker portion 2914, a camera 2913, an external connection portion 2916, an operation button 2915, and the like. A display panel that uses a flexible substrate and a touch screen are provided in the display portion 2912. The information terminal 2910 can be used as, for example, a smartphone, a mobile phone, a tablet information terminal, a tablet PC, or an e-book reader.

Figure 19C:
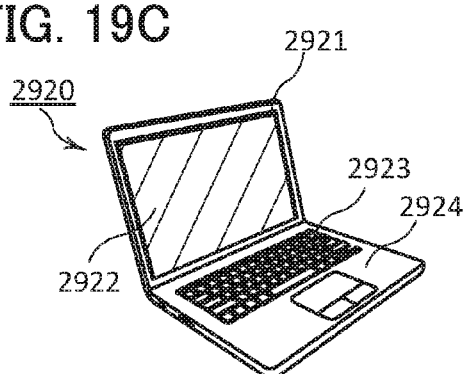

A notebook PC 2920 illustrated in FIG. 19C includes a housing 2921, a display portion 2922, a keyboard 2923, a pointing device 2924, and the like.

Figure 19D:
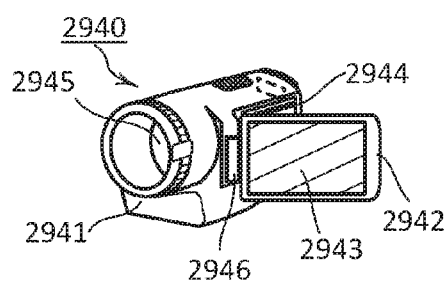

A video camera 2940 illustrated in FIG. 19D includes a housing 2941, a housing 2942, a display portion 2943, operation keys 2944, a lens 2945, a joint 2946, and the like. The operation keys 2944 and the lens 2945 are provided in the housing 2941, and the display portion 2943 is provided in the housing 2942. The housings 2941 and 2942 are connected to each other with the joint 2946, and the angle between the housings 2941 and 2942 can be changed with the joint 2946. The direction of an image on the display portion 2943 may be changed and display and non-display of an image may be switched depending on the angle between the housings 2941 and 2942.

Figure 19E:
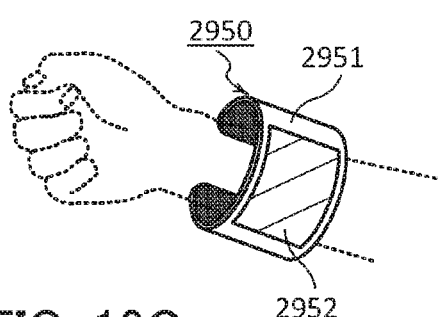

FIG. 19E illustrates an example of a bangle-type information terminal. An information terminal 2950 includes a housing 2951, a display portion 2952, and the like. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 19F:
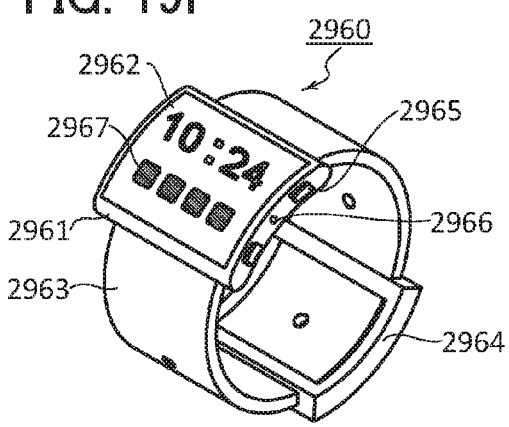

FIG. 19F illustrates an example of a watch-type information terminal. An information terminal 2960 includes a housing 2961, a display portion 2962, a band 2963, a buckle 2964, an operation button 2965, an input/output terminal 2966, and the like. The information terminal 2960 is capable of executing a variety of applications such as mobile phone calls, e-mailing, viewing and editing texts, music reproduction, Internet communication, and computer games.

The display surface of the display portion 2962 is bent, and images can be displayed on the bent display surface. Further, the display portion 2962 includes a touch sensor, and operation can be performed by touching the screen with a finger, a stylus, or the like. For example, by touching an icon 2967 displayed on the display portion 2962, an application can be started. With the operation button 2965, a variety of functions such as time setting, power ON/OFF, ON/OFF of wireless communication, setting and cancellation of silent mode, and setting and cancellation of power saving mode can be performed. For example, the functions of the operation button 2965 can be set by setting the operating system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. Power charging through the input/output terminal 2966 is possible. Note that the charging operation may be performed by wireless power feeding without using the input/output terminal 2966.

Figure 19G:
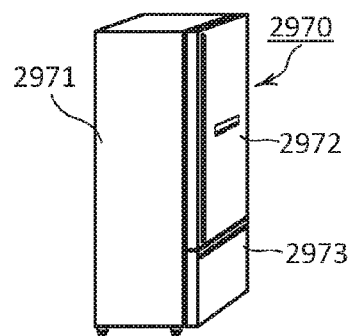

FIG. 19G illustrates an electric refrigerator as an example of a home electric appliance. An electric refrigerator 2970 includes a housing 2971, a refrigerator door 2972, a freezer door 2973, and the like.

Figure 19H:
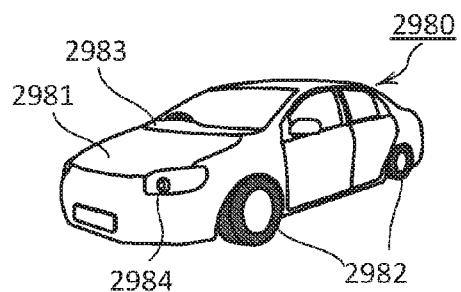

FIG. 19H is an external view illustrating a structure example of a motor vehicle. A motor vehicle 2980 includes a car body 2981, wheels 2982, a dashboard 2983, lights 2984, and the like.

An electronic component including the semiconductor device described in the above embodiment is provided in the electronic devices described in this embodiment. Thus, stable operation can be achieved.

Embodiment 3

In this embodiment, a device structure of an OS transistor and the like will be described.

<<Structure Example 1 of Transistor>>

FIG. 20A is a top view of a transistor 400a. FIG. 20B is a cross-sectional view taken along line A1-A2 in FIG. 20A, and FIG. 20C is a cross-sectional view taken along line A3-A4 in FIG. 20A. Note that the directions of the line A1-A2 and the line A3-A4 are sometimes referred to as a channel length direction of the transistor 400a and a channel width direction of the transistor 400a, respectively. Note that for simplification of the drawing, some components are not illustrated in FIG. 20A. The same applies to FIG. 21A and the like.

The transistor 400a includes a substrate 450, an insulating film 401 over the substrate 450, a conductive film 414 over the insulating film 401, an insulating film 402 covering the conductive film 414, an insulating film 403 over the insulating film 402, an insulating film 404 over the insulating film 403, a metal oxide 431 and a metal oxide 432 which are stacked in this order over the insulating film 404, a conductive film 421 in contact with top and side surfaces of the metal oxide 432, a conductive film 423 also in contact with the top and side surfaces of the metal oxide 432, a conductive film 422 over the conductive film 421, a conductive film 424 over the conductive film 423, an insulating film 405 over the conductive films 422 and 424, a metal oxide 433 in contact with the metal oxides 431 and 432, the conductive films 421 to 424, and the insulating film 405, an insulating film 406 over the metal oxide 433, a conductive film 411 over the insulating film 406, a conductive film 412 over the conductive film 411, a conductive film 413 over the conductive film 412, an insulating film 407 covering the conductive film 413, and an insulating film 408 over the insulating film 407. Note that the metal oxides 431 to 433 are collectively referred to as a metal oxide 430.

The metal oxide 432 is a semiconductor and functions as a channel of the transistor 400a. Furthermore, the metal oxides 431 and 432 include a region 441 and a region 442. The region 441 is formed in the vicinity of a region where the conductive film 421 is in contact with the metal oxides 431 and 432. The region 442 is formed in the vicinity of a region where the conductive film 423 is in contact with the metal oxides 431 and 432. The regions 441 and 442 function as low-resistance regions. The region 441 contributes to a decrease in the contact resistance between the conductive film 421 and the metal oxides 431 and 432. The region 442 also contributes to a decrease in the contact resistance between the conductive film 423 and the metal oxides 431 and 432.

The conductive films 421 and 422 function as one of source and drain electrodes of the transistor 400a. The conductive films 423 and 424 function as the other of the source and drain electrodes of the transistor 400a. The conductive film 422 is configured to allow less oxygen to pass therethrough than the conductive film 421. It is thus possible to prevent a decrease in the conductivity of the conductive film 421 due to oxidation. The conductive film 424 is also configured to allow less oxygen to pass therethrough than the conductive film 423. It is thus possible to prevent a decrease in the conductivity of the conductive film 423 due to oxidation.

The conductive films 411 to 413 function as a first gate electrode of the transistor 400a. The conductive films 411 and 413 are configured to allow less oxygen to pass therethrough than the conductive film 412. It is thus possible to prevent a decrease in the conductivity of the conductive film 412 due to oxidation. The insulating film 406 functions as a first gate insulating film of the transistor 400a. The conductive film 414 functions as a second gate electrode of the transistor 400a. The potential applied to the conductive films 411 to 413 may be the same as or different from that applied to the conductive film 414. The conductive film 414 may be omitted in some cases.

The insulating films 401 to 404 function as a base insulating film of the transistor 400a. The insulating films 402 to 404 also function as a second gate insulating film of the transistor 400a. The insulating films 405 to 408 function as a protective insulating film or an interlayer insulating film of the transistor 400a.

As illustrated in FIG. 20C, the side surface of the metal oxide 432 is surrounded by the conductive film 411. With this structure, the metal oxide 432 can be electrically surrounded by an electric field of the conductive film 411. Such a structure of a transistor in which a semiconductor is electrically surrounded by an electric field of a gate electrode is referred to as a surrounded channel (s-channel) structure. Therefore, a channel is formed in the entire metal oxide 432 (bulk). In the s-channel structure, a large amount of current can be flow between a source and a drain of a transistor, increasing the on-state current of the transistor. The s-channel structure, because of its high on-state current, is suitable for a semiconductor device such as large-scale integration (LSI) which requires a miniaturized transistor. A semiconductor device including the miniaturized transistor can have a high integration degree and a high density.

In the transistor 400a, a region functioning as a gate electrode is formed so as to fill an opening formed in the insulating film 405 and the like, that is, in a self-aligned manner.

As illustrated in FIG. 20B, the conductive films 411 and 422 have a region where they overlap with each other with the insulating film positioned therebetween. The conductive films 411 and 423 also have a region where they overlap with each other with the insulating film positioned therebetween. These regions function as the parasitic capacitance caused between the gate electrode and the source or drain electrode and might decrease the operation speed of the transistor 400a. This parasitic capacitance can be reduced by providing the insulating film 405 in the transistor 400a. The insulating film 405 preferably contains a material with a low relative dielectric constant.

Figure 21A:
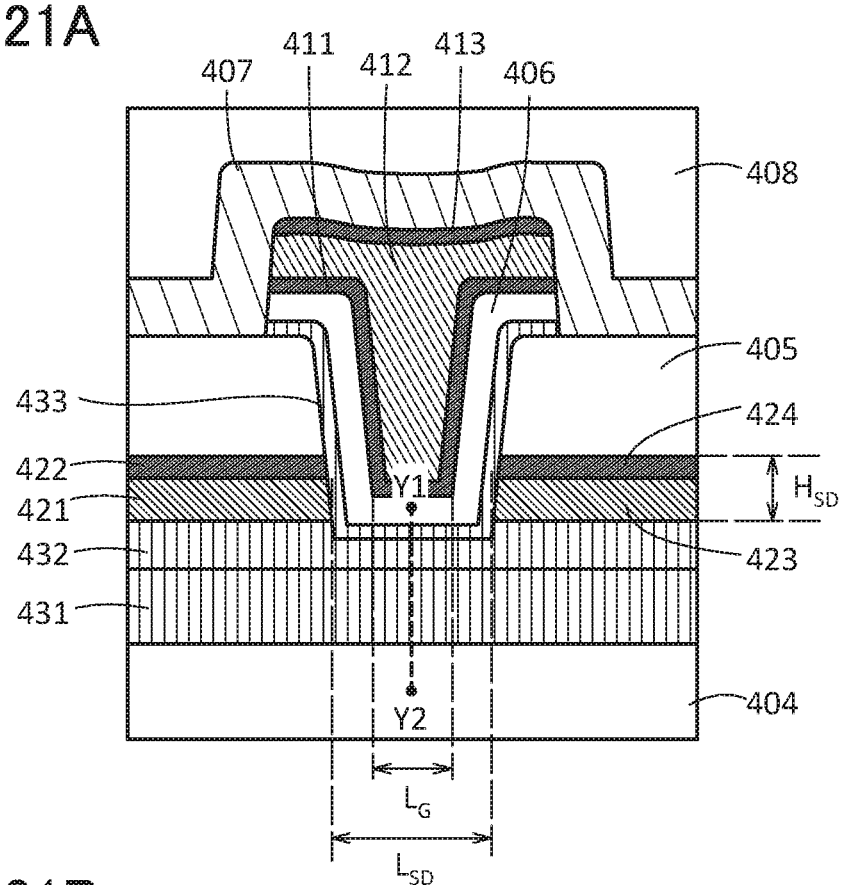
FIG. 21A is a partial enlarged view of FIG. 23A.

FIG. 21A is an enlarged view of the center of the transistor 400a. In FIG. 21A, a width $L_G$ denotes the length of the bottom surface of the conductive film 411, which faces and lies parallel to the top surface of the metal oxide 432 with the insulating film 406 and the metal oxide 433 positioned therebetween. The width $L_G$ is the line width of the gate electrode. In FIG. 21A, a width $L_{SD}$ denotes the length between the conductive films 421 and 423, i.e., the length between the source and drain electrodes.

The width $L_{SD}$ is generally determined by the minimum feature size. As illustrated in FIG. 21A, the width $L_G$ is narrower than the width $L_{SD}$. This means that in the transistor 400a, the line width of the gate electrode can be made narrower than the minimum feature size; specifically, the width $L_G$ can be greater than or equal to 5 nm and less than or equal to 60 nm, preferably greater than or equal to 5 nm and less than or equal to 30 nm.

In FIG. 21A, a height $H_{SD}$ denotes the total thickness of the conductive films 421 and 422, or the total thickness of the conductive films 423 and 424. The thickness of the insulating film 406 is preferably less than or equal to the height $H_{SD}$, in which case the electric field of the gate electrode can be applied to the entire channel formation region. The thickness of the insulating film 406 is less than or equal to 30 nm, preferably less than or equal to 10 nm.

The parasitic capacitance between the conductive films 422 and 411 and the parasitic capacitance between the conductive films 424 and 411 are inversely proportional to the thickness of the insulating film 405. For example, the thickness of the insulating film 405 is preferably three times or more, further preferably five times or more, the thickness of the insulating film 406, in which case the parasitic capacitance is negligibly small. As a result, the transistor 400a can operate at high frequencies. Components of the transistor 400a will be described below.

<Metal Oxide Layer>

The transistor 400a preferably has a low current (off-state current) flowing between a source and a drain in the non-conduction state. Examples of the transistor with a low off-state current include a transistor including an oxide semiconductor in a channel formation region.

The metal oxide 432 is an oxide semiconductor containing indium (In), for example. The metal oxide 432 can have high carrier mobility (electron mobility) by containing indium, for example. The metal oxide 432 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the metal oxide, for example. Furthermore, the metal oxide 432 preferably contains zinc (Zn). When containing zinc, the metal oxide is easily crystallized in some cases.

Note that the metal oxide 432 is not limited to the oxide semiconductor containing indium. The metal oxide 432 may be an oxide semiconductor that does not contain indium and contains at least one of zinc, gallium, and tin (e.g., a zinc tin oxide or a gallium tin oxide).

For the metal oxide 432, an oxide semiconductor with a wide energy gap is used, for example. The energy gap of the metal oxide 432 is, for example, greater than or equal to 2.5 eV and less than or equal to 4.2 eV, preferably greater than or equal to 2.8 eV and less than or equal to 3.8 eV and further preferably greater than or equal to 3 eV and less than or equal to 3.5 eV. A CAAC-OS film which is described later is preferably used for the metal oxide 432.

The metal oxides 431 and 433 include, for example, one or more or two or more elements other than oxygen included in the metal oxide 432. Since the metal oxides 431 and 433 include one or more or two or more elements other than oxygen included in the metal oxide 432, an interface state is less likely to be formed at an interface between the metal oxides 431 and 432 and an interface between the metal oxides 432 and 433.

In the case of using an In-M-Zn oxide as the metal oxide 431, when the total proportion of In and M is assumed to be 100 atomic %, the proportions of In and M are preferably set to be lower than 50 atomic % and higher than 50 atomic %, respectively, and further preferably lower than 25 atomic % and higher than 75 atomic %, respectively. When the metal oxide 431 is formed by a sputtering method, a sputtering target with the above composition is preferably used. For example, In:M:Zn is preferably 1:3:2 or 1:3:4.

In the case of using an In-M-Zn oxide as the metal oxide 432, when the total proportion of In and M is assumed to be 100 atomic %, the proportions of In and M are preferably set to be higher than 25 atomic % and lower than 75 atomic %, respectively, and further preferably higher than 34 atomic % and lower than 66 atomic %, respectively. When the metal oxide 432 is formed by a sputtering method, a sputtering target with the above composition is preferably used. For example, In:M:Zn is preferably 1:1:1, 1:1:1.2, 2:1:3, 3:1:2, or 4:2:4.1. In particular, when a sputtering target with an atomic ratio of In to Ga and Zn of 4:2:4.1 is used, the atomic ratio of In to Ga and Zn in the metal oxide 432 may be 4:2:3 or in the neighborhood of 4:2:3.

In the case of using an In-M-Zn oxide as the metal oxide 433, when the total proportion of In and M is assumed to be 100 atomic %, the proportions of In and M are preferably set to be lower than 50 atomic % and higher than 50 atomic %, respectively, and further preferably lower than 25 atomic % and higher than 75 atomic %, respectively. For example, In:M:Zn is preferably 1:3:2 or 1:3:4. The metal oxide 433 may be a metal oxide that is the same type as that of the metal oxide 431.

The metal oxide 431 or the metal oxide 433 does not necessarily contain indium in some cases. For example, the metal oxide 431 or the metal oxide 433 may be gallium oxide.

<Energy Band Structure>

Figure 21B:
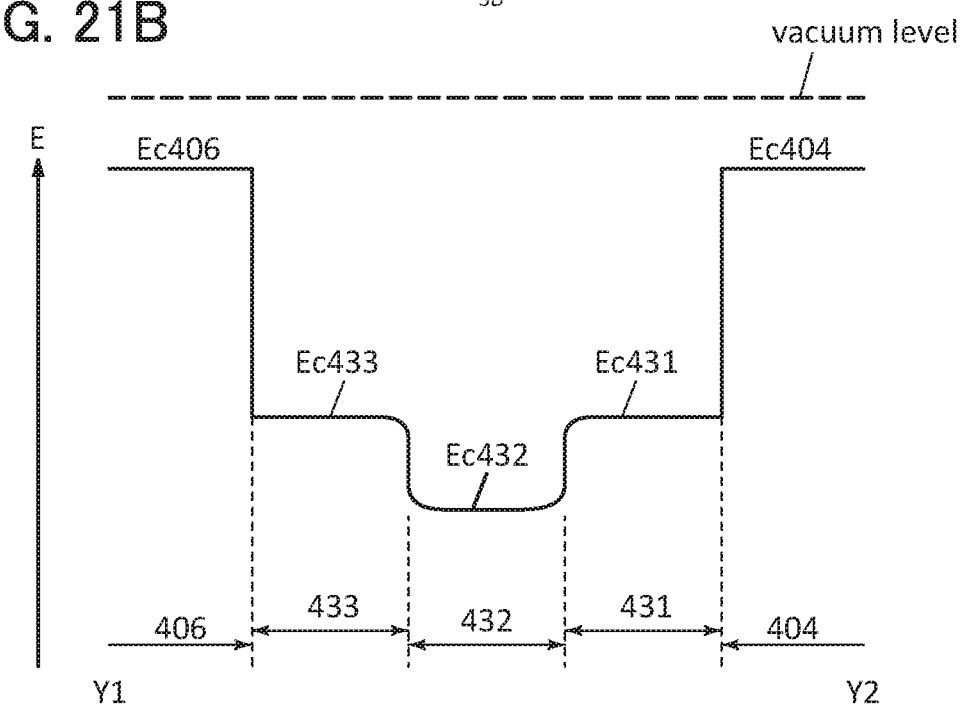
FIG. 21B is an energy band diagram of the transistor.

The function and effect of the metal oxide 430, which includes a stack of the metal oxides 431 to 433, are described with reference to an energy band diagram of FIG. 21B. FIG. 21B shows an energy band structure of a portion taken along line Y1-Y2 in FIG. 21A, that is, the energy band structure of a channel formation region of the transistor 400a and the vicinity thereof.

In FIG. 21B, Ec404, Ec431, Ec432, Ec433, and Ec406 indicate the energy at the bottom of the conduction band of the insulating film 404, the metal oxide 431, the metal oxide 432, the metal oxide 433, and the insulating film 406, respectively.

Here, a difference in energy between the vacuum level and the bottom of the conduction band (the difference is also referred to as an electron affinity) corresponds to a value obtained by subtracting an energy gap from a difference in energy between the vacuum level and the top of the valence band (the difference is also referred to as an ionization potential). Note that the energy gap can be measured using a spectroscopic ellipsometer. The energy difference between the vacuum level and the top of the valence band can be measured using an ultraviolet photoelectron spectroscopy (UPS) device.

Since the insulating films 404 and 406 are insulators, Ec406 and Ec404 are closer to the vacuum level (i.e., have a lower electron affinity) than Ec431, Ec432, and Ec433.

The metal oxide 432 is a metal oxide having a higher electron affinity than those of the metal oxides 431 and 433. For example, as the metal oxide 432, a metal oxide having an electron affinity higher than those of the metal oxides 431 and 433 by 0.07 eV or more and 1.3 eV or less, preferably 0.1 eV or more and 0.7 eV or less and further preferably 0.15 eV or more and 0.4 eV or less, is used. Note that the electron affinity is an energy gap between the vacuum level and the bottom of the conduction band.

Indium gallium oxide has a low electron affinity and a high oxygen-blocking property. Therefore, the metal oxide 433 preferably includes indium gallium oxide. The gallium atomic ratio [Ga/(In+Ga)] is, for example, higher than or equal to 70%, preferably higher than or equal to 80% and further preferably higher than or equal to 90%.

At this time, when gate voltage is applied, a channel is formed in the metal oxide 432 having the highest electron affinity among the metal oxides 431 to 433. At this time, electrons move mainly in the metal oxide 432, not in the metal oxides 431 and 433. Hence, the on-state current hardly varies even when the interface state density, which inhibits electron movement, is high at the interface between the metal oxide 431 and the insulating film 404 or at the interface between the metal oxide 433 and the insulating film 406. The metal oxides 431 and 433 function as an insulating film.

In some cases, there is a mixed region of the metal oxides 431 and 432 between the metal oxides 431 and 432. Furthermore, in some cases, there is a mixed region of the metal oxides 432 and 433 between the metal oxides 432 and 433. Because the mixed region has a low interface state density, a stack of the metal oxides 431 to 433 has a band structure where energy at each interface and in the vicinity of the interface is changed continuously (continuous junction).

As described above, the interface between the metal oxides 431 and 432 or the interface between the metal oxides 432 and 433 has a low interface state density. Hence, electron movement in the metal oxide 432 is less likely to be inhibited and the on-state current of the transistor can be increased.

Electron movement in the transistor is inhibited, for example, in the case where physical unevenness in a channel formation region is large. To increase the on-state current of the transistor, for example, root mean square (RMS) roughness with a measurement area of 1 μm×1 μm of a top surface or a bottom surface of the metal oxide 432 (a formation surface; here, the top surface of the metal oxide 431) is less than 1 nm, preferably less than 0.6 nm, further preferably less than 0.5 nm, and still further preferably less than 0.4 nm. The average surface roughness (Ra) with the measurement area of 1 μm×1 μm is less than 1 nm, preferably less than 0.6 nm, further preferably less than 0.5 nm, and still further preferably less than 0.4 nm. The maximum difference (P–V) with the measurement area of 1 μm×1 μm is less than 10 nm, preferably less than 9 nm, further preferably less than 8 nm, and still further preferably less than 7 nm. The RMS roughness, Ra, and P-V can be measured with, for example, a scanning probe microscope SPA-500 manufactured by SII Nano Technology Inc.

The electron movement is also inhibited in the case where the density of defect states is high in the channel formation region. For example, in the case where the metal oxide 432 contains oxygen vacancies ($V_O$), donor levels are formed by entry of hydrogen into sites of oxygen vacancies in some cases. A state in which hydrogen enters sites of oxygen vacancies is denoted by $V_{OH}$ in the following description in some cases. $V_{OH}$ is a factor of decreasing the on-state current of the transistor because $V_{OH}$ scatters electrons. Note that sites of oxygen vacancies become more stable by entry of oxygen than by entry of hydrogen. Thus, by decreasing oxygen vacancies in the metal oxide 432, the on-state current of the transistor can be increased in some cases.

For example, at a certain depth in the metal oxide 432 or in a certain region of the metal oxide 432, the concentration of hydrogen measured by secondary ion mass spectrometry (SIMS) is set to be higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, and still further preferably higher than or equal to $1\times10^{16}$ atoms/cm$^3$ and lower than or equal to $5\times10^{18}$ atoms/cm$^3$.

To decrease oxygen vacancies in the metal oxide 432, for example, there is a method in which excess oxygen contained in the insulating film 404 is moved to the metal oxide 432 through the metal oxide 431. In that case, the metal oxide 431 is preferably a layer having an oxygen-transmitting property (a layer through which oxygen is transmitted).

Note that in the case where the transistor has an s-channel structure, a channel is formed in the entire metal oxide 432. Therefore, as the metal oxide 432 has larger thickness, a channel region becomes larger. In other words, the thicker the metal oxide 432 is, the larger the on-state current of the transistor is.

Moreover, the thickness of the metal oxide 433 is preferably as small as possible to increase the on-state current of the transistor. For example, the metal oxide 433 has a region with a thickness of less than 10 nm, preferably less than or equal to 5 nm and further preferably less than or equal to 3 nm. Meanwhile, the metal oxide 433 has a function of blocking entry of elements other than oxygen (such as hydrogen and silicon) included in the adjacent insulator into the metal oxide 432 where a channel is formed. Thus, the metal oxide 433 preferably has a certain thickness. For example, the metal oxide 433 may have a region with a thickness of greater than or equal to 0.3 nm, preferably greater than or equal to 1 nm and further preferably greater than or equal to 2 nm. The metal oxide 433 preferably has an oxygen blocking property to inhibit outward diffusion of oxygen released from the insulating film 404 and the like.

To improve reliability, preferably, the thickness of the metal oxide 431 is large and the thickness of the metal oxide 433 is small. For example, the metal oxide 431 has a region with a thickness of greater than or equal to 10 nm, preferably greater than or equal to 20 nm, further preferably greater than or equal to 40 nm, and still further preferably greater than or equal to 60 nm. An increase in the thickness of the metal oxide 431 can increase the distance from the interface between the adjacent insulator and the metal oxide 431 to the metal oxide 432 where a channel is formed. Note that the metal oxide 431 has a region with a thickness of, for example, less than or equal to 200 nm, preferably less than or equal to 120 nm and further preferably less than or equal to 80 nm, otherwise the productivity of the semiconductor device might be decreased.

For example, a region where the concentration of silicon by SIMS is higher than or equal to $1\times10^{16}$ atoms/cm$^3$ and lower than $1\times10^{19}$ atoms/cm$^3$ is provided between the metal oxides 432 and 431. The concentration of silicon is preferably higher than or equal to $1\times10^{16}$ atoms/cm$^3$ and lower than $5\times10^{18}$ atoms/cm$^3$ and further preferably higher than or equal to $1\times10^{16}$ atoms/cm$^3$ and lower than $2\times10^{18}$ atoms/cm$^3$. A region where the concentration of silicon by SIMS is higher than or equal to $1\times10^{16}$ atoms/cm$^3$ and lower than $1\times10^{19}$ atoms/cm$^3$ is provided between the metal oxides 432 and 433. The concentration of silicon is preferably higher than or equal to $1\times10^{16}$ atoms/cm$^3$ and lower than $5\times10^{18}$ atoms/cm$^3$ and further preferably higher than or equal to $1\times10^{16}$ atoms/cm$^3$ and lower than $2\times10^{18}$ atoms/cm$^3$.

It is preferable to reduce the concentration of hydrogen in the metal oxides 431 and 433 in order to reduce the concentration of hydrogen in the metal oxide 432. The metal oxides 431 and 433 each have a region where the concentration of hydrogen by SIMS is higher than or equal to $1\times10^{16}$ atoms/cm$^3$ and lower than or equal to $2\times10^{20}$ atoms/cm$^3$. The concentration of hydrogen is preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, and still further preferably higher than or equal to $1\times10^{16}$ atoms/cm$^3$ and lower than or equal to $5\times10^{18}$ atoms/cm$^3$. It is also preferable to reduce the concentration of nitrogen in the metal oxides 431 and 433 in order to reduce the concentration of nitrogen in the metal oxide 432. The metal oxides 431 and 433 each have a region where the concentration of nitrogen by SIMS is higher than or equal to $1\times10^{16}$ atoms/cm$^3$ and lower than $5\times10^{19}$ atoms/cm$^3$. The concentration of nitrogen is preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $1\times10^{18}$ atoms/cm$^3$, and still further preferably higher than or equal to $1\times10^{16}$ atoms/cm$^3$ and lower than or equal to $5\times10^{17}$ atoms/cm$^3$.

The metal oxides 431 to 433 may be formed by a sputtering method, a chemical vapor deposition (CVD) method, a molecular beam epitaxy (MBE) method, a pulsed laser deposition (PLD) method, an atomic layer deposition (ALD) method, or the like.

After the metal oxides 431 and 432 are formed, first heat treatment is preferably performed. The first heat treatment can be performed at a temperature higher than or equal to 250° C. and lower than or equal to 650° C., preferably higher than or equal to 450° C. and lower than or equal to 600° C., and further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The crystallinity of the metal oxides 431 and 432 can be increased by the first heat treatment. Furthermore, impurities such as hydrogen and water can be removed by the first heat treatment.

The above three-layer structure is an example. For example, a two-layer structure without the metal oxide 431 or 433 may be employed. Alternatively, any one of the semiconductors given as examples of the metal oxides 431 to 433 may be provided over or below the metal oxide 431 or over or below the metal oxide 433, i.e., a four-layer structure may be employed. Further alternatively, an n-layer structure (n is an integer of 5 or more) in which any one of the semiconductors given as examples of the metal oxides 431 to 433 is provided at two or more of the following positions may be employed: over the metal oxide 431, below the metal oxide 431, over the metal oxide 433, and below the metal oxide 433.

<Substrate>

As the substrate 450, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. The semiconductor substrate may be a silicon on insulator (SOI) substrate in which an insulating region is provided in the above semiconductor substrate. Examples of the conductor substrate include a graphite substrate, a metal substrate, an alloy substrate, and a conductive resin substrate. A substrate including a metal nitride, a substrate including a metal oxide, or the like can also be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. Examples of the element provided over the substrate include a capacitor, a resistor, a switching element, a light-emitting element, and a memory element.

A flexible substrate may be used as the substrate 450. As a method for providing a transistor over a flexible substrate, there is a method in which a transistor is formed over a non-flexible substrate, and then the transistor is separated and transferred to the substrate 450 that is a flexible substrate. In that case, a separation layer is preferably provided between the non-flexible substrate and the transistor. As the substrate 450, a sheet, a film, or foil containing a fiber may be used. The substrate 450 may have elasticity. The substrate 450 may have a property of returning to its original shape when bending or pulling is stopped. Alternatively, the substrate 450 may have a property of not returning to its original shape. The thickness of the substrate 450 is, for example, greater than or equal to 5 μm and less than or equal to 700 μm, preferably greater than or equal to 10 μm and less than or equal to 500 μm and further preferably greater than or equal to 15 μm and less than or equal to 300 μm. When the substrate 450 has a small thickness, the weight of the semiconductor device can be reduced. When the substrate 450 has a small thickness, even in the case of using glass or the like, the substrate 450 may have elasticity or a property of returning to its original shape when bending or pulling is stopped. Therefore, an impact applied to the semiconductor device over the substrate 450, which is caused by dropping or the like, can be reduced. That is, a durable semiconductor device can be provided.

For the flexible substrate 450, metal, an alloy, a resin, glass, or fiber thereof can be used, for example. The flexible substrate 450 preferably has a lower coefficient of linear expansion because deformation due to an environment is suppressed. The flexible substrate 450 is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 450 because of its low coefficient of linear expansion.

<Base Insulating Film>

The insulating film 401 has a function of electrically isolating the substrate 450 from the conductive film 414. The insulating film 401 or 402 is formed using an insulating film having a single-layer structure or a stacked-layer structure. Examples of the material of an insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 402 may be formed using silicon oxide with high step coverage which is formed by reacting tetraethyl orthosilicate (TEOS), silane, or the like with oxygen, nitrous oxide, or the like. After the insulating film 402 is formed, the insulating film 402 may be subjected to planarization treatment using a CMP method or the like to improve the planarity of the top surface thereof.

The insulating film 404 preferably contains an oxide. In particular, the insulating film 404 preferably contains an oxide material from which part of oxygen is released by heating. The insulating film 404 preferably contains an oxide containing oxygen at a proportion higher than that in the stoichiometric composition. Part of oxygen is released by heating from an oxide film containing oxygen at a proportion higher than that in the stoichiometric composition. Oxygen released from the insulating film 404 is supplied to the metal oxide 430, so that oxygen vacancies in the metal oxide 430 can be reduced. Consequently, changes in the electrical characteristics of the transistor can be reduced and the reliability of the transistor can be improved.

The oxide film containing oxygen at a proportion higher than that in the stoichiometric composition is an oxide film of which the amount of released oxygen converted into oxygen atoms is greater than or equal to $1.0\times10^{18}$ atoms/cm$^3$, preferably greater than or equal to $3.0\times10^{20}$ atoms/cm$^3$, in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulating film 404 preferably contains an oxide that can supply oxygen to the metal oxide 430. For example, a material containing silicon oxide or silicon oxynitride is preferably used. Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulating film 404. To make the insulating film 404 contain excess oxygen, the insulating film 404 is formed in an oxygen atmosphere, for example. Alternatively, a region containing excess oxygen may be formed by introducing oxygen into the insulating film 404 that has been formed. Both the methods may be combined.

For example, oxygen (at least including any of oxygen radicals, oxygen atoms, and oxygen ions) may be introduced into the insulating film 404 that has been formed, so that a region containing excess oxygen is formed. Oxygen can be introduced by, for example, an ion implantation method, an ion doping method, a plasma immersion ion implantation method, plasma treatment, or the like. A gas containing oxygen can be used for oxygen introducing treatment. Examples of the gas containing oxygen include oxygen, nitrous oxide, nitrogen dioxide, carbon dioxide, and carbon monoxide. Furthermore, a rare gas may be included in the gas containing oxygen for the oxygen introducing treatment. Moreover, hydrogen or the like may be included. For example, a mixed gas of carbon dioxide, hydrogen, and argon may be used. After the insulating film 404 is formed, the insulating film 404 may be subjected to planarization treatment using a CMP method or the like to improve the planarity of the top surface thereof.

The insulating film 403 has a passivation function of preventing oxygen contained in the insulating film 404 from decreasing by bonding to metal contained in the conductive film 414. The insulating film 403 has a function of blocking oxygen, hydrogen, water, alkali metal, alkaline earth metal, and the like. Providing the insulating film 403 can prevent outward diffusion of oxygen from the metal oxide 430 and entry of hydrogen, water, or the like into the metal oxide 430 from the outside. The insulating film 403 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

The threshold voltage of the transistor 400a can be controlled by injecting electrons into a charge trap layer. The charge trap layer is preferably provided in the insulating film 402 or the insulating film 403. For example, when the insulating film 403 is formed using hafnium oxide, aluminum oxide, tantalum oxide, aluminum silicate, or the like, the insulating film 403 can function as a charge trap layer.

<Gate Electrode and Source and Drain Electrodes>

The conductive films 411 to 414 and 421 to 424 each preferably have a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The use of a Cu—Mn alloy is further preferable, in which case manganese oxide formed at the interface with an insulator containing oxygen has a function of preventing Cu diffusion.

The conductive films 421 to 424 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

<Low-Resistance Region>

The regions 441 and 442 are formed when, for example, the conductive films 421 and 423 extract oxygen from the metal oxides 431 and 432. Oxygen is more likely to be extracted at higher temperatures. Oxygen vacancies are formed in the regions 441 and 442 through several heating steps in the manufacturing process of the transistor. In addition, hydrogen enters sites of the oxygen vacancies by heating, increasing the carrier concentration in the regions 441 and 442. As a result, the resistance of the regions 441 and 442 is reduced.

<Gate Insulating Film>

The insulating film 406 preferably contains an insulator with a high relative dielectric constant. For example, the insulating film 406 preferably contains gallium oxide, hafnium oxide, an oxide containing aluminum and hafnium, oxynitride containing aluminum and hafnium, an oxide containing silicon and hafnium, or oxynitride containing silicon and hafnium.

The insulating film 406 preferably has a stacked-layer structure containing silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the stacked-layer structure to be thermally stable and have a high relative dielectric constant. For example, when aluminum oxide, gallium oxide, or hafnium oxide is closer to the metal oxide 433, entry of silicon from silicon oxide or silicon oxynitride into the metal oxide 432 can be suppressed.

When silicon oxide or silicon oxynitride is closer to the metal oxide 433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

<Interlayer Insulating Film and Protective Insulating Film>

The insulating film 405 preferably contains an insulator with a low relative dielectric constant. For example, the insulating film 405 preferably contains silicon oxide, silicon oxynitride, silicon nitride oxide, silicon nitride, or a resin. Alternatively, the insulating film 405 preferably has a stacked-layer structure containing silicon oxide or silicon oxynitride and a resin. Because silicon oxide and silicon oxynitride have thermal stability, combination of silicon oxide or silicon oxynitride with a resin allows the stacked-layer structure to be thermally stable and have a low relative dielectric constant. Examples of the resin include polyester, polyolefin, polyamide (e.g., nylon or aramid), polyimide, polycarbonate, and acrylic.

The insulating film 407 has a function of blocking oxygen, hydrogen, water, alkali metal, alkaline earth metal, and the like. Providing the insulating film 407 can prevent outward diffusion of oxygen from the metal oxide 430 and entry of hydrogen, water, or the like into the metal oxide 430 from the outside. The insulating film 407 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film. An aluminum oxide film is preferably used as the insulating film 407 because it is highly effective in preventing transmission of both oxygen and impurities such as hydrogen and moisture.

When the insulating film 407 is formed by a sputtering method, or a CVD method with a gas containing oxygen, for example, oxygen can be added to side and top surfaces of the insulating films 405 and 406. It is preferable to perform second heat treatment at any time after the formation of the insulating film 407. Through the second heat treatment, oxygen added to the insulating films 405 and 406 is diffused in the insulating films to reach the metal oxide 430, whereby oxygen vacancies in the metal oxide 430 can be reduced.

The insulating film 407 has a function of blocking oxygen and prevents oxygen from being diffused over the insulating film 407. The insulating film 403 also has a function of blocking oxygen and prevents oxygen from being diffused under the insulating film 403.

Note that the second heat treatment may be performed at a temperature that allows oxygen added to the insulating films 405 and 406 to be diffused to the metal oxide 430. For example, the description of the first heat treatment may be referred to for the second heat treatment. Alternatively, the temperature of the second heat treatment is preferably lower than that of the first heat treatment. The second heat treatment is preferably performed at a temperature lower than that of the first heat treatment by 20° C. or higher and 150° C. or lower, preferably 40° C. or higher and 100° C. or lower. Accordingly, superfluous release of oxygen from the insulating film 404 can be inhibited. Note that the second heat treatment is not necessarily performed when heating during formation of the films can work as heat treatment comparable to the second heat treatment. As described above, oxygen can be supplied to the metal oxide 430 from above and below through the formation of the insulating film 407 and the second heat treatment. Alternatively, oxygen can be added to the insulating films 405 and 406 by forming a film containing indium oxide, for example, an In-M-Zn oxide, as the insulating film 407.

The insulating film 408 can be formed using an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the insulating film 408, a resin which can be used for the insulating film 405, such as a polyimide resin, can be used. The insulating film 408 may be a stack including any of the above materials.

<<Structure Example 2 of Transistor>>

The conductive film 414 and the insulating films 402 and 403 can be omitted in the transistor 400a illustrated in FIGS. 20A to 20C. An example of such a structure is illustrated in FIGS. 22A to 22C. FIG. 22A is a top view of a transistor 400b. FIG. 22B is a cross-sectional view taken along line A1-A2 in FIG. 22A, and FIG. 22C is a cross-sectional view taken along line A3-A4 in FIG. 22A.

<<Structure Example 3 of Transistor>>

In the transistor 400a illustrated in FIGS. 20A to 20C, part of the conductive films 421 and 423 that overlap with the gate electrode (the conductive films 411 to 413) can be reduced in thickness. An example of such a structure is illustrated in FIGS. 23A to 23C. FIG. 23A is a top view of a transistor 400c. FIG. 23B is a cross-sectional view taken along line A1-A2 in FIG. 23A, and FIG. 23C is a cross-sectional view taken along line A3-A4 in FIG. 23A.

As illustrated in FIG. 23B, in the transistor 400c, part of the conductive film 421 that overlaps with the gate electrode is reduced in thickness, and the conductive film 422 covers the conductive film 421. Part of the conductive film 423 that overlaps with the gate electrode is also reduced in thickness, and the conductive film 424 covers the conductive film 423. With such a structure, a distance between the gate and source electrodes or between the gate and drain electrodes can be increased. This results in a reduction in the parasitic capacitance formed between the gate electrode and the source and drain electrodes. As a result, a transistor capable of high-speed operation can be obtained.

<<Structure Example 4 of Transistor>>

Figure 24A:
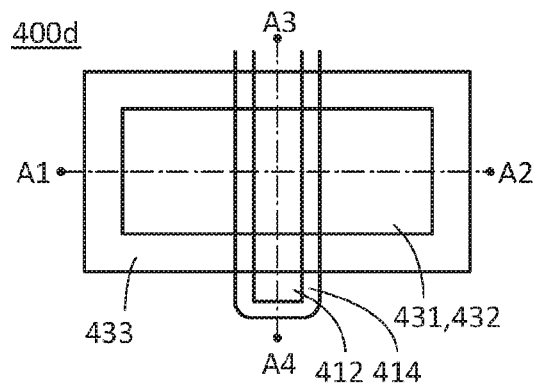
FIG. 24A is a top view showing a structural example of a transistor.
Figures 24B, 24C:
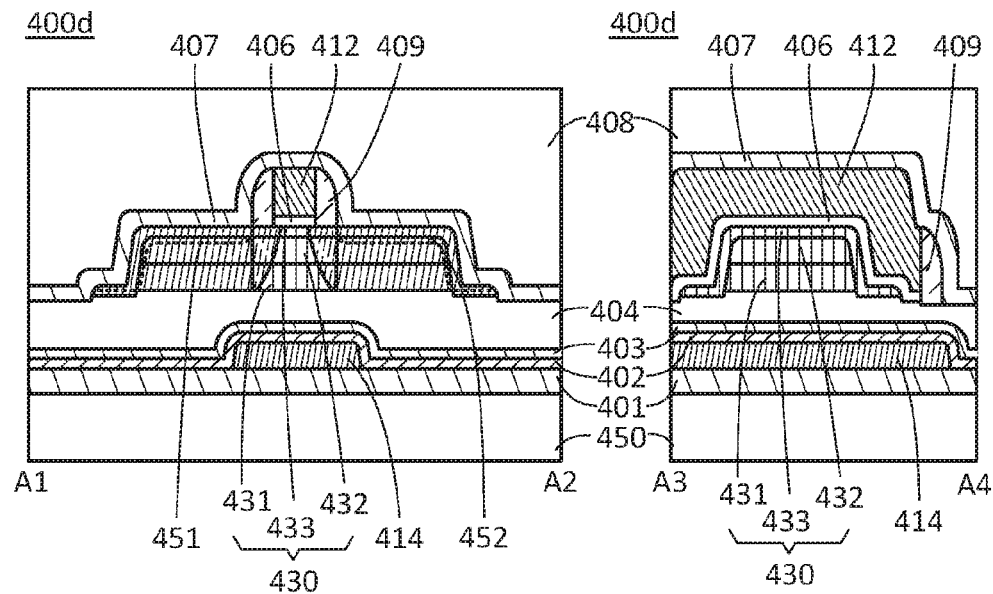
FIGS. 24B to 24D are cross-sectional views showing structural examples of the transistor.

FIG. 24A is a top view of a transistor 400d. FIG. 24B is a cross-sectional view taken along line A1-A2 in FIG. 24A, and FIG. 24C is a cross-sectional view taken along line A3-A4 in FIG. 24A. The transistor 400d has an s-channel structure like the transistor 400a and the like. In the transistor 400d, an insulating film 409 is provided in contact with a side surface of the conductive film 412 that forms a gate electrode. The insulating film 409 and the conductive film 412 are covered with the insulating film 408. The insulating film 409 functions as a sidewall insulating film of the transistor 400*d*. The gate electrode of the transistor 400*d* may be a stack of the conductive films 411 to 413 like that of the transistor 400*a*.

The insulating film 406 and the conductive film 412 overlap with the conductive film 414 and the metal oxide 432 at least partly. It is preferable that the side edge of the conductive film 412 in the channel length direction be approximately aligned with the side edge of the insulating film 406 in the channel length direction. Here, the insulating film 406 functions as a gate insulating film of the transistor 400*d*, the conductive film 412 functions as a gate electrode of the transistor 400*d*, and the insulating film 409 functions as a sidewall insulating film of the transistor 400*d*.

The metal oxide 432 has a region that overlaps with the conductive film 412 with the metal oxide 433 and the insulating film 406 positioned therebetween. Preferably, the outer edge of the metal oxide 431 is approximately aligned with the outer edge of the metal oxide 432, and the outer edge of the metal oxide 433 is outside of the outer edges of the metal oxides 431 and 432. However, the shape of the transistor in this embodiment is not limited to that where the outer edge of the metal oxide 433 is outside of the outer edge of the metal oxide 431. For example, the outer edge of the metal oxide 431 may be outside of the outer edge of the metal oxide 433, or the side edge of the metal oxide 431 may be approximately aligned with the side edge of the metal oxide 433.

Figure 24D:
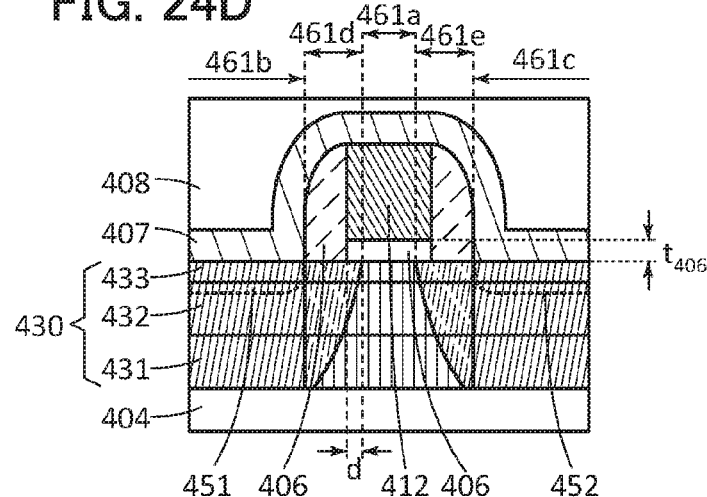

FIG. 24D is an enlarged view of part of FIG. 24B. As illustrated in FIG. 24D, regions 461*a* to 461*e* are formed in the metal oxide 430. The regions 461*b* to 461*e* have a higher concentration of dopant and therefore have a lower resistance than the region 461*a*. Furthermore, the regions 461*b* and 461*c* have a higher concentration of hydrogen and therefore have a much lower resistance than the regions 461*d* and 461*e*. The concentration of a dopant in the region 461*a* is, for example, less than or equal to 5%, less than or equal to 2%, or less than or equal to 1% of the maximum concentration of a dopant in the region 461*b* or 461*c*. Note that the dopant may be rephrased as a donor, an acceptor, an impurity, or an element.

As illustrated in FIG. 24D, in the metal oxide 430, the region 461*a* substantially overlaps with the conductive film 412, and the regions 461*b* to 461*e* are the regions other than the region 461*a*. In the regions 461*b* and 461*c*, the top surface of the metal oxide 433 is in contact with the insulating film 407. In the regions 461*d* and 461*e*, the top surface of the metal oxide 433 is in contact with the insulating film 409 or 406. That is, as illustrated in FIG. 24D, the border between the regions 461*b* and 461*d* overlaps with the border between the side edges of the insulating films 407 and 409. The same applies to the border between the regions 461*c* and 461*e*. Here, part of the regions 461*d* and 461*e* preferably overlaps with part of a region (a channel formation region) where the metal oxide 432 and the conductive film 412 overlap with each other. For example, preferably, the side edges of the regions 461*d* and 461*e* in the channel length direction are inside of the conductive film 412 and the distance between the side edge of the conductive film 412 and each of the side edges of the regions 461*d* and 461*e* is d. In that case, the thickness $t_{406}$ of the insulating film 406 and the distance d preferably satisfy $0.25 t_{406} < d < t_{406}$.

In the above manner, the regions 461*d* and 461*e* are formed in part of the region where the metal oxide 430 and the conductive film 412 overlap with each other. Accordingly, the channel formation region of the transistor 400*d* is in contact with the low-resistance regions 461*d* and 461*e* and a high-resistance offset region is not formed between the region 461*a* and each of the regions 461*d* and 461*e*, so that the on-state current of the transistor 400*d* can be increased. Furthermore, since the side edges of the regions 461*d* and 461*e* in the channel length direction are formed so as to satisfy the above range, the regions 461*d* and 461*e* can be prevented from being formed too deeply in the channel formation region and always conducted.

The regions 461*b* to 461*e* are formed by ion doping treatment such as an ion implantation method. Therefore, as illustrated in FIG. 24D, the positions of the side edges of the regions 461*d* and 461*e* in the channel length direction are sometimes shifted to the side edge of the metal oxide 430 in the channel length direction in a deeper area from the top surface of the metal oxide 433. The distance d in that case is the distance between the side edge of the conductive film 412 in the channel length direction and each of the side edges of the regions 461*d* and 461*e* that are closest to the inner part of the conductive film 412.

In some cases, for example, the regions 461*d* and 461*e* in the metal oxide 431 do not overlap with the conductive film 412. In that case, at least part of the regions 461*d* and 461*e* in the metal oxide 431 or 432 is preferably formed in a region overlapping with the conductive film 412.

In addition, low-resistance regions 451 and 452 are preferably formed in the metal oxide 431, the metal oxide 432, and the metal oxide 433 in the vicinity of the interface with the insulating film 407. The low-resistance regions 451 and 452 contain at least one of the elements included in the insulating film 407. Preferably, part of the low-resistance regions 451 and 452 is substantially in contact with or overlaps partly with the region (the channel formation region) where the metal oxide 432 and the conductive film 412 overlap with each other.

Since a large part of the metal oxide 433 is in contact with the insulating film 407, the low-resistance regions 451 and 452 are likely to be formed in the metal oxide 433. The low-resistance regions 451 and 452 in the metal oxide 433 contain a higher concentration of elements included in the insulating film 407 than the other regions of the metal oxide 433 (e.g., the region of the metal oxide 433 that overlaps with the conductive film 412).

The low-resistance regions 451 and 452 are formed in the regions 461*b* and 461*c*, respectively. Ideally, the metal oxide 430 has a structure in which the concentration of added elements is the highest in the low-resistance regions 451 and 452, the second highest in the regions 461*b* and 461*c* to 461*e* other than the low-resistance regions 451 and 452, and the lowest in the region 461*a*. The added elements refer to a dopant for forming the regions 461*b* and 461*c* and an element added from the insulating film 407 to the low-resistance regions 451 and 452.

Although the low-resistance regions 451 and 452 are formed in the transistor 400*d*, the semiconductor device shown in this embodiment is not limited to this structure. For example, the low-resistance regions 451 and 452 are not necessarily formed in the case where the regions 461*b* and 461*c* have a sufficiently low resistance.

<<Structure Example 5 of Transistor>>

Figure 25A:
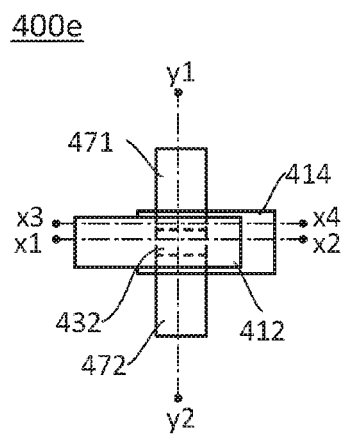
FIG. 25A is a top view showing a structural example of a transistor.
Figure 25B:
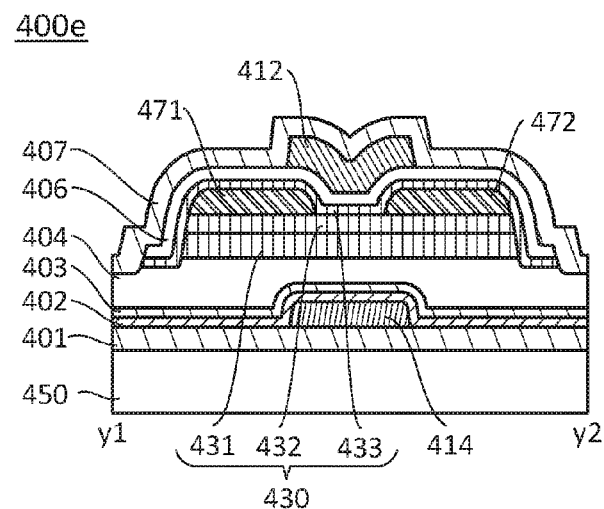
FIGS. 25B to 25D are cross-sectional views showing structural examples of the transistor.
Figure 25C:
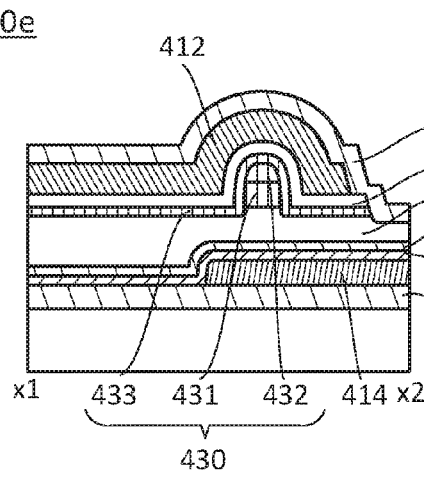
Figure 25D:
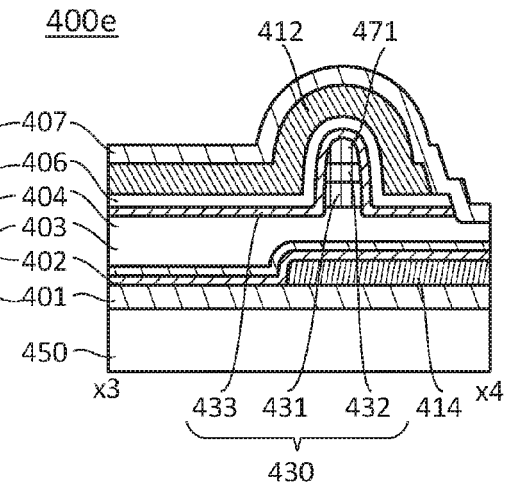

FIGS. 25A to 25D illustrate a structure example of a transistor. FIG. 25A is a top view illustrating a structure example of an OS transistor. FIG. 25B is a cross-sectional view taken along line y1-y2 in FIG. 25A, FIG. 25C is a cross-sectional view taken along line x1-x2 in FIG. 25A, and FIG. 25D is a cross-sectional view taken along line x3-x4 in FIG. 25A.

A transistor 400e has an s-channel structure like the transistor 400a. The transistor 400e is provided with conductive films 471 and 472. The conductive films 471 and 472 each function as a source or drain electrode. A gate electrode of the transistor 400e may be a stack of the conductive films 411 to 413 like that of the transistor 400a.

As illustrated in FIGS. 25B and 25C, the metal oxide 430 includes a portion where the metal oxides 431, 432, and 433 are stacked in that order. The conductive films 471 and 472 are provided over the stack formed of the metal oxides 431 and 432. The metal oxide 433 is formed to cover the metal oxides 431 and 432 and the conductive films 471 and 472. The insulating film 406 covers the metal oxide 433. Here, the metal oxide 433 and the insulating film 406 are etched using the same mask.

The conductive films 471 and 472 are formed using a hard mask used for forming the stack of the metal oxides 431 and 432. Therefore, the conductive films 471 and 472 do not have regions in contact with the side surfaces of the metal oxides 431 and 432. For example, through the following steps, the metal oxides 431 and 432 and the conductive films 471 and 472 can be formed. A two-layer oxide semiconductor film including the metal oxides 431 and 432 is formed. A single-layer or multi-layer conductive film is formed over the oxide semiconductor film. This conductive film is etched, so that a hard mask is formed. Using this hard mask, the two-layer oxide semiconductor film is etched to form the stack of the metal oxides 431 and 432. Then, the hard mask is etched to form the conductive films 471 and 472.

<<Structure Example 6 of Transistor>>

Figure 26A:
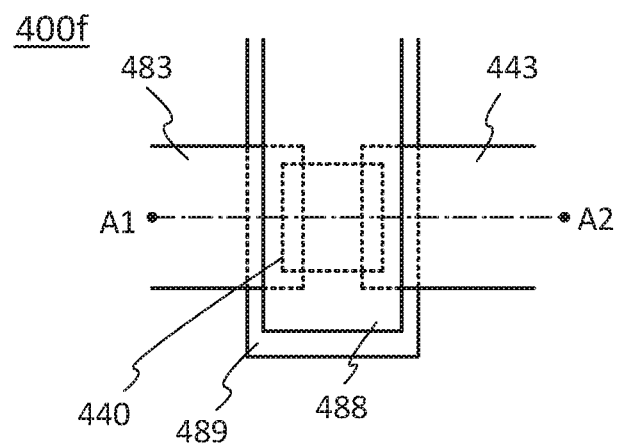
FIG. 26A is a top view showing a structural example of a transistor.
Figure 26B:
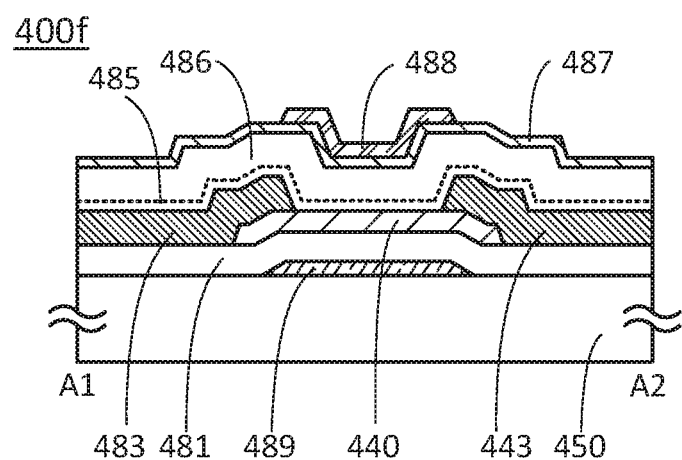
FIG. 26B is a cross-sectional view showing a structural example of the transistor.

FIG. 26A is a top view of a transistor 400f. FIG. 26B is a cross-sectional view taken along line A1-A2 in FIG. 26A.

The transistor 400f includes a conductive film 489 functioning as a first gate, a conductive film 488 functioning as a second gate, a semiconductor 482, conductive films 483 and 484 functioning as a source and a drain, an insulating film 481, an insulating film 485, an insulating film 486, and an insulating film 487.

The conductive film 489 is on an insulating surface. The conductive film 489 overlaps with the semiconductor 482 with the insulating film 481 positioned therebetween. The conductive film 488 overlaps with the semiconductor 482 with the insulating films 485, 486, and 487 positioned therebetween. The conductive films 483 and 484 are connected to the semiconductor 482.

The insulating films 485 to 487 are sequentially stacked over the semiconductor 482 and the conductive films 483 and 484 in FIG. 26B; however, an insulating film provided over the semiconductor 482 and the conductive films 483 and 484 may be a single layer or a stack including a plurality of insulating films.

In the case of using an oxide semiconductor as the semiconductor 482, the insulating film 486 preferably contains oxygen at a proportion higher than or equal to that in the stoichiometric composition and has a function of supplying part of oxygen to the semiconductor 482 by heating. Note that in the case where the provision of the insulating film 486 directly on the semiconductor 482 causes damage to the semiconductor 482 at the time of formation of the insulating film 486, the insulating film 485 is preferably provided between the semiconductor 482 and the insulating film 486, as illustrated in FIG. 26B. The insulating film 485 preferably allows oxygen to pass therethrough, and causes little damage to the semiconductor 482 when the insulating film 485 is formed compared with the case of the insulating film 486. If the insulating film 486 can be formed directly on the semiconductor 482 while damage to the semiconductor 482 is reduced, the insulating film 485 is not necessarily provided.

For the insulating films 485 and 486, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 487 preferably has an effect of blocking diffusion of oxygen, hydrogen, and water. Alternatively, the insulating film 487 preferably has an effect of blocking diffusion of hydrogen and water.

An insulating film has a more excellent blocking effect as the insulating film has a higher density and becomes denser or has a fewer dangling bonds and becomes more chemically stable. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 487 has an effect of blocking diffusion of water, hydrogen, and the like, impurities such as water and hydrogen that exist in a resin in a panel or exist outside the panel can be prevented from entering the semiconductor 482. In the case where an oxide semiconductor is used as the semiconductor 482, part of water or hydrogen that enters the oxide semiconductor serves as an electron donor (donor). Thus, the use of the insulating film 487 having the blocking effect can prevent a shift in the threshold voltage of the transistor 400f due to generation of donors.

In addition, in the case where an oxide semiconductor is used as the semiconductor 482, the insulating film 487 has an effect of blocking diffusion of oxygen, so that diffusion of oxygen from the oxide semiconductor to the outside can be prevented. Accordingly, oxygen vacancies in the oxide semiconductor that serve as donors are reduced, so that a shift in the threshold voltage of the transistor 400f due to generation of donors can be prevented.

Embodiment 4

In this embodiment, a semiconductor device having a device structure in which a Si transistor and an OS transistor are stacked will be described. Here, an example of the device structure of the memory device 100 including the memory cell 132 (FIG. 2C) is shown.

FIGS. 27A and 27B are cross-sectional views illustrating the device structure of the memory device 100, typically, the memory cell 132. FIG. 27A is a cross-sectional view of a transistor that forms the memory cell 132 in the channel length direction, and FIG. 27B is a cross-sectional view of the transistor in a channel width direction.

The memory device 100 includes layers 781 to 789 from the bottom. The layer 781 includes a substrate 700, the transistor TR1 formed using the substrate 700, an element isolation layer 701, and a plurality of plugs such as a plug 710 and a plug 711. The layer 782 includes a plurality of wirings such as a wiring 730 and a wiring 731. The layer 783 includes a plurality of plugs such as a plug 712 and a plug 713 and a plurality of wirings (not illustrated). The layer 784 includes insulating films 702 to 704, the transistor TW2, an insulating film 705, and a plurality of plugs such as a plug 714 and a plug 715.

The layer 785 includes a plurality of wirings such as wirings 732 and 733. The layer 786 includes a plurality of plugs such as a plug 716 and a plurality of wirings (not illustrated). The layer 787 includes a plurality of wirings such as a wiring 734. The layer 788 includes a capacitor C1 and a plurality of plugs such as a plug 717. The capacitor C1 includes a first electrode 751, a second electrode 752, and an insulating film 753. The layer 789 includes a plurality of wirings such as a wiring 735.

The OS transistor in Embodiment 3 is preferably used as the transistor TW2. Here, the transistor TW2 has the same device structure as the transistor 400c (FIGS. 23A to 23C). The transistor TR1 is a Si transistor.

As the substrate 700, a single crystal semiconductor substrate or a polycrystalline semiconductor substrate of silicon or silicon carbide, a compound semiconductor substrate of silicon germanium, an SOI substrate, or the like can be used. For example, a glass substrate, a quartz substrate, a plastic substrate, a metal substrate, a flexible substrate, an attachment film, paper including a fibrous material, or a base film may be used as the substrate 700. Alternatively, a semiconductor element may be formed using one substrate, and then transferred to another substrate. Here, as an example, a single crystal silicon wafer is used as the substrate 700.

The insulating films 704 and 705 preferably have a blocking effect against hydrogen, water, and the like. Water, hydrogen, and the like are factors that generate carriers in an oxide semiconductor; thus, providing such a blocking layer against hydrogen, water, and the like can improve the reliability of the transistor TR1. Examples of the insulator having a blocking effect against hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ).

The wirings 730 to 735 and the plugs 710 to 717 each preferably have a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. It is also preferable to use a low-resistance conductive material such as aluminum or copper. The use of a Cu—Mn alloy is further preferable, in which case manganese oxide formed at the interface with an insulator containing oxygen has a function of preventing Cu diffusion.

Figure 28:
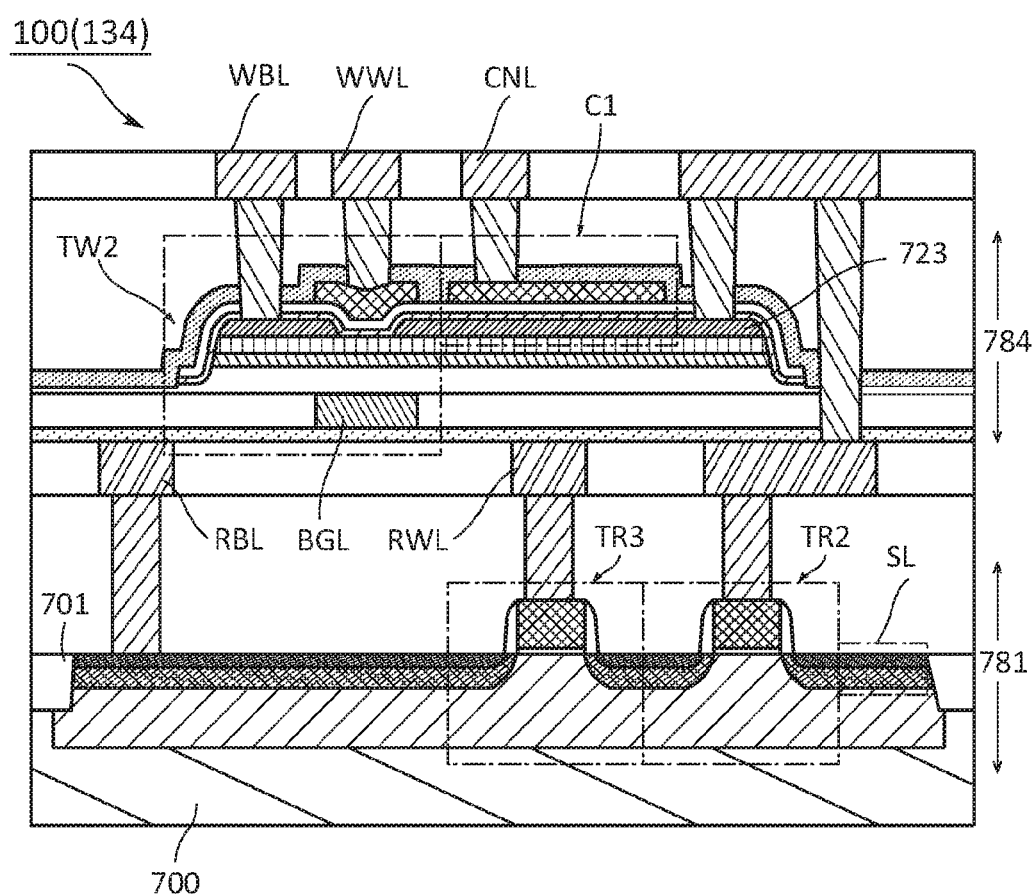
FIG. 28 is a cross-sectional view showing a structural example of a memory device.

The OS transistor and the storage capacitor may be formed in the same element layer. FIG. 28 illustrates an example of such a case. FIG. 28 is a cross-sectional view showing an example of the device structure of the memory device 100 including the memory cell 134 (FIG. 2E). In FIG. 28, regions that are not denoted by reference numerals or are not hatched are formed of an insulator. Further, regions that are hatched but not denoted by reference numerals are formed of conductors and form wirings and electrodes. By these conductors, the memory cell 134 is electrically connected to the wirings WWL, RWL, WBL, RBL, SL, CNL, and BGL.

The transistor TW2 has the same device structure as the transistor 400e (FIG. 25A to 25D). The capacitor C1 is formed together with the transistor TW2. This results in a reduction of the number of manufacturing steps of the memory device 100. One of a pair of electrodes of the capacitor C1 is formed of a conductive film 723 (a source or drain electrode of the transistor TW2). The other electrode is formed of a conductor in the same layer as a gate electrode of the transistor TW2.

In FIGS. 27A and 27B and FIG. 28, regions without reference numerals and hatch patterns represent regions formed of an insulator. As the insulator, an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in the regions, an organic resin such as a polyimide resin, a polyamide resin, an acrylic resin, a siloxane resin, an epoxy resin, or a phenol resin can be used. Note that in this specification, an oxynitride refers to a compound that contains more oxygen than nitrogen, and a nitride oxide refers to a compound that contains more nitrogen than oxygen.

Embodiment 5

In this embodiment, an oxide semiconductor will be described. An oxide semiconductor described here is a metal oxide that can be applied to the metal oxides of the OS transistors in Embodiment 3.

In this specification and the like, trigonal and rhombohedral crystal systems are included in a hexagonal crystal system. In this specification and the like, the term "parallel" indicates that an angle formed between two straight lines is greater than or equal to −10° and less than or equal to 10°, and accordingly includes the case where the angle is greater than or equal to −5° and less than or equal to 5°. The term "substantially parallel" indicates that an angle formed between two straight lines is greater than or equal to −30° and less than or equal to 30°. In addition, the term "perpendicular" indicates that an angle formed between two straight lines is greater than or equal to 80° and less than or equal to 100°, and accordingly includes the case where the angle is greater than or equal to 85° and less than or equal to 95°. The term "substantially perpendicular" indicates that an angle formed between two straight lines is greater than or equal to 60° and less than or equal to 120°.

<<Oxide Semiconductor Structure>>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and thus has an unstable structure. For this reason, an a-like OS has physical properties similar to those of an amorphous oxide semiconductor.

<CAAC-OS>

A CAAC-OS is an oxide semiconductor having a plurality of c-axis aligned crystal parts (also referred to as pellets).

When a combined analysis image (also referred to as a high-resolution TEM image) of a bright-field image and a diffraction pattern of a CAAC-OS is observed by a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

The CAAC-OS observed with a TEM is described below. A high-resolution TEM image of a cross section of the CAAC-OS observed from a direction substantially parallel to a sample surface shows that metal atoms are arranged in a layered manner in a pellet. Each metal atom layer has a configuration reflecting unevenness of a surface over which a CAAC-OS film is formed (hereinafter the surface is referred to as a formation surface) or a top surface of the CAAC-OS, and is arranged parallel to the formation surface or the top surface of the CAAC-OS.

According to the high-resolution TEM image, the CAAC-OS has a characteristic atomic arrangement. The size of a pellet is greater than or equal to 1 nm or greater than or equal to 3 nm, and the size of a space caused by tilt of the pellets is approximately 0.8 nm. Therefore, the pellet can also be referred to as a nanocrystal (nc). The CAAC-OS can be referred to as an oxide semiconductor including c-axis aligned nanocrystals (CANC).

A Cs-corrected high-resolution TEM image of a plane of the CAAC-OS observed from a direction substantially perpendicular to the sample surface shows that metal atoms are arranged in a triangular, quadrangular, or hexagonal configuration in a pellet. However, there is no regularity of arrangement of metal atoms between different pellets.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31°. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

In structural analysis of the CAAC-OS by an out-of-plane method, another peak might appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), a peak is not clearly observed. In contrast, in the case of a single crystal oxide semiconductor of $InGaZnO_4$, when φ scan is performed with 2θ fixed at around 56°, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an $InGaZnO_4$ crystal in the direction parallel to the sample surface, a diffraction pattern (also referred to as a selected-area transmission electron diffraction pattern) can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, a ring-like diffraction pattern is observed when an electron beam with a probe diameter of 300 nm is incident on the same sample in a direction perpendicular to the sample surface. Therefore, the electron diffraction also indicates that the a-axes and b-axes of the pellets included in the CAAC-OS do not have regular alignment.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (e.g., silicon) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor might serve as carrier traps or serve as carrier generation sources when hydrogen is captured therein.

The CAAC-OS having small amounts of impurities and oxygen vacancies is an oxide semiconductor with a low carrier density (specifically, lower than $8\times10^{11}/cm^3$, preferably lower than $1\times10^{11}/cm^3$, and further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. That is, the CAAC-OS can be referred to as an oxide semiconductor having stable characteristics.

<nc-OS>

An nc-OS has a region where a crystal part is observed and a region where a crystal part is not observed clearly in a high-resolution TEM image. In most cases, a crystal part in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary cannot be found clearly in some cases. There is a possibility that the origin of the nanocrystal is the same as that of a pellet in a CAAC-OS. Therefore, a crystal part of the nc-OS is sometimes referred to as a pellet in the following description.

In the nc-OS, a microscopic region (e.g., a region with a size greater than or equal to 1 nm and less than or equal to 10 nm, in particular, a region with a size greater than or equal to 1 nm and less than or equal to 3 nm) has periodic atomic arrangement. There is no regularity of crystal orientation between different pellets in the nc-OS. Thus, the orientation of the whole film is not observed. Accordingly, in some cases, the nc-OS cannot be distinguished from an a-like OS or an amorphous oxide semiconductor depending on an analysis method. For example, when the nc-OS is analyzed by an out-of-plane method using an X-ray having a diameter larger than that of a pellet, a peak that shows a crystal plane does not appear. Furthermore, a halo pattern is shown in an electron diffraction pattern of the nc-OS obtained by using an electron beam having a probe diameter larger than the diameter of a pellet (e.g., larger than or equal to 50 nm). Meanwhile, spots are shown in a nanobeam electron diffraction pattern of the nc-OS obtained by using an electron beam having a probe diameter close to or smaller than the diameter of a pellet. Furthermore, in a nanobeam electron diffraction pattern of the nc-OS, regions with high luminance in a circular (ring) pattern are observed in some cases. Moreover, a plurality of spots are shown in a ring-like region in some cases.

Since there is no regularity of crystal orientation between the pellets (nanocrystals) as described above, the nc-OS can also be referred to as an oxide semiconductor including random aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS is likely to have lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure between the nc-OS and the amorphous oxide semiconductor. In a high-resolution TEM image of the a-like OS, a void is observed in some cases. Furthermore, in the high-resolution TEM image, there are a region where a crystal part is clearly observed and a region where a crystal part is not observed. The a-like OS has an unstable structure because it contains a void. In some cases, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of a single crystal oxide semiconductor having the same composition. The density of each of the nc-OS and the CAAC-OS is higher than or equal to 92.3% and lower than 100% of the density of a single crystal oxide semiconductor having the same composition. It is difficult to deposit an oxide semiconductor having a density of lower than 78% of the density of a single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Single crystals with the same composition do not exist in some cases. In that case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. It is preferable to combine as few kinds of single crystals as possible for density calculation.

As described above, oxide semiconductors have various structures and various properties. The oxide semiconductor may be a stacked film including two or more of an amorphous oxide semiconductor, an a-like OS, an nc-OS, and a CAAC-OS, for example.

Information about this specification and the like will be described below.

In the drawings, the size, the layer thickness, or the region may be exaggerated for clarity. Therefore, the scale is not necessarily limited to that illustrated in the drawings. Note that in the drawings, ideal examples are schematically illustrated, and shapes or values are not limited to those illustrated in the drawings. For example, the following can be included: variation in signal, voltage, or current due to noise or difference in timing.

In this specification, terms for describing arrangement, such as "over" and "under," may be used for convenience to describe the positional relation between components with reference to drawings. The positional relation between components is changed as appropriate in accordance with the direction in which each component is described. Thus, there is no limitation on terms used in this specification, and description can be made appropriately depending on the situation.

The positional relation of circuit blocks in block diagrams are specified for description, and even in the case where different circuit blocks have different functions in the diagrams, the different circuit blocks may be provided in an actual circuit block so that different functions are achieved in the same circuit block. In addition, the functions of circuit blocks are specified for description, and even in the case where one circuit block is illustrated, blocks may be provided in an actual circuit block so that processing performed by one circuit block is performed by a plurality of circuit blocks.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

This application is based on Japanese Patent Application serial no. 2015-074828 filed with Japan Patent Office on Apr. 1, 2015, the entire contents of which are hereby incorporated by reference.

What is claimed is:

1. A semiconductor device comprising:
a memory cell comprising:
a first transistor comprising a channel formation region comprising an oxide semiconductor;
a second transistor; and
a capacitor; and
a driver portion comprising a sense amplifier comprising a latch circuit,
wherein one of a source and a drain of the first transistor is directly connected to a gate of the second transistor,
wherein an electrode of the capacitor is directly connected to the gate of the second transistor,
wherein a first terminal of the sense amplifier is electrically connected to one of a source and a drain of the second transistor,
wherein a second terminal of the sense amplifier is electrically connected to the other of the source and the drain of the first transistor, and
wherein in a write mode, the driver portion is configured to read a first data from the memory cell and retain the first data in the latch circuit, and then write a second data into the latch circuit when a column of the memory cell is a write target column.

2. The semiconductor device according to claim 1, wherein the second transistor comprises a channel formation region comprising silicon.

3. The semiconductor device according to claim 1, wherein the memory cell further comprises a third transistor,
wherein the first terminal of the sense amplifier is electrically connected to the one of the source and the drain of the second transistor via the third transistor,
wherein one of a source and a drain of the third transistor is directly connected to the one of the source and the drain of the second transistor, and
wherein the other of the source and the drain of the third transistor is electrically connected to the first terminal of the sense amplifier.

4. The semiconductor device according to claim 1, wherein the first terminal of the sense amplifier is electrically connected to the one of the source and the drain of the second transistor via a read bit line, and
wherein the second terminal of the sense amplifier is electrically connected to the other of the source and the drain of the first transistor via a write bit line.

5. The semiconductor device according to claim 1, wherein the first terminal of the sense amplifier is electrically connected to the one of the source and the drain of the second transistor via a bit line, and
wherein the second terminal of the sense amplifier is electrically connected to the other of the source and the drain of the first transistor via the bit line.

6. The semiconductor device according to claim 1, wherein the first transistor further comprises a gate and a back gate,
wherein the gate of the first transistor is electrically connected to a write word line,
wherein the back gate of the first transistor is electrically connected to a wiring, and
wherein the wiring is configured to control a threshold voltage of the first transistor.

7. A semiconductor device comprising:
a memory cell comprising:
a first transistor comprising a channel formation region comprising an oxide semiconductor;
a second transistor; and
a capacitor; and
a driver portion comprising a sense amplifier comprising a latch circuit,
wherein the first transistor is over an insulating film,
wherein the second transistor is under the insulating film,
wherein one of a source and a drain of the first transistor is directly connected to a gate of the second transistor,
wherein an electrode of the capacitor is directly connected to the gate of the second transistor,
wherein a first terminal of the sense amplifier is electrically connected to one of a source and a drain of the second transistor,
wherein a second terminal of the sense amplifier is electrically connected to the other of the source and the drain of the first transistor, and
wherein in a write mode, the driver portion is configured to read a first data from the memory cell and retain the first data in the latch circuit, and then write a second data into the latch circuit when a column of the memory cell is a write target column.

8. The semiconductor device according to claim 7, wherein the second transistor comprises a channel formation region comprising silicon.

9. The semiconductor device according to claim 7, wherein the memory cell further comprises a third transistor,
wherein the first terminal of the sense amplifier is electrically connected to the one of the source and the drain of the second transistor via the third transistor,
wherein one of a source and a drain of the third transistor is directly connected to the one of the source and the drain of the second transistor, and
wherein the other of the source and the drain of the third transistor is electrically connected to the first terminal of the sense amplifier.

10. The semiconductor device according to claim 7, wherein the first terminal of the sense amplifier is electrically connected to the one of the source and the drain of the second transistor via a read bit line, and
wherein the second terminal of the sense amplifier is electrically connected to the other of the source and the drain of the first transistor via a write bit line.

11. The semiconductor device according to claim 7, wherein the first terminal of the sense amplifier is electrically connected to the one of the source and the drain of the second transistor via a bit line, and
wherein the second terminal of the sense amplifier is electrically connected to the other of the source and the drain of the first transistor via the bit line.

12. The semiconductor device according to claim 7, wherein the first transistor further comprises a gate and a back gate,
wherein the gate of the first transistor is electrically connected to a write word line,
wherein the back gate of the first transistor is electrically connected to a wiring, and
wherein the wiring is configured to control a threshold voltage of the first transistor.

13. A semiconductor device comprising:
a first memory cell comprising:
- a first transistor comprising a channel formation region comprising an oxide semiconductor;
- a second transistor; and
- a capacitor;

a second memory cell;
a sense amplifier between the first memory cell and the second memory cell;
a first AND circuit; and
a second AND circuit,
wherein one of a source and a drain of the first transistor is directly connected to a gate of the second transistor,
wherein an electrode of the capacitor is directly connected to the gate of the second transistor,
wherein a first terminal of the sense amplifier is electrically connected to one of a source and a drain of the second transistor,
wherein a second terminal of the sense amplifier is electrically connected to the other of the source and the drain of the first transistor via the first AND circuit, and
wherein the second terminal of the sense amplifier is electrically connected to the second memory cell via the second AND circuit.

14. The semiconductor device according to claim 13, wherein the second transistor comprises a channel formation region comprising silicon.

15. The semiconductor device according to claim 13, wherein the first memory cell further comprises a third transistor,
wherein the first terminal of the sense amplifier is electrically connected to the one of the source and the drain of the second transistor via the third transistor,
wherein one of a source and a drain of the third transistor is directly connected to the one of the source and the drain of the second transistor, and
wherein the other of the source and the drain of the third transistor is electrically connected to the first terminal of the sense amplifier.

16. The semiconductor device according to claim 13, wherein the first terminal of the sense amplifier is electrically connected to the one of the source and the drain of the second transistor via a read bit line, and
wherein the second terminal of the sense amplifier is electrically connected to the other of the source and the drain of the first transistor via a write bit line and the first AND circuit.

17. The semiconductor device according to claim 13, wherein the first transistor further comprises a gate and a back gate,
wherein the gate of the first transistor is electrically connected to a write word line,
wherein the back gate of the first transistor is electrically connected to a wiring, and
wherein the wiring is configured to control a threshold voltage of the first transistor.

* * * * *